US011953670B2

(12) United States Patent
Harfouche et al.

(10) Patent No.: US 11,953,670 B2
(45) Date of Patent: Apr. 9, 2024

(54) SYSTEM AND METHOD FOR RAPID FOCUSING AND ANALYSIS USING A MICRO-CAMERA ARRAY MICROSCOPE

(71) Applicant: Ramona Optics Inc., Durham, NC (US)

(72) Inventors: Mark Harfouche, Durham, NC (US); Gregor Horstmeyer, Durham, NC (US); Robert Horstmeyer, Durham, NC (US)

(*) Notice: Subject to any disclaimer, the term of this patent is extended or adjusted under 35 U.S.C. 154(b) by 88 days.

(21) Appl. No.: 17/546,377

(22) Filed: Dec. 9, 2021

(65) Prior Publication Data

US 2022/0179187 A1 Jun. 9, 2022

Related U.S. Application Data

(60) Provisional application No. 63/123,049, filed on Dec. 9, 2020.

(51) Int. Cl.
*G02B 21/36* (2006.01)
*G02B 21/06* (2006.01)
*H04N 23/67* (2023.01)

(52) U.S. Cl.
CPC .......... *G02B 21/367* (2013.01); *G02B 21/06* (2013.01); *G02B 21/368* (2013.01); *H04N 23/67* (2023.01)

(58) Field of Classification Search
CPC .... G02B 21/367; G02B 21/06; G02B 21/368; H04N 23/67
USPC .................. 348/79, 222.1; 250/201.3, 458.1; 356/417
See application file for complete search history.

(56) References Cited

U.S. PATENT DOCUMENTS

| | | | | |
|---|---|---|---|---|
| 5,480,804 A | * | 1/1996 | Niwa | G01N 21/6458 356/417 |
| 10,859,805 B2 | * | 12/2020 | Themelis | G02B 21/36 |
| 2011/0284720 A1 | * | 11/2011 | Wu | G02B 21/16 250/201.3 |
| 2015/0163394 A1 | * | 6/2015 | Tsai | H04N 23/959 348/222.1 |
| 2018/0307031 A1 | * | 10/2018 | Deissler | G02B 21/06 |
| 2020/0300764 A1 | * | 9/2020 | Gerlach | G01N 33/564 |

\* cited by examiner

*Primary Examiner* — Jayanti K Patel
*Assistant Examiner* — Richard B Carter

(57) ABSTRACT

An imaging system is configured with an autofocus operation that refocuses multiple cameras of the imaging system on detected features of interest, instead of on the whole image of the sample. Focus measures are calculated on the detected features, and then aggregated to focus distances of actuator moving the camera array, the sample stage, or individual cameras based on a maximization of detected features to be in focus. After the refocus, the imaging system recaptures new images and analyzes features on the new images to generate statistical characterization of the sample based on the classification of the features.

14 Claims, 36 Drawing Sheets

Sample 702

Captured image 715

Non overlap image 716

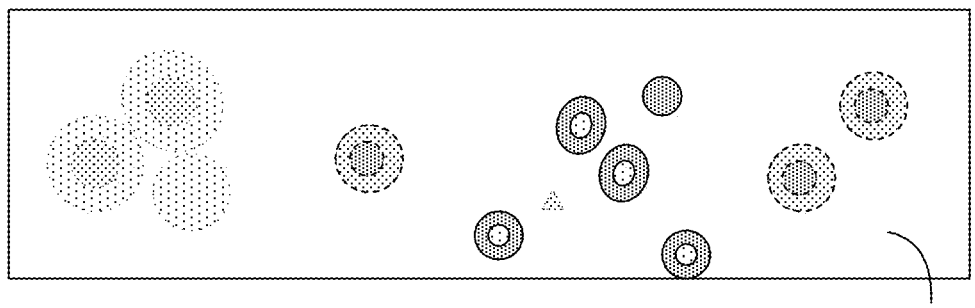
FIG. 8A  Sample 802
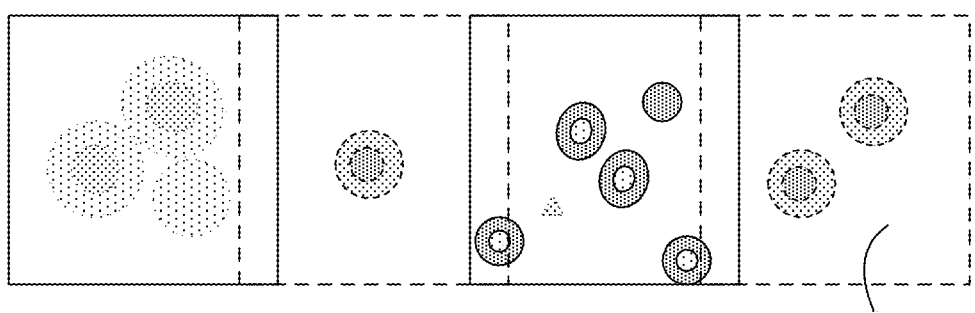
FIG. 8B  Captured image 815*
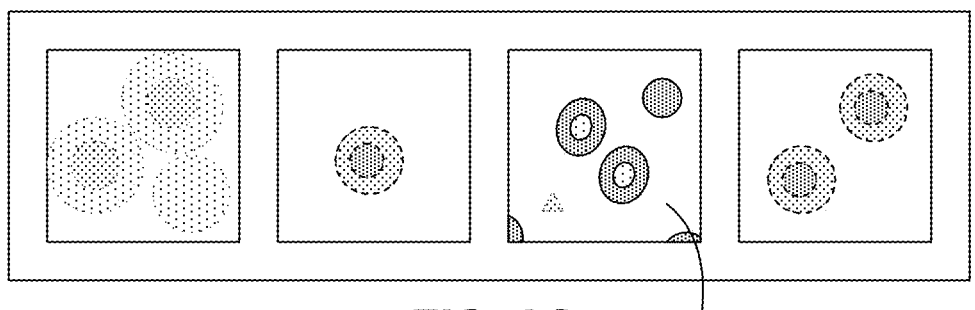
FIG. 8C  Non overlap image 816
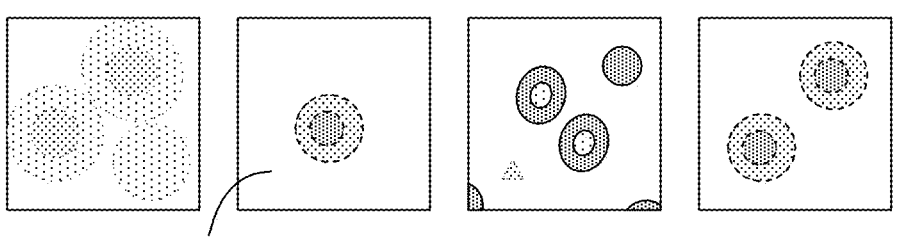
Non overlap image 816  FIG. 8D

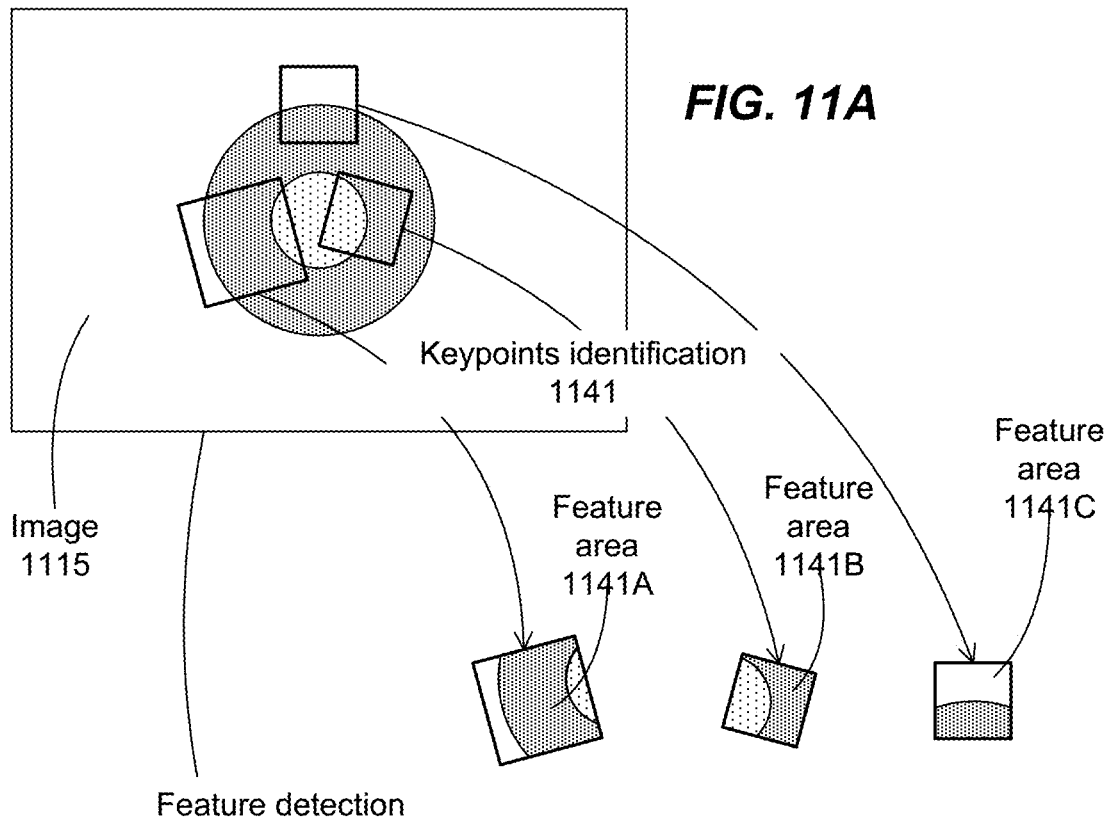
FIG. 11A
FIG. 11B
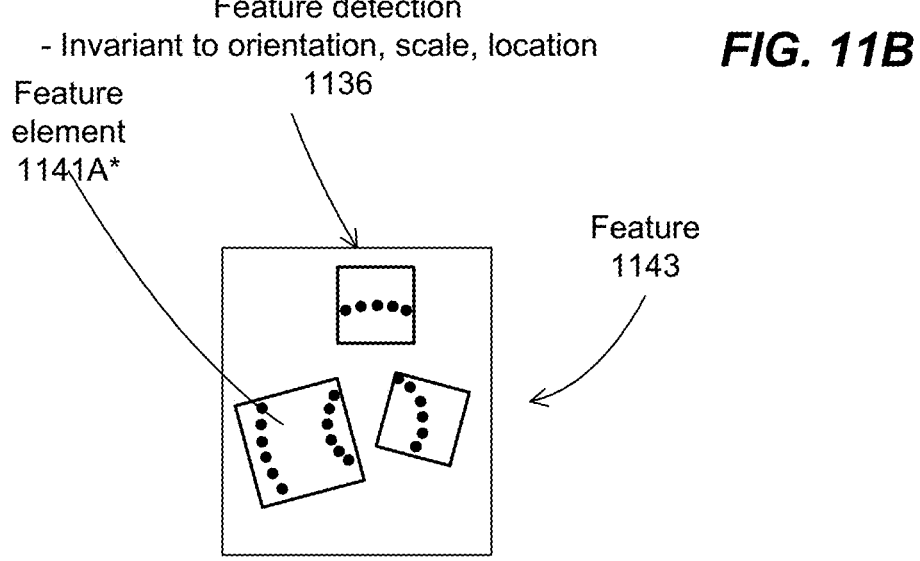
FIG. 11C

Feature data 1340   Non overlap image 1316

(a) Feature focus data 1340*   (b)

Feature sub image 1344   Feature sub image 1344   Feature 1341

Feature 1341

Feature sub image 1344

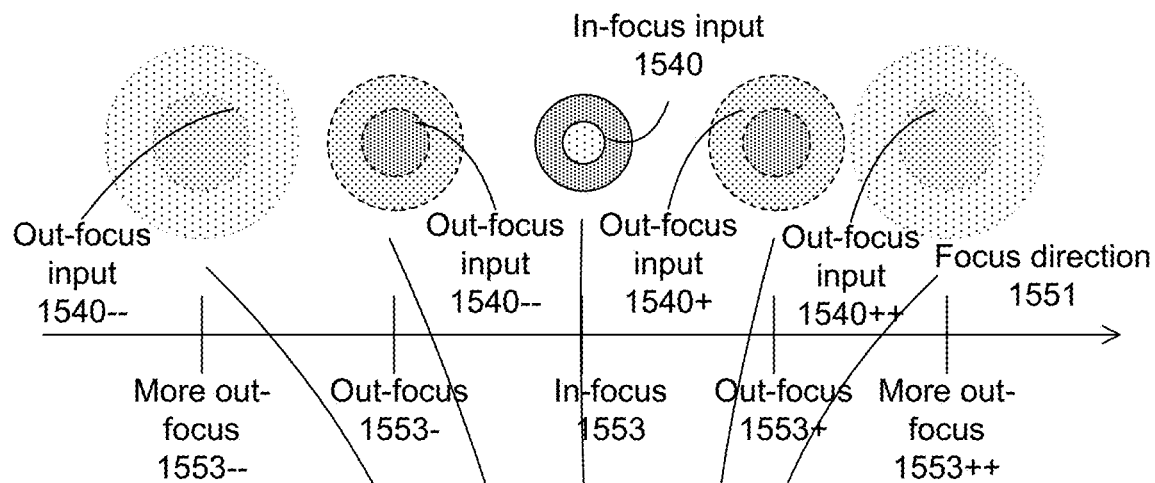
FIG. 15A
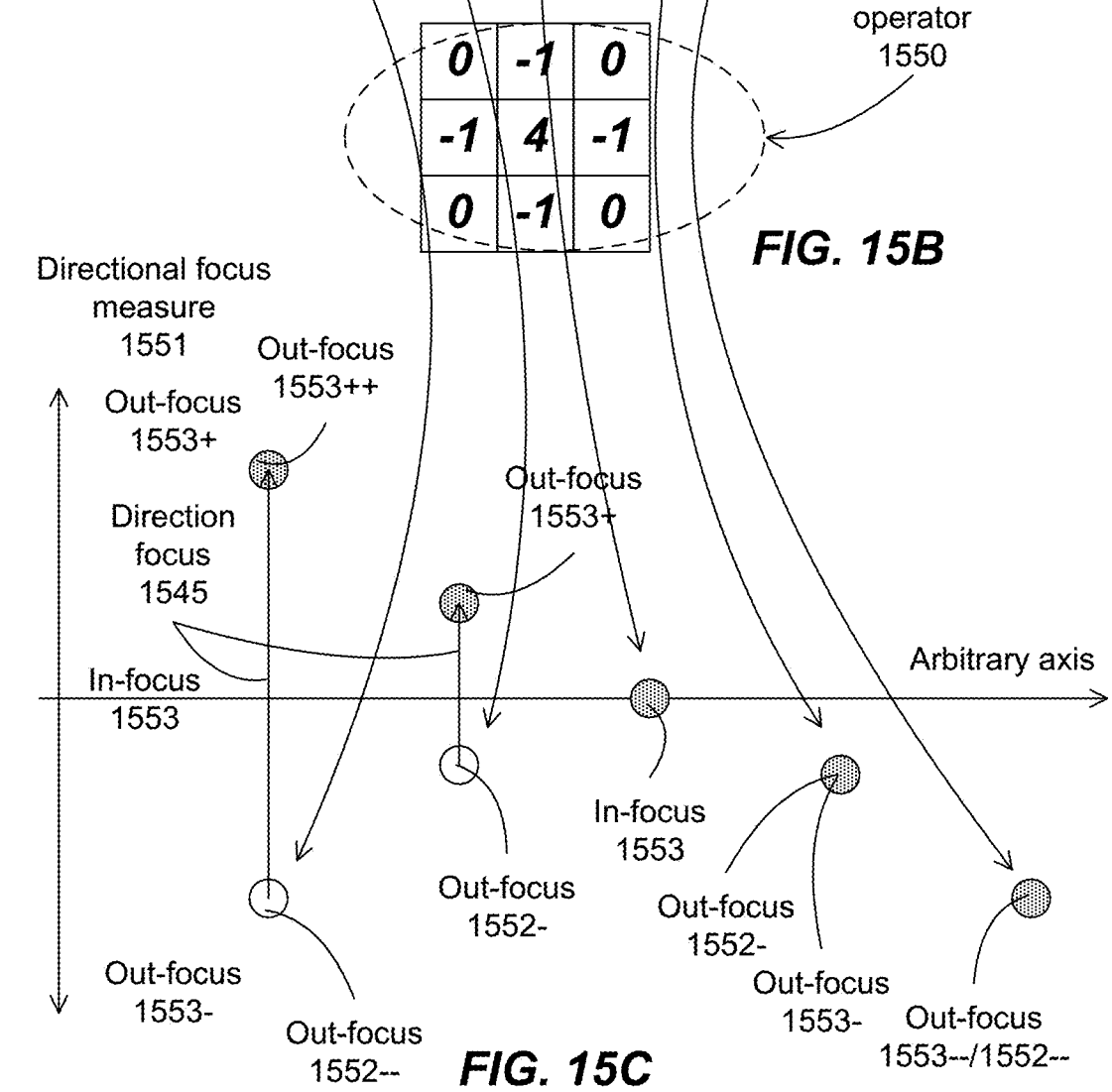
FIG. 15B
FIG. 15C

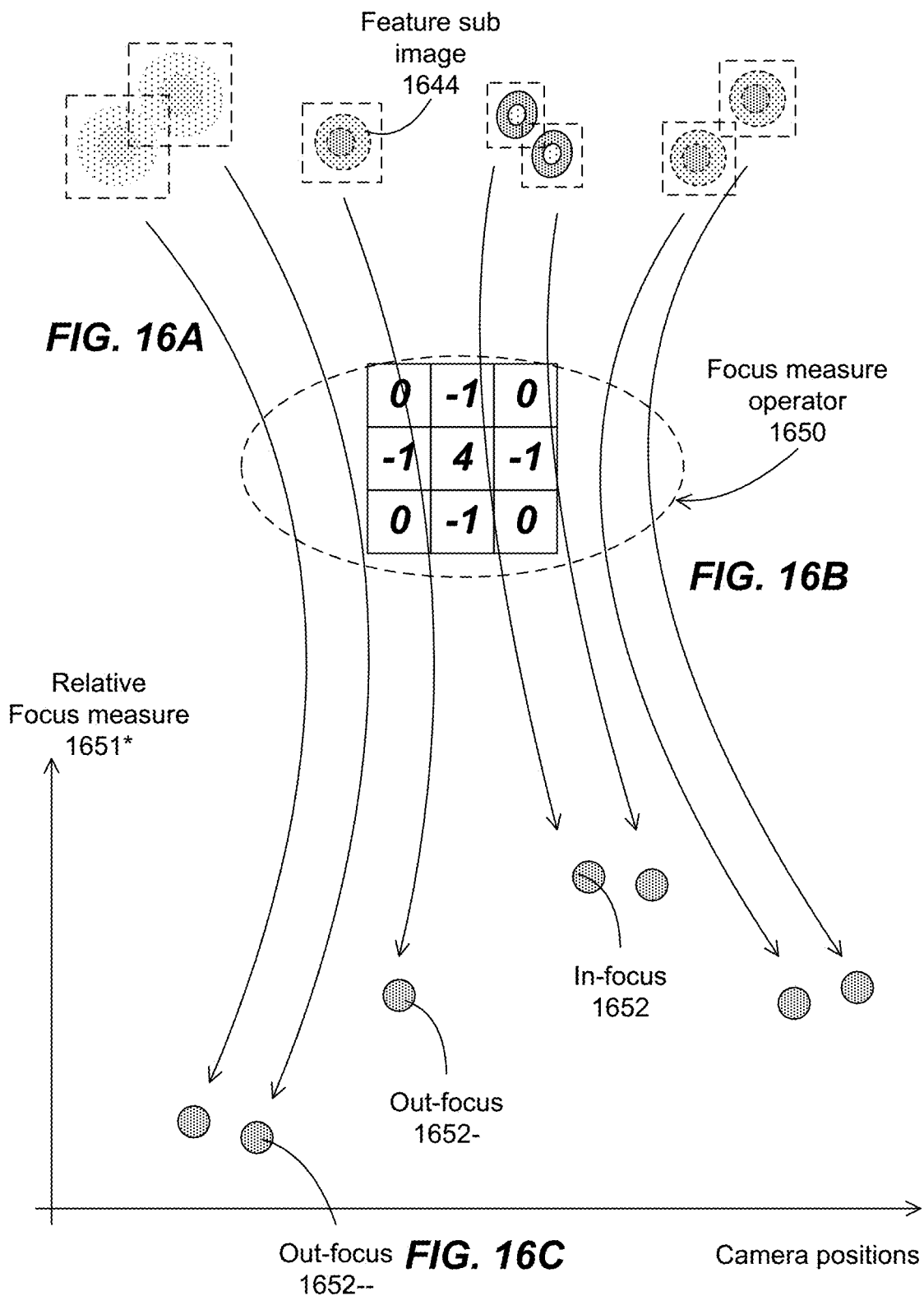

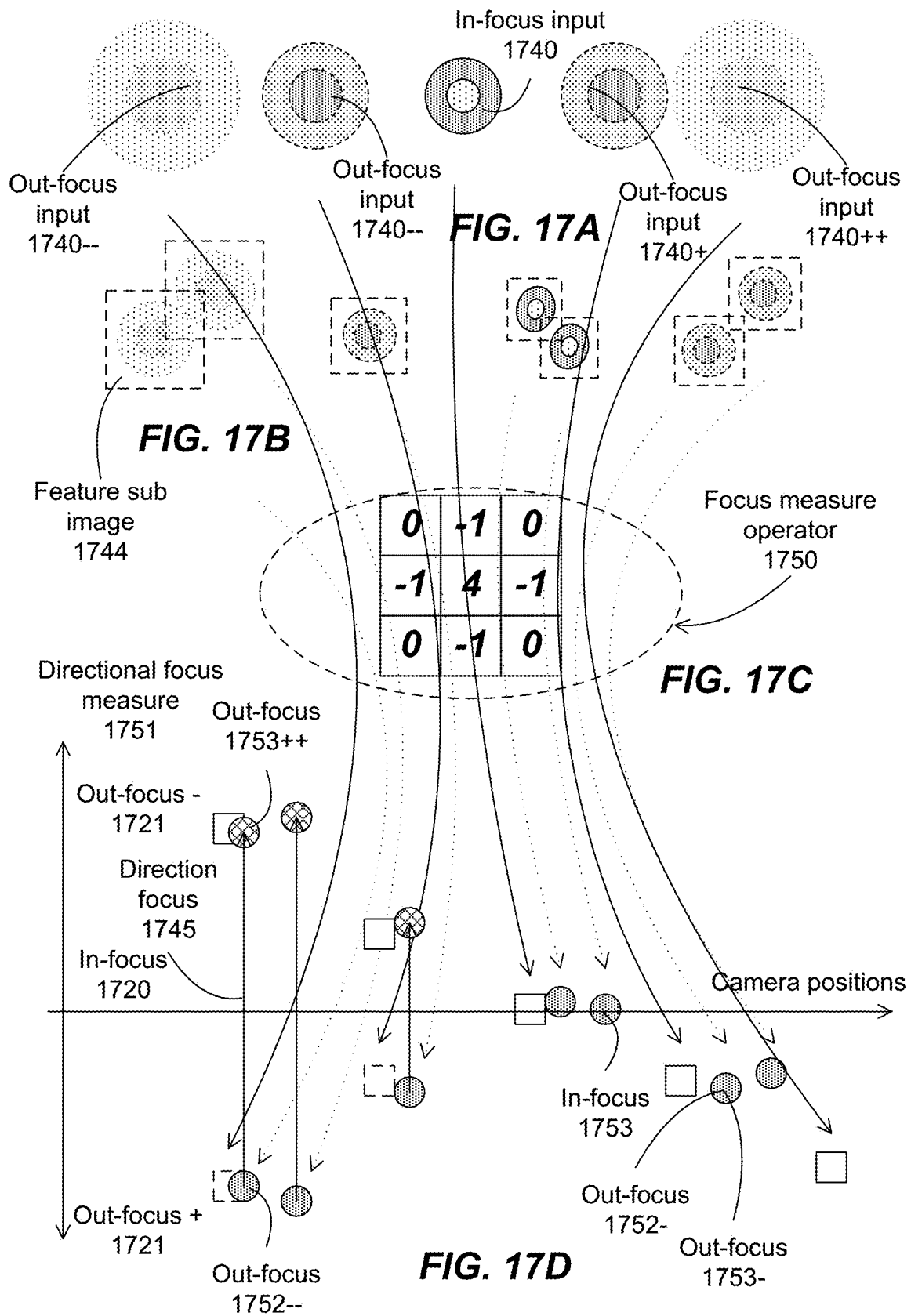

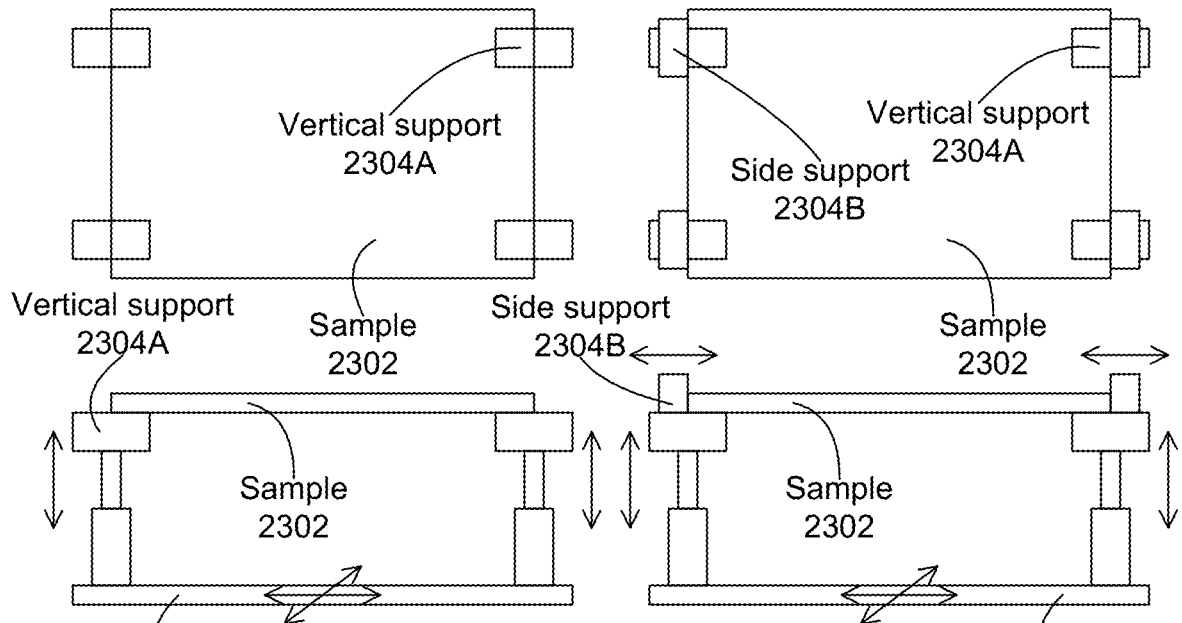
FIG. 23A
FIG. 23B
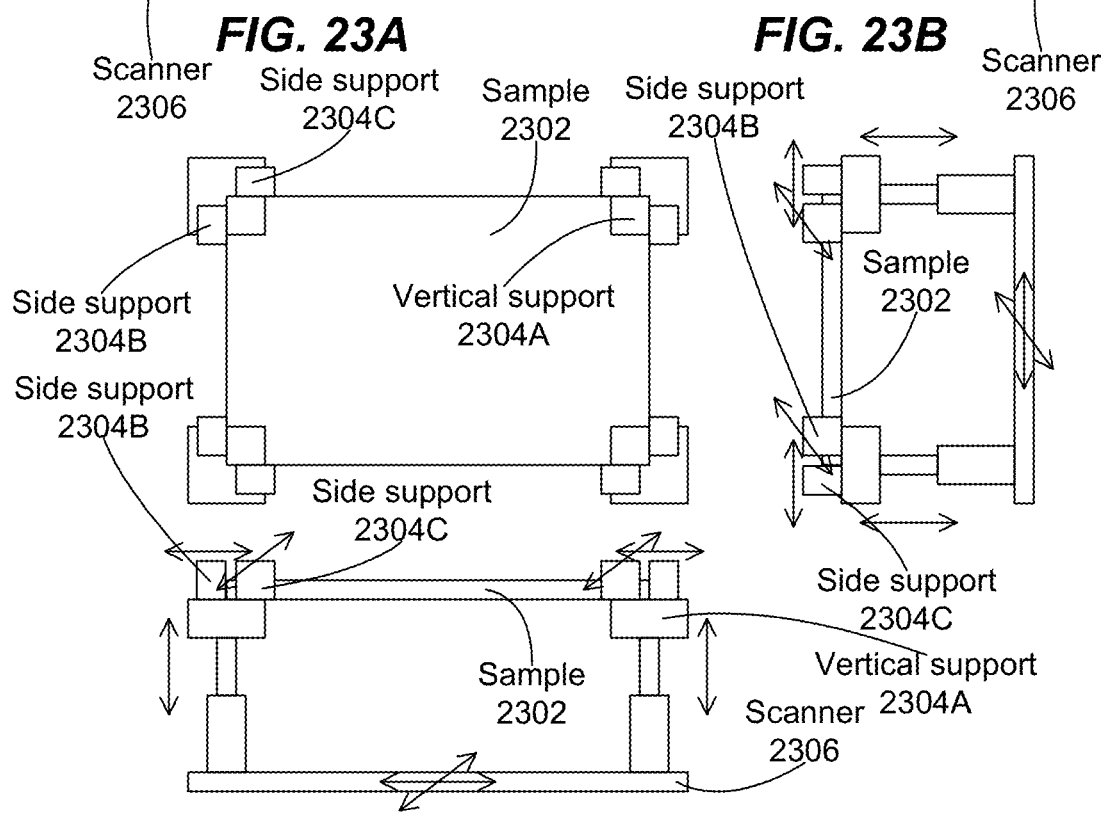
FIG. 23C

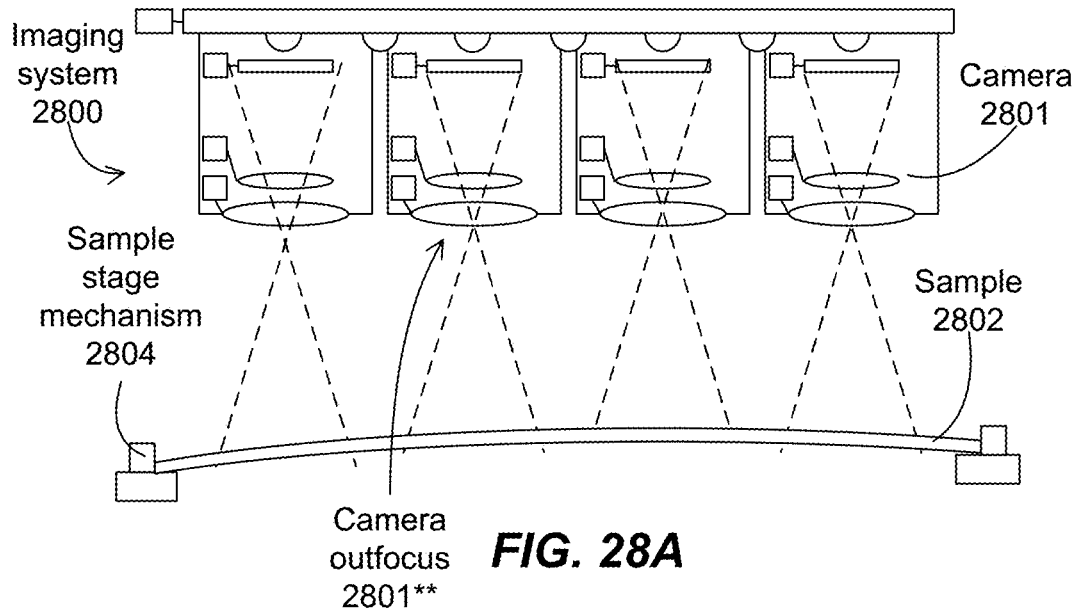
FIG. 28A
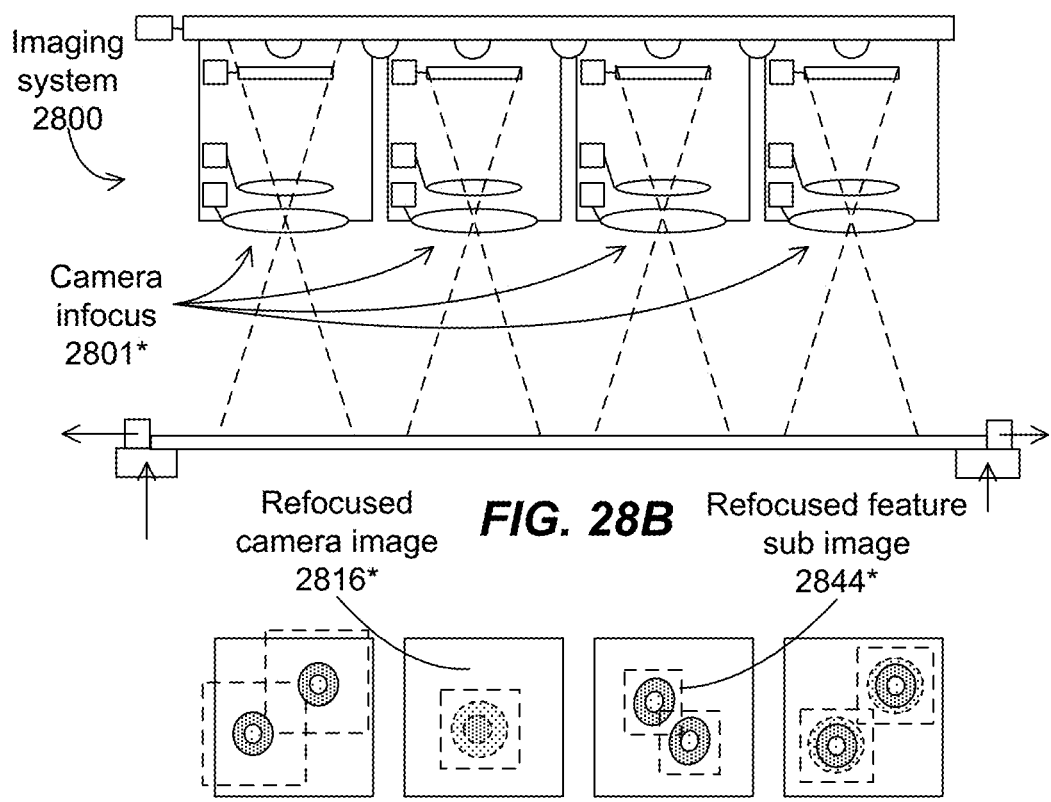
FIG. 28B
FIG. 28C

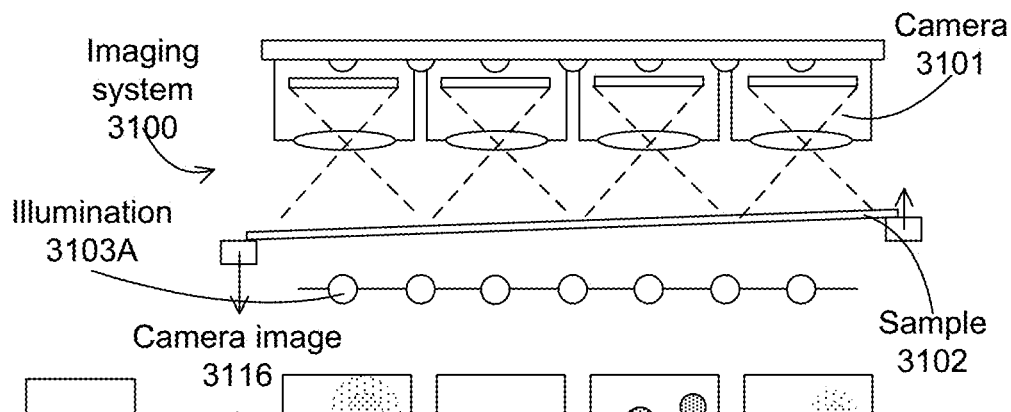
*FIG. 31A*
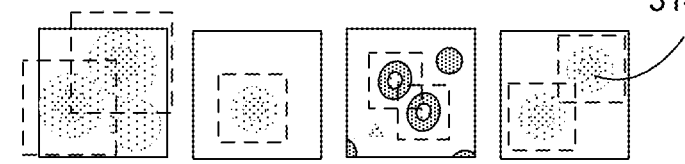
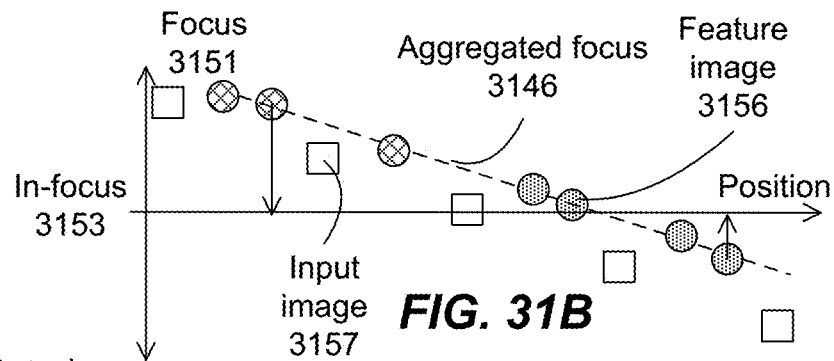
*FIG. 31B*
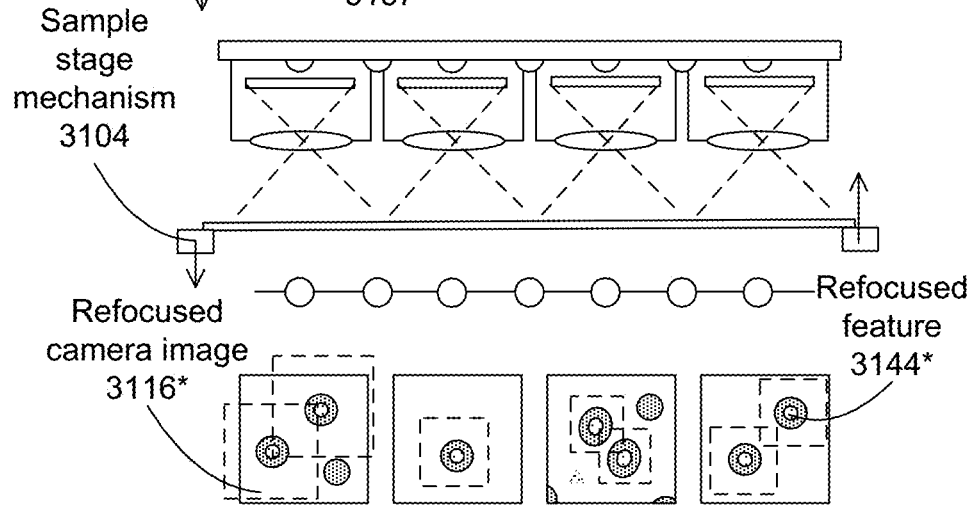
*FIG. 31C*

SYSTEM AND METHOD FOR RAPID FOCUSING AND ANALYSIS USING A MICRO-CAMERA ARRAY MICROSCOPE

The present patent application claims priority from U.S. Provisional Patent Application Ser. No. 63/123,049, filing date Dec. 9, 2020, hereby incorporated by reference in its entirety.

This invention was made with Government support under R44CA250877 awarded by the NIH. The Government has certain rights in the invention.

BACKGROUND OF THE INVENTION

Imaging thin specimens at high resolution over a large area is a notoriously challenging problem. First, it is challenging to design lenses that can see over more than a few square millimeters at less than 1 μm two-point resolution, which is the generally desirable resolution for many biological applications. Current microscope lenses are limited to capture approximately 50 megapixels per snapshot, a limitation that is primarily caused by the challenges associated with lens design. This is equivalent to imaging an approximately 3.5×3.5 mm area at 1 μm two-point resolution.

To increase the area over which it is possible to capture image data at a desired resolution into the multi-centimeter regime, a straightforward idea is to scan the sample or the imaging system mechanically and capture a series of image snapshots over time. Scanning-based approaches make up the majority of what is used to capture high-resolution image data from across large areas, for example in defect detection, fluorescence imaging from large assays, and in digital pathology.

A second primary challenge with high-resolution imaging over a large area is to ensure the specimen remains in focus across the full field-of-view of interest. In the case of imaging specimens such as preparations of cells across a large slide or cytopathology specimens, even without specimen scanning, one must ensure the imaging lens offers minimal aberration across the entire specimen area. In addition, if specimen is scanned as multiple snapshots are acquired, then refocusing can be used to bring the specimen into focus for each snapshot. However, this step and repeat method is time consuming, especially as the refocusing has to be done at each unique position of the scanned specimen.

SUMMARY OF THE EMBODIMENTS

In some embodiments, the present invention discloses imaging systems and methods, that are optimized for focusing mainly on features of interest, instead of on the whole image of the sample. The imaging system can be configured to process the image captured by the multiple cameras within a camera array of the imaging system, and to communicate with a moving mechanism of the imaging system for refocusing the multiple cameras on the sample to bring into focus a maximum amount of detected features of interest on the images.

The focused areas of the detected features can be a small subset of the image data captured by the imaging system, e.g., a large percentage of the image data, which does not or which contain only few features of interest, can be out of focus. By optimizing the focus on the feature of interest, a clearer and more detailed classification of the sample can be made, which can allow a more accurate diagnostic analysis. In addition, the out-of-focus areas and the areas without any features of interest can be removed from subsequent image capture and analysis to allow faster image transferring and image data processing.

After the features of interest are detected from the captured images, sub-images can be formed by cropping the captured images so that each sub-image containing a feature of interest. Focus measures, which, in some embodiments, can be based on image contrast such as a Laplacian operator, can be calculated on the sub-images, and then can be used to determine optimal focus distances of actuators of the moving mechanism for refocusing the camera array on the sample. The determination of the optimal focus distances can include a maximization of the sub-images to be in a focus range, such as to be in sharp focus. The optimal focus distances can be communicated to the actuators for refocusing the camera array on the sample. The optimization correlates the focus measures from all sub-images to provide a collective focusing decision.

In some embodiments, the optimization of the focus distances for the actuators of the moving mechanism can include a maximization of the number of in focus sub-images from all captured images of the camera array. In some embodiments, the optimization can also include a minimization of the image data that must be imaged and processed that are not in focus. The minimization of image data can speed up the image acquisition and analysis by reducing the amount of image data that must be captured by the camera array, transferred to the processing unit, and processed by the processing unit.

The maximization and minimization problem can be solved, for example, by establishing a positive reward term that is proportional to the product of the number of sub-images and their image focus measure per micro-camera, and a negative penalty term that is proportional to the number on non-sub-image pixels whose focus measure falls within some threshold focus within each micro-camera.

In some embodiments, the optimization process is configured to determine a sub-set of micro-cameras from which it is most beneficial to obtain additional image data from for a reliable analysis of the detected features of interest. The imaging system then can proceed to refocus the micro-cameras in the sub-set to obtain the additional data for analysis.

In some embodiments, the refocusing process can be accomplished by a digital refocusing process, in which phase information can be determined together with captured image data using images captured under multiple illumination patterns. The pattern illumination can be used to help ascertain the degree of focus for each image, for example, by obtaining the in focus plane having a maximum contrast. In some embodiments, the pattern illumination can be used to obtain images with enhanced contrast for ease of feature detection and analysis.

In some embodiments, the present invention discloses imaging systems and methods for a statistical diagnostic analysis of acquired image data, based on the classification of features of interest observed on a sample. The acquired images can be obtained after a refocusing process for maximizing the feature areas and minimizing image data that can be ignored, such as not containing the features or containing the features but not in focus. For example, the calculated focus measures in the refocusing process can be used to turn off all or a portion of the cameras when the images captured by these cameras show no features of interest or show features of interest that are significantly out of focus after the refocusing process. The emphasis on in focus feature data, together with the reduction of irrelevant image data, can enable a faster capture and processing after re-positioning.

After capturing images from the refocused camera array, the image data can be processes to obtain a statistical measure of one or more features of interest within the sample, for example, the number of white blood cells that show an indication of a particular disease.

The features of interest can be first detected from the captured images after the refocus process to form sub-images with each sub-images cropped from the captured image to contain a feature. Part of the feature detection process can include rejecting detected features that are not in focus, e.g., the features that have been left out in the maximization of in focus features during the refocusing process. Further, in some embodiments, if a camera exhibits significantly fewer features of interest than other cameras, then the camera can be ignored, e.g., turned off, during the image capture process after the refocusing process. By bringing only the in-focus features of interest for analysis, the present invention can have the critical benefit of capturing and processing less image data, and thus enabling more rapid capture and analysis, especially for extremely large sample observed the camera array of the imaging system.

The image data containing the in-focus features of interest can be sent to a data processing unit for analysis, such as to obtain a statistical measure of the properties of the sample. For example, the sample is a large blood smear, and the statistical measures are the morphological features of blood cells that are indicative of a particular disease, such as COVID-19.

The analysis of the in-focus features of interest can include an image classification, performed by a supervised machine learning algorithm, such as a deep convolutional neural network. For example, each feature of a blood cell in the analyzed images of in-focus features can be classified into one of two categories of diseased (e.g., from a infected patient) or healthy (e.g., from a healthy patient).

In some embodiments, the classification process can include a two stage classification, with a first stage classification configured to classify the features of interest into one of several feature groups, and a second stage classification configured to classify each feature in each group into one of multiple categories such as diseased, healthy, borderline, or unknown. For example, a first machine learning algorithm can classify features in a blood smear into one of 7 blood cell types: neutrophils, lymphocytes, eosinophils, monocytes, basophils, platelets, or other. Then, each cell type is classified again, for example, by one or more second machine learning algorithms, into one of multiple categories including diseased or healthy.

After the image classification task, the composite set of all classification categories can be further combined via a statistical (e.g., by computing their mean, median, mode or some other metric) or machine learning-based approach (such as used in multiple instance learning, which would consist of an additional classification-type step on the compiled set of classified categories). The output of this step is a final analysis report, including a diagnostic measure and/or a prognostic measure of disease, which can be included with other clinical data to improve patient outcome.

In some embodiments, the image analysis, including the classification of features and the statistical summary of the classified categories, can be improved by a phase gradient imaging or an enhanced contrast approach by using optimized pattern illumination. For example, by analyzing images captured under illumination patterns in opposite directions in a phase gradient imaging process, the phase gradient information can give an indirect measure of the surface topology of the sample of interest, such as a defect can be an indentation into the surface or a particle sitting on the surface, or one cell is thicker than another cell.

In addition, under an optimal illumination pattern, image contrast can be greatly enhanced, which can assist in the automated classification process. For example, a machine learning algorithm can be trained to determine an optimized pattern of illumination to maximize the performance of the image classification task.

BRIEF DESCRIPTION OF THE DRAWINGS

FIGS. 8A-8D illustrate an imaging system with non overlapping images reduced from overlapping field of views according to some embodiments.

FIGS. 11A-11C illustrate a schematic process for detecting features according to some embodiments.

FIGS. 15A-15C illustrate focus measures resulting from a focus operator operating on multiple focus levels in an input according to some embodiments.

FIGS. 16A-16C illustrate focus measures resulting from a focus operator operating on multiple feature areas in a sample according to some embodiments.

FIGS. 17A-17D illustrate focus measures of features areas in a sample correlated to input focus levels according to some embodiments.

FIGS. 23A-23C illustrate actuators in a moving mechanism for a sample stage according to some embodiments.

FIGS. 28A-28C illustrate focus operations by a combination of tilting a camera array or a sample stage and a curving the sample stage according to some embodiments.

FIGS. 31A-31C illustrate another example of an imaging process with a refocusing operation according to some embodiments.

DETAILED DESCRIPTION OF THE EMBODIMENTS

Figure 1A:
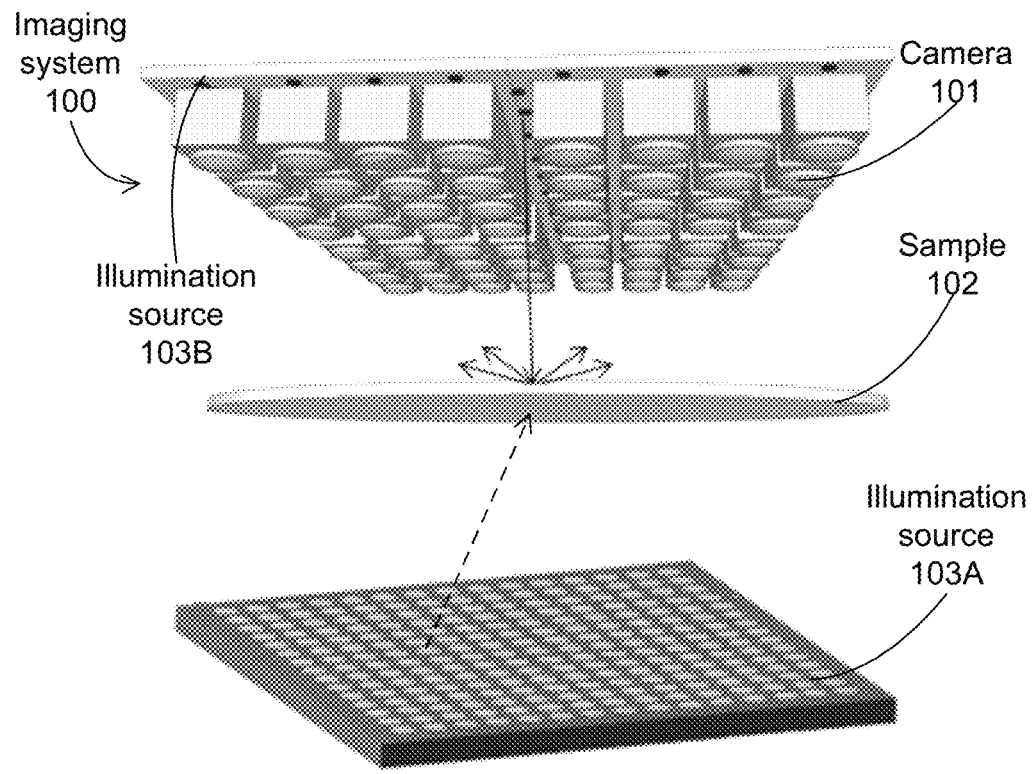
FIGS. 1A-1B illustrate a schematic of an imaging system according to some embodiments.

In some embodiments, the present invention discloses an imaging system with increase speed for imaging a sample, such as a thin specimen. The imaging system can include multiple micro-cameras, e.g., microscopes, arranged in an array, in which the individual fields-of-view of each micro-camera image a unique portion of a contiguous surface of the sample, such as a large glass slide that holds a thin specimen of interest. Each micro-camera within the array can include a digital image sensor that contains an array of light sensitive pixels, and one or more imaging lenses that form a high-resolution image of the specimen area onto the sensor. The micro-cameras can be arranged in an array at a tight spacing, such as less than 15 mm apart, which can be a rectangularly packed array, a hexagonally packed array, or any other type of tight spaced packing.

A significant benefit of an arrayed approach is the ability to capture image data much more efficiently than with a scanning approach on a single microscope. In principle, with N individual microscopes in an array, it will be possible to image across a large area a factor of N times faster than with a single microscope, and possibly even faster.

To image a specimen at high resolution (<2 µm full-pitch resolution), each micro-camera array within the array will have to magnify a portion of the specimen onto its image sensor array, using a magnification M>1 (greater than unity). Accordingly, when each micro-camera must magnify the specimen area that it is imaging (e.g., its FOV), there can be gaps within the imaged field-of-view of each micro-camera, such that the entire surface of the specimen of interest is not imaged simultaneously by the collection of all micro-cameras. To account for this lack of inter-micro-camera overlap of imaged field-of-view, e.g., a "non-overlapping array" design, it is possible in this invention to scan either the specimen or the sample to multiple unique spatial locations and acquire more than one image.

In some embodiments, the present invention discloses imaging systems and methods, that are optimized for focusing mainly on features of interest, instead of on the whole image of the sample. The focused areas can be a small subset of the image data captured by the imaging system. A large percentage of the image data, which does not or which contain few features of interest, can be out of focus. By optimizing the focus on the feature of interest, a clearer and more detailed classification of the sample can be made, which can allow a more accurate diagnostic analysis. In addition, the out-of-focus areas and the areas without any features of interest can be removed from subsequent image capture and analysis to allow faster image transferring and image data processing.

In some embodiments, the present invention discloses imaging systems and methods for a statistical diagnostic analysis of acquired image data, based on the classification of separate features of interest observed on a sample. After obtaining detailed images of individual features of interest, the individual features can be analyzed and classified into categories, such as diseased or healthy, and a statistical analysis of the multiple features can generate a diagnostic measure of the sample with high probability. The statistical analysis can employ an optimization of focusing mainly on the features, which can provide surface topology and improved contrast assessment to improve the classification accuracy.

In some embodiments, the imaging systems can include a computational microscope that is configured to take images of a specimen sample, refocus the images on the features of interest, and analyze the feature image data to provide a statistical analysis of the specimen based on the classification of the features.

The imaging system can be configured to capture microscopy images from multiple image sensors and transfer them to a data processing unit. The data processing unit can identify features of interest for determining a refocusing strategy, and can analyze the individual features on images recaptured after the refocus step. The imaging system can involve a co-optimization of image acquisition hardware, data aggregation digital logic, firmware, and an integration with a data post processing on the data processing unit. The imaging system can allow rapid acquisition of microscopy images, especially in handling the large volume of data generated by the multi-sensor systems, which requires the combined design and optimization of hardware and software for adequate analysis. The imaging system can also provide enhanced and simplified control over image acquisition strategies when combining the microscope with other hardware for sample handling and manipulation.

Micro-Camera Array Microscope (MCAM) System

In some embodiments, the imaging system can include a computational microscope system of a micro-camera array microscope (MCAM) system, together with a data processing unit configured for the ability to focus on features of interest and to perform a statistical analysis on the focused features. Advantages of the MCAM imaging system is the ability for high magnification with large sample size, together with enhanced contrast and surface topology observation for improved image analysis. Details about the MCAM system can be found in patent application Ser. No. 16/066,065, filed on Jun. 26, 2018; and in patent application Ser. No. 17/092,177, filed on Nov. 6, 2020, entitled "Methods to detect image features from variably-illuminated images"; hereby incorporated by reference in their entirety, and briefly described below.

The MCAM system can be viewed as a group of multiple individual microscopes tiled together in an array to image a large sample. The individual microscopes can be configured into a micro camera package, e.g., forming a tightly packed array of micro-cameras with high resolution (0.25-5 µm) and magnification (0.5×-10×) over a large area (hundreds of square centimeters) at a sample working distance of at least 300 mm down to at most 10 mm. The images taken from the individual micro cameras, which include overlapped image patches of the sample, can be stitched together to form the image of the sample. Alternatively, the images taken from the individual micro cameras can provide non overlapped image patches of the sample, which can be analyzed to provide a statistical assessment of the sample.

The MCAM system can include a programmable illumination system, such as a large array of light sources, with individual light sources or groups of light sources capable of being controlled separately, for example, by a controller. The illumination system can be placed below or above the sample, to provide transmissive or reflective light to the micro cameras. The light sources can include visible light sources, infrared light sources or ultraviolet light sources such as light emitting diodes (LEDs) or lasers with appropriate wavelengths. The light sources can include a spatial light modulator (SLM) or a digital micromirror device.

The MCAM system can use multiple micro-cameras to capture light from multiple sample areas, with each micro camera capturing light from a sample area sequentially from multiple patterned illumination configurations provided on the same sample area.

The illumination system can provide the sample with different illumination configurations, which can allow the micro cameras to capture images of the sample with light incident upon the sample at different angles and wavelengths. The illumination angle and wavelength are important degrees of freedom that impacts specimen feature appearance. For example, by slightly changing the incident illumination angle, a standard image can be converted from a bright field image into a phase-contrast-type image or a dark field image, where the intensity relationship between the specimen and background is completely reversed.

Further, by providing the sample with different light angles and wavelengths, both intensity and phase information of the received illumination can be recorded, which can allow the reconstruction of an image with more information or higher resolution, such as showing surface topology of the sample using patterned illuminations in opposite directions, or to achieve higher automated image recognition or classification accuracies using optimized illumination patterns. The MCAM system can offer size, weight, complexity, and cost advantages with respect to standard microscopes. The MCAM system may not require any moving parts, and its micro-cameras fit within a compact space without requiring a rigid support structure and can thus operate within a small, confined space.

Figure 1B:
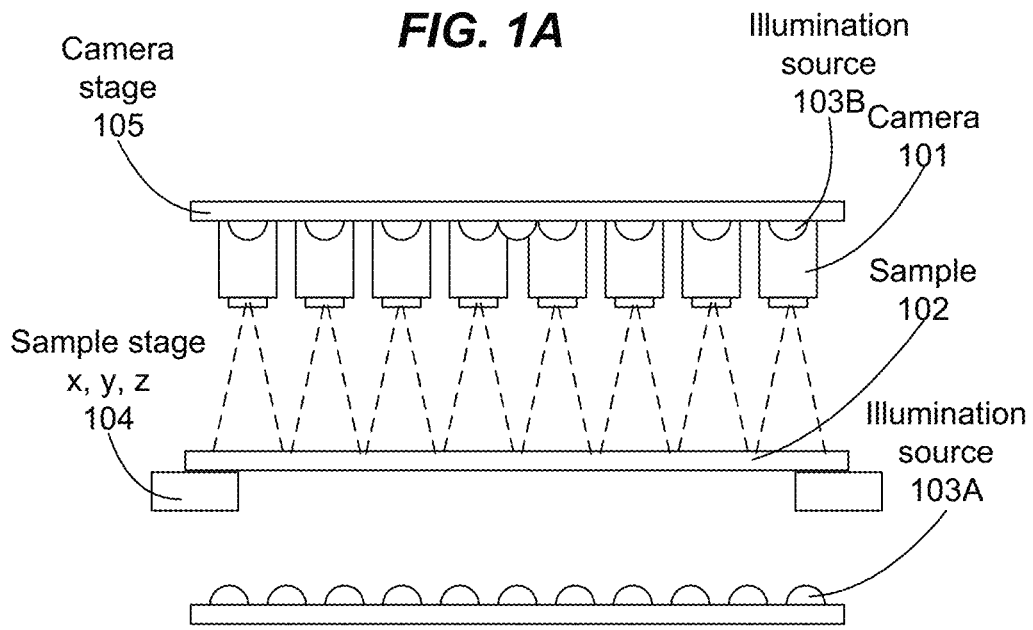

FIGS. 1A-1B illustrate a schematic of an imaging system according to some embodiments. The MCAM system 100 can include an array of camera units 101 and a patterned illumination source 103A and 103B for microscopic imaging of a sample 102. The micro-camera array 101 can include more than one micro-camera. The micro-cameras can be placed adjacent to one another in a planar configuration, in which case the optical axes of all micro-cameras are parallel to one another. The micro-cameras can be arranged in either a rectangular, hexagonal, or other periodic grid. A simplified cross-sectional diagram of a micro-camera array in a planar configuration is shown. This micro-camera array is in a non-overlapping configuration, e.g., there is a gap between two adjacent micro-cameras. Thus, the entire specimen field-of-view (FOV) beneath the micro-camera array is not viewable in a single snapshot.

Each micro-camera unit can contain one or more lenses for focusing light, an aperture, as well as a radiation detector, e.g., an image sensor, for detecting light. The radiation detector can include a CMOS image sensor array, having between 1 million and 100 million pixels that are 0.5 µm-5 µm in size. The lens system can be designed to offer a 0.5-10× magnification at a sample working distance of 300 mm down to 10 mm.

In some embodiments, the camera units can be configured to image non-overlapping field of view, or partially overlapping field of views (FOV) of image areas of a sample 102, such as a semi-transparent sample. The sample can be disposed on a sample holder 104, which can be configured to move the sample as a whole or as individual portions.

In many imaging scenarios, the sample is not entirely flat across the full imaging FOV with respect to the imaging system (e.g., is not perfectly perpendicular to the optical imaging axis). For example, a sample can be tilted, which can result in some sample areas in focus while some sample areas not in focus.

The individual cameras can include a focusing mechanism to perform the focus when the cameras are out of focus. For example, the image sensor, the optical assembly, a lens in each camera can be adjusted. Alternatively, the camera array stage 105 or a sample holder 104 can include a moving mechanism to move the camera array or the sample in an axial direction, e.g., moving the sample toward or away from the camera array, relatively, to bring different sample areas into focus. An optimization algorithm can be performed to determine how and where to move the camera stage 105 and sample holder 104 axially to maximize the amount of features of interest in the sample that is brought into sharp focus.

For example, the sample holder 104 can be configured to move the sample in a lateral direction of the sample, for example, for camera arrays to capture different areas of the sample, e.g., the sample holder can function as a scanner stage for scanning images of the sample. The sample holder can be configured to move individual areas, such as corners, of the sample, for tipping or tilting the sample with respect to the camera array, or for moving the sample toward or away from the camera array. The sample holder can be configured to move individual areas for curving the sample.

In some embodiments, multiple linear actuators can be in contact with different areas of the sample holder, such as at 4 corners of the sample or the sample holder to control its vertical position and tip/tilt. In addition, one or more actuators on either side of the sample or the sample holder can move inwards or outwards to curve the sample or the sample holder, to bring different areas of the sample into focus or out of focus.

In some embodiments, the sample holder 104 can be coupled to a moving mechanism configured to perform scanning operations, e.g., advancing the sample in discrete steps while capturing images of the sample at every sample advancing step. In term of focusing on the features of interest, and statistical analyzing the features for a high probability of sample assessment, sample scanning can be an optional step.

For example, in certain applications, such as imaging monolayer preparations of cells, such as blood cells in thin-smear preparation, or cytology smears, the data of interest is the aggregate statistics which can be sampled from different specimen regions that do not necessarily spatially connect with one another. Accordingly, scanning ability is not needed, e.g., imaging the entire specimen area is not necessary, to obtain a useful measure of aggregate statistics. Examples include red blood cell counting, white blood cell differential counting, identification of cancerous cells or tissue areas, the automated detection of viral infection from examining the morphology of blood cells or other cells extracted from a patient, and the automated detection of bacterial infection from examining the morphology of blood cells or other cells extracted from a patient. With the use of a microscope array that has a non-overlapping array design with N micro-cameras, a speed increase of a factor of N can be achieved in imaging a sample to derive aggregate statistical information. In addition, a focus strategy is provided to ensure that the image data, e.g., the features of interest, remains in-focus, due to the shallow depth-of-field of high-resolution lenses, to enjoy the high speed increase based on the rapid collection of image data across a large sample area with a micro-camera array microscope.

The patterned illumination source 103A and 103B can be configured to provide radiation, e.g., electromagnetic waves including visible light, infrared and ultraviolet light, on the sample 102 from a plurality of angles and spatial patterns, so that the spatial-angular distribution of radiation reaching the sample changes over time.

The illumination source can include a bottom set of radiation source units 103A, a top set of radiation source units 103B, or both bottom and top sets of radiation source units 103A and 103B. The illumination source can provide illumination patterns to the sample 102 of the MCAM system 100, in which there is either a transmission illumination through the bottom set of radiation source units 103A for a transparent or semi-transparent sample, or a reflection illumination through the top set of radiation source units 103B for an opaque or semi-transparent sample, disposed near the micro cameras. The illumination source can also provide a dual illumination geometry, in which there are a transmission illumination through the bottom set of radiation source units 103A, and a reflection illumination through the top set of radiation source units 103B, for example, for a semi-transparent sample.

The illumination source can be configured to generate multiple illumination patterns. At each illumination pattern in the spatial-angular distribution of radiation generated from the illumination source 130 and 140, each camera unit can acquire an image. The set of images acquired from the camera units for the image areas for the illumination patterns can be processed to form an image reconstruction of the sample. The image reconstruction can also offer at least a measure of sample depth, spectral (i.e., color) properties, or the optical phase at the sample plane.

In some embodiments, a transmission illumination 103A can be used, e.g., using the patterned illumination source 103A which is an array of more than one light source positioned beneath the sample. The light from one or more light sources can be turned on at a time when a separate image snapshot is acquired by the micro-camera array. The scanning stage can reposition the sample to new locations in-between image snapshots.

In some embodiments, both transmission illumination 103A and reflection illumination 103B (dual illumination) can be used, e.g., the patterned illumination can be provided both below and above a sample, and more than one light source can illuminate the sample from both below and above. The dual illumination geometry will work best with samples that are both partially reflective and transparent, as in certain types of biological sample.

The MCAM system 100 can include a controller for controlling the camera units, the radiation source units, and for processing the images. For example, the controller can include a central processing units 180, which can couple to a camera and light controller units 184 for controlling the camera units, e.g., to tell the camera units when to capture images, and for controlling the radiation source units, e.g., to tell the radiation source units when to be activated and what radiation source units to be activated. The central processing unit 180 can be coupled with the camera units to obtain the image data captured by the camera units. The data can be stored in memory 181, can be processed in a post processing dataset 192, and can be displayed 183 on a display or to send to a final storage.

Figure 2A:
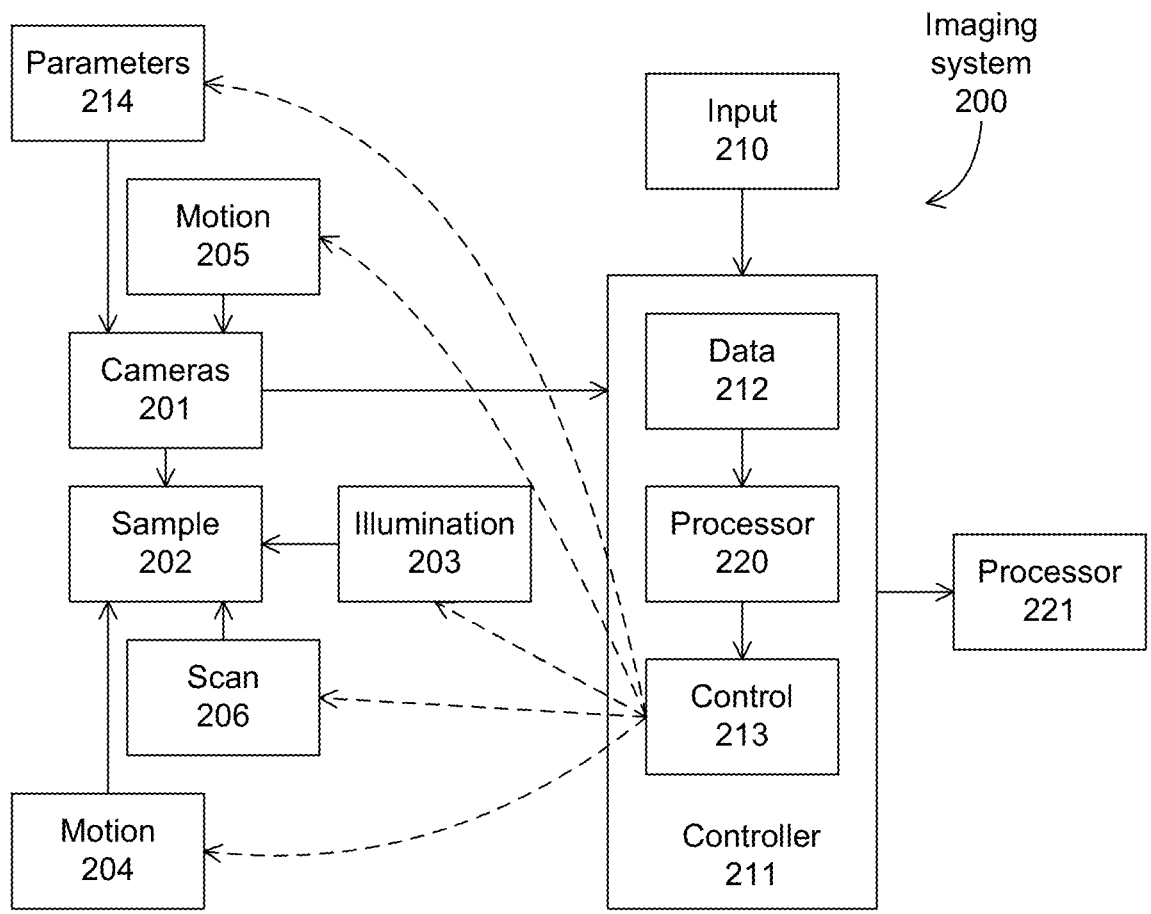
FIGS. 2A-2C illustrate an overview of components and functionality of an imaging system according to some embodiments.
Figure 2B:
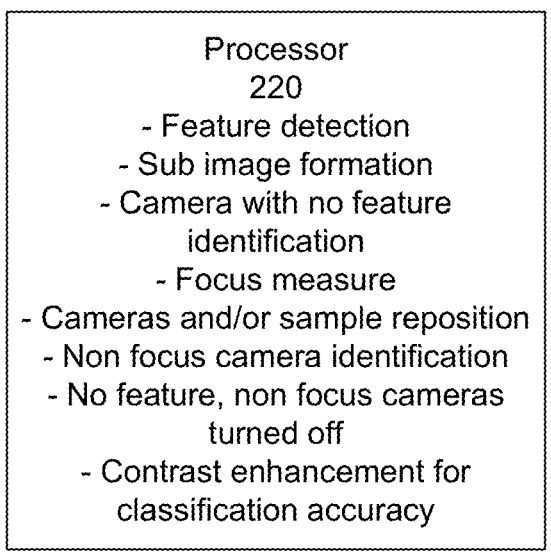
Figure 2C:
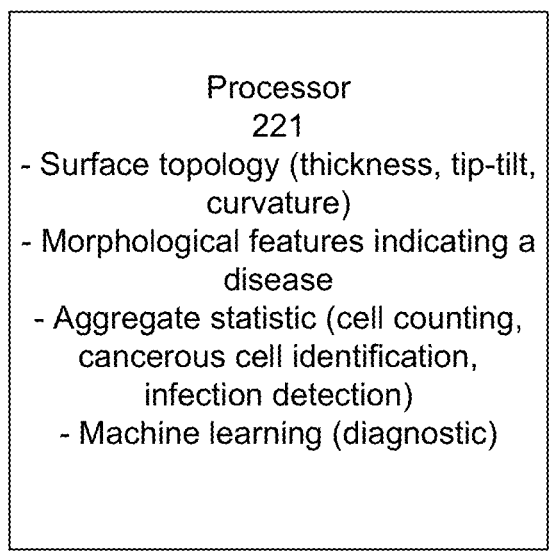

FIGS. 2A-2C illustrate an overview of components and functionality of an imaging system according to some embodiments. FIG. 2A shows a block diagram of an imaging system 200, such as an MCAM system, modified for feature focusing and feature analysis. The imaging system can include a camera array 201 and an illumination source 203, which are controlled by one or more controllers 213, such as a camera controller, an illumination controller, and a system controller.

An imaging system can include an array of camera units 201 focused on a large sample 202 under the illumination of an array of radiation source units 203. Image parameters 214 to the camera array 201 can be inputted to the camera array, for example, to control focus mechanisms for refocusing the individual cameras. A motion mechanism, e.g., a movable camera stage 205, can be used to adjust the positions of the camera array, such as tipping, tilting, or translating the camera array. A motion mechanism, e.g., a movable sample holder 204, can be used to adjust the positions of the sample, such as tipping, tilting, translating, or curving the sample. An optional scanning module 206 can be used for advancing the sample or the sample holder in discrete steps for capturing scanning image data of the sample.

A data processing system 211 can be used to control the elements of the imaging system. The data processing system 211 can be configured to receive inputs 210, such as data related to features of interest to be detected and analyzed on the sample. The data processing system 211 can be configured to receive data 212 from the camera array 201, and to transfer the data to a data processing processor 220 for analysis. The data processing system 211 can be configured to transfer the data to a second data processing processor 221 for a different analysis. The data processing system 211 can include a controller 211 to control the camera array, the illumination source, and the sample holder to provide suitable conditions for image captures, such as providing variably illuminated radiation patterns to the sample, repositioning the cameras, the camera array, the sample, or the sample holder for focusing or scanning operations.

The imaging system 200, such as micro-camera array microscope, based on a set of more than one compact, high-resolution imaging system, can efficiently acquire image data from across a large sample by recording optical information from different sample areas in parallel. When necessary, physically scanning the sample with respect to the array and acquiring a sequence of image snapshots can acquire additional image data.

In some embodiments, the imaging system 200 is configured to ensure that an optimal number of cameras in the micro-camera array can acquire a sharp in-focus image, whether scanning is or is not used. The imaging system can include a data processing processor 220 which is configured to refocus the camera array and to capture focused images from the refocused cameras across a large sample. The data processing processor 220 can also be configured to reduce the amount of out-of-focus data that is captured and passed along the in-focus image data for additional processing. For example, the data processing processor 220 can be configured for detecting features on interest on the captured images, for forming sub-images with each sub-image cropped from the image to contain a feature of interest, for identifying cameras whose image data showing no features of interest so that the image data from these cameras can be excluded from being sent for subsequent data analysis, for computing focus measures from the sub-images to determine optimum focus distances for refocusing the cameras on the sample, for repositioning the cameras, the camera array, or the sample holder in order to refocus the features on the images recaptured by the cameras, for identifying cameras whose image data showing out-of-focus feature images after the repositioning process so that the image data from these cameras can be excluded from being sent for subsequent data analysis, or for controlling the illumination source for obtaining surface topology or contrast enhancement.

The imaging system can include a data processing processor 221 which is configured to analyze the image data passed from the data processing processor 220. The data processing processor 221 can also be configured to classify the sub-images, e.g., the features on the sub-images, into different categories, such as diseased or healthy, and to statistically analyze the classified features into a diagnostic assessment of the sample under observation. For example, the data processing processor 221 can be configured for classify the features based on the surface topology, e.g., thickness. tip-tilt, and curvature, of the features, and based on the morphological features indicating a disease. The data processing processor 221 can be configured for and aggregate statistical analysis, including cell counting, cancerous cell identification, infection detection, using a machine learning algorithm.

Figure 3:
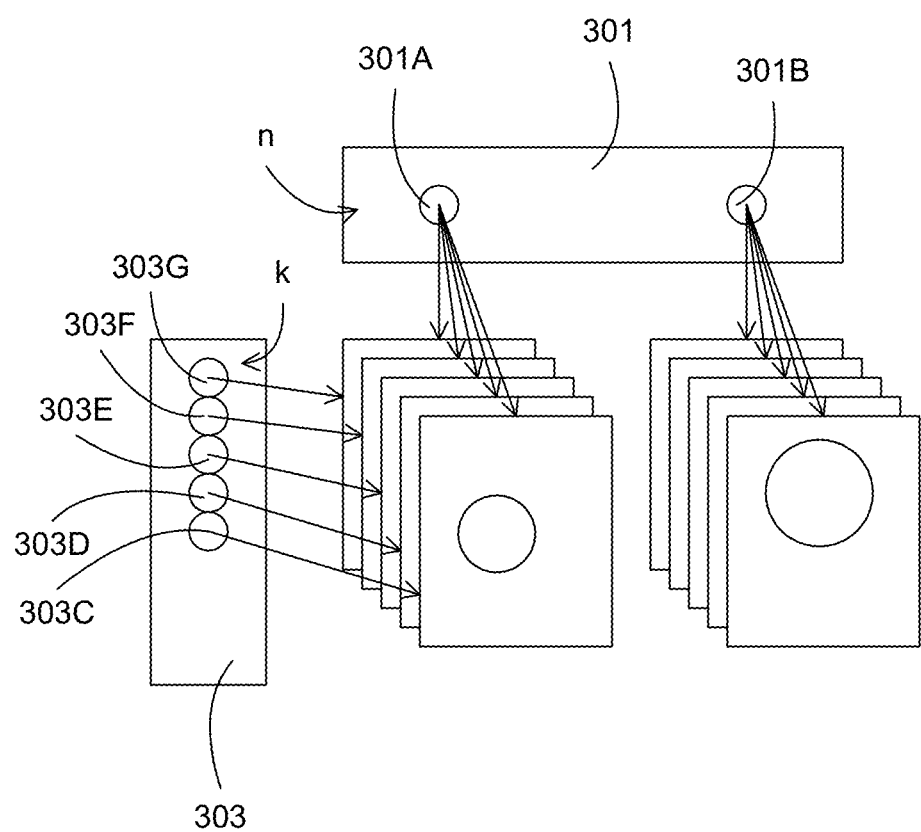
FIG. 3 illustrates a schematic for multiple illumination patterns according to some embodiments.

FIG. 3 illustrates a schematic for multiple illumination patterns according to some embodiments. An imaging system can include an array of camera units 301 having cameras 301A and 301B, which can focus on a sample under the illumination of an array of radiation source units 303. A controller can be used to control the illumination system to provide variably illuminated radiation patterns, e.g., multiple illumination patterns with each pattern different from other patterns, to the sample.

The patterned illumination source is the collection of light sources, which can be used to illuminate the sample with light from a plurality of directions, wavelengths and spatial patterns. In some embodiments, the patterned illumination source can consist of an array of LEDs positioned at different locations. For example, the patterned illumination source could take the form of an LED array with 32×32 LEDs, where each LED has 3 spectral channels (center wavelength=632 nm, 530 nm and 460 nm), a 4 mm LED pitch, and a 150 μm active area diameter. Alternatively, a custom-designed array of any number of LEDs (anywhere from 2 to 1 million LEDs) can be used in any sort of circular, hexagonal, random or other geometric spatial arrangement, either on a flat or curved surface. The wavelength of the light emitted by the light sources can be in the range of 200 nm-2 μm.

In some embodiments, the patterned illumination source can consist of one or more laser sources or laser diode sources, which can remain in a stationary position or can move positions between each captured image to provide different angular or spatial patterns light to the sample. In some embodiments, one or more laser sources or laser diode sources can be sent through one or more optical fibers positioned at different locations and/or angles with respect to the sample. The light from the one or more optical fibers may reach the sample at different angular or spatial arrangements. In some embodiments, a spatial light modulator (SLM), with the spatial light modulator including a liquid crystal or a liquid crystal on silicon display for displaying an illumination pattern, can be used as the patterned illumination source. By changing the patterned displayed on the SLM, the illumination pattern may be changed between captured images. In some embodiments, a digital micromirror device can be used as the patterned illumination source, with one or more miccromirrors of the digital micromirror device oriented at a first angle to reflect light towards the sample defining a particular illumination pattern. This illumination patterned can be changed between captured images.

The imaging process can start by capturing k sets of variably-illuminated images from k illuminated patterns. The variably illuminated patterns include multiple illumination patterns in which the light is from different light source units. For example, an illumination pattern can include light from a single light source unit.

Thus, if the light source unit in an illumination source is activated one at a time, there can be k illumination patterns for an illumination source having k light source units. For example, an illumination source 303 can have 5 light source units 303C, 303D, 303E, 303F, and 303G. When the light source unit is activated one at a time, there are 5 illumination patterns, with each pattern including light from a light source unit.

In some embodiments, different illumination patterns can be provided by a programmable array of light source units, with different light source units activated to emit radiation to the sample. Each light source unit can be configured to cover the whole sample, e.g., light from a light source unit can reach all areas of the sample. The programmable light source array can include light source units that are at different positions above or below the sample, as well as light source units that emit different frequencies (i.e., colors) of light. The light source units can include light emitting diodes (LEDs), individual lasers, laser diodes, spatial light modulators or other electronically controllable light emission elements.

The variably-illuminated images can be captured by a camera array, with each camera unit in the camera array 301 capturing an image. The camera array can include n camera units, with each camera unit configured to capture an area of the sample.

The camera units in the camera array are all activated at a same time for each illumination pattern to capture images. Thus, for each illumination pattern, there can be a set of n images. For example, a camera array can have 2 camera units 301A and 301B. There is a set of n=2 images captured under one illumination pattern.

Under k=5 different illumination patterns, there can be 5 sets of 2 images, each captured under a different angle and spatial pattern, for a total of 2×5=10 images. The image reconstruction of the sample, obtained by fusing the k sets of assembled images, can contain the spatial-angular distribution of radiation reaching the sample. As such, the image reconstruction can offer a measure of sample depth, spectral properties, and the optical phase at the sample plane.

The pattern illumination can be used for digital refocusing, phase gradient imaging, and classification accuracy improving. For example, the images captured under different illumination patterns can be processed to help ascertain the degree of focus for each image. After acquiring a sequence of images under illumination from k different illumination sources, the phase of the wavefront at the sample plane from the k unique images can be estimated. A phase retrieval algorithm can be used, with the use of different illumination sources offering the angular diversity to the phase retrieval reconstruction process. Once the phase of the wavefront at the sample plane is reconstructed, it can be combined with the measured amplitude and then digitally refocused (e.g., using a digital implementation of Fresnel propagation) until maximum image contrast is achieved. The plane with maximum image contrast can be the in-focus plane for the sample. In some embodiments, the digital refocusing process using the patterned illumination can greatly relaxes the design tolerances of the camera optics and the mechanical stage of the imaging system, which can be applicable in a broader range of applications.

The patterned illumination can be used to measure the phase gradient of the surface of a thin sample, which can provide an indirect measure of the surface topology of the sample, including additional information about a defect, such as whether the defect is an indentation into the surface or a particle sitting on the surface, or additional information about a biological sample, such as one cell is thicker than an adjacent cell. The general method of reconstructing the phase gradient along one dimension is to illuminate the sample with patterned illumination from one direction (e.g., with all the LEDs to the right of the lens turned on, and the rest turned off) and to capture one image, I1. This process is repeated by illuminating the sample with patterned illumination from the opposite direction (e.g., with all the LEDs to the left of the lens turned on, and the rest turned off) and capturing a second image, I2. The phase gradient along that particular dimension, e.g., the left and right directions, can be obtained by computing the image different $I1-I2/(I1+I2)$.

With the camera array having multiple micro-cameras, the phase gradient calculation can be performed separately for each micro-camera, for all of the micro-cameras together, or for some combination of selected illumination units and micro-cameras. The phase gradient process can be repeated for each scan position.

The patterned illumination can be used to improve the classification accuracy of the features of interest, for example, by increasing a level of image contrast with selected illumination patterns. The basic concept of changing image contrast is the difference in image contrast for standard bright field and dark field illuminations. In bright field illumination, many samples do not exhibit a high amount of contrast, especially unstained biological samples, which are primarily transparent. The low contrast can cause difficulty in classify the content of the image, either by a human or by an automated computer algorithm. The samples exhibiting low contrast under a bright field illumination can have a higher level of contrast under dark field illumination.

However, it is often not clear which samples and which type of dark field illumination are suitable to achieve a level of contrast for the features of interest required to achieve accurate classification. Thus, a machine learning algorithm can be trained to simultaneously perform the image classification task and to determine an optimized pattern of illumination.

In some embodiments, an optimization algorithm can be used to determine an optimized illumination pattern to maximize the performance of the image classification task, such as by applying a machine learning algorithm for the imaging system having a micro-camera array. For example, the illumination pattern can be optimized by considering all micro-cameras within the array.

In some embodiments, the present invention disclose a method, and an imaging system configured to use the method, to rapidly focus the imaging system, such as a micro-camera array microscope configured to capture images of a large sample. The focusing process can be configured to maximize an amount of desired feature content, such as maximizing a number of sub-images, with each sub-image being a cropped image to contain a feature of interest.

In some embodiments, the method can further include collecting feature sub-images that have been captured in-focus after the focusing process, and then process this in-focus feature image data to derive statistical insights about the imaged sample.

In some embodiments, the method can include a focus aggregation strategy, in which focused or unfocused image data captured from the camera array is collected. The captured image data is then processed to identify features of interest and to compute a focus measure for each image area containing a feature of interest. The feature focus measures for the features of interest are then compared and aggregated to form focus aggregation values, which are associated with focus distances of actuators of a moving mechanism configured to refocus the camera array onto the sample by moving the sample, the camera array, or the optical elements of individual cameras to account for sample position and tip/tilt. The camera array or the sample will then be repositioned based on the focus aggregation values, e.g., the focus distances. After the repositioning step, new image data is captured with a maximum number of feature image areas being in focused.

In some embodiments, the method can further include automatically detected and segmented, e.g., cropped, the in-focus feature image areas, which are then sent along to a machine learning algorithm for additional analysis, such as for diagnostic purposes.

In some embodiments, the imaging system is configured to be focused on the features of interest on the sample, while the remaining image areas can be either in focus or out of focus. The focus process on selected areas of features of interest can simplify the automatic focusing algorithm, especially for the imaging system having multiple cameras, since the focusing algorithm can be configured to obtain focusing results on a small portion of the sample. In addition, the focus process on selected areas of features of interest can significantly reduce the image data to be transferred and analyzed, which can result in a faster operation.

Figure 4A:
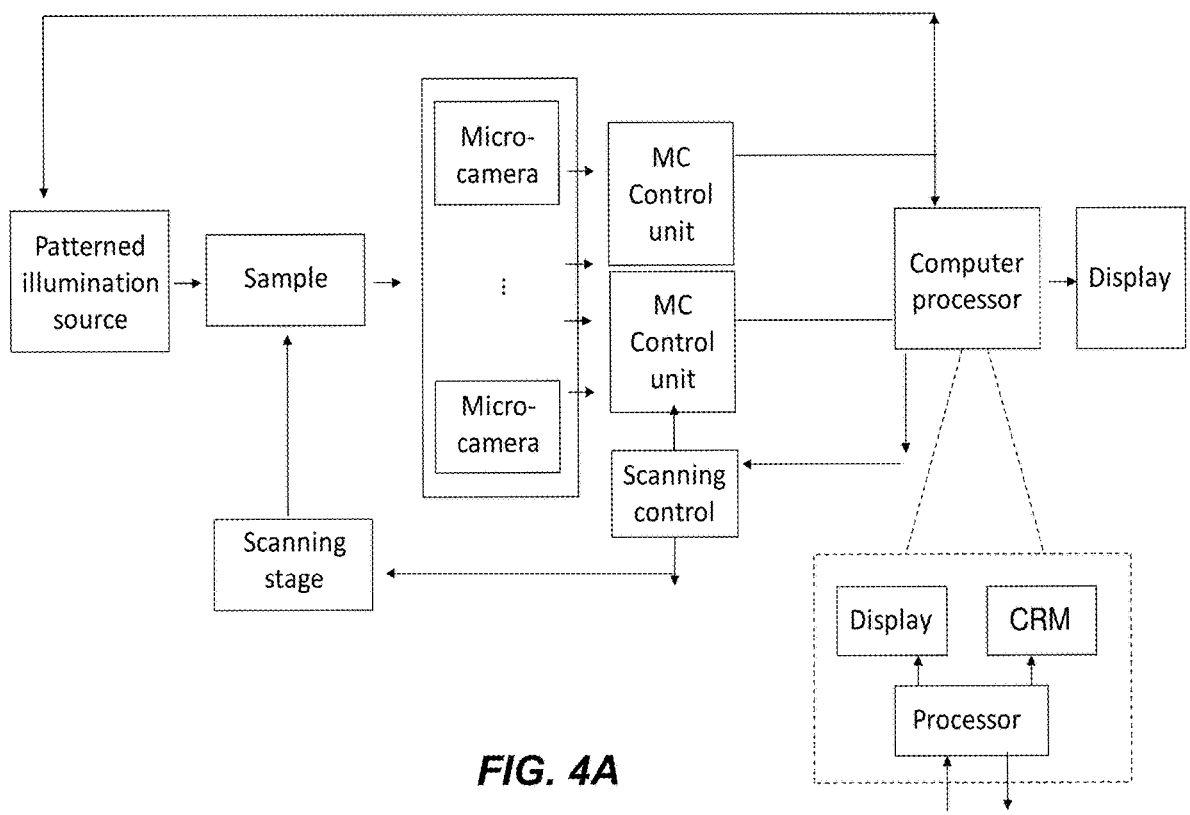
FIGS. 4A-4B illustrate general process operations of an imaging system according to some embodiments.
Figure 4B:
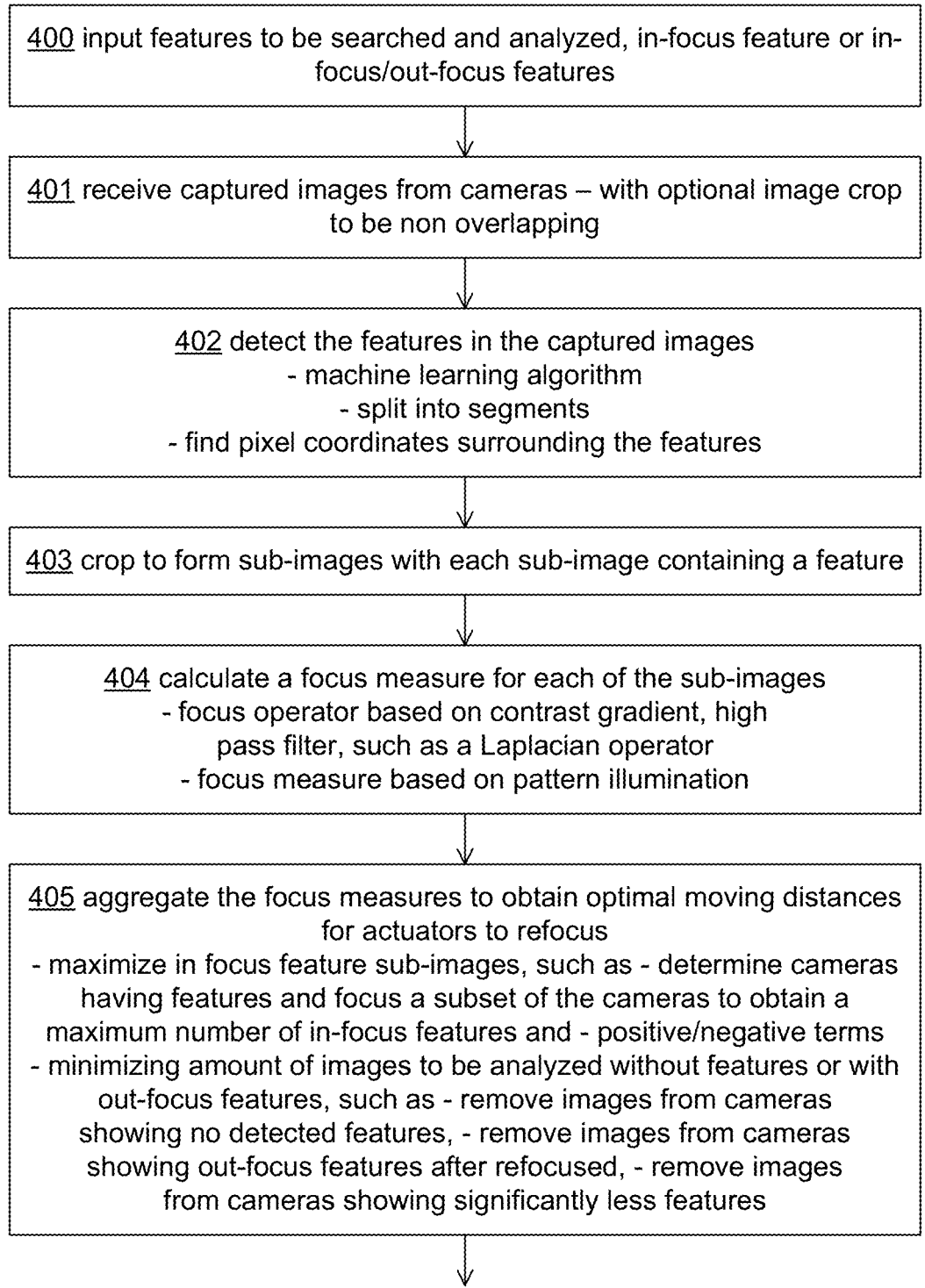
Figure 4B:
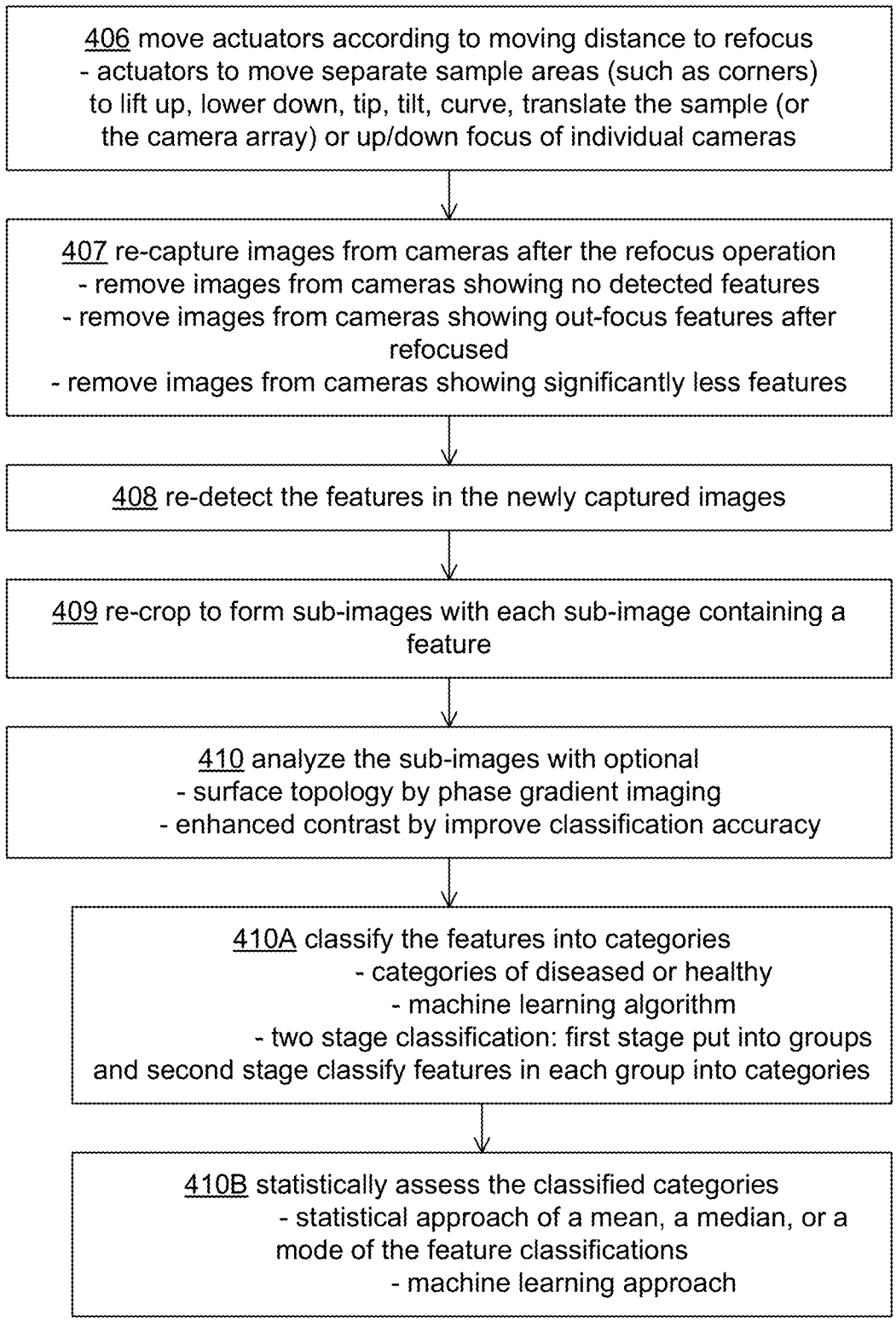

FIGS. 4A-4B illustrate general process operations of an imaging system according to some embodiments. The image system is operated to maximize the areas containing features of interest. For example, a feature of interest can be inputted to the imaging system, such as specifying that the feature of interest is a type of white blood cell for a blood smear sample placed on the sample holder of the imaging system.

In some embodiments, the imaging system is configured with a computer algorithm to maximize the number of features of interest that are to be brought into focus, which can be a small subset of all image data, while a large percentage of the image data that does not contain the features of interest can still not be in-focus. The focusing process that aims to achieve focus on a limited number of feature areas can allow faster convergence of the focusing algorithm as compared to a whole image focusing process for maximizing the focus of the imaged area across most or all the micro-camera image data.

Further, the focus measures obtained from the feature image areas can be shared or associated with one another to enable a rapid computation of a collected focusing decision. In addition, for cameras that capture image areas where there are no features of interest or that will be significantly out-of-focus after sample re-positioning, the focus measures can be used to turn off all or segments of the captured image areas, which can enable faster capture and process after re-positioning.

That is, after re-positioning based on the collective focusing decision, a second computer algorithm can process the acquired image data that is captured in sharp focus to obtain a statistical measure of the properties of the sample of interest. For example, the imaged sample is a large blood smear, and the statistical measures of interest are the morphological features of blood cells that are indicative of a particular disease, such as COVID-19. By aiming to only bring features of interest across multiple, segmented sample areas into sharp focus, the imaging system can have the critical benefit of capturing and processing less image data, and thus enabling more rapid capture, for example, as compared to imaging systems designed to bring all areas of the sample plane into sharp focus.

In addition, the imaging system can be configured to capture highly segmented data from the sample plane, which can be specifically suited to the statistical analysis of acquired image data. And due to the extremely large sample area captured under the field of view of the imaging system, the imaging system can be configured to bringing different sample regions into focus, by adjusting the axial position, the tip, tilt and curvature of the sample.

In some embodiments, the imaging system can be configured to capture images of a sample, and then process the image data to characterize the sample, such as to diagnose a possible chance of infection from the examination of the morphology of a blood sample. A general workflow of the image capture and analysis can start with the cameras capturing images of the sample under a pattern illumination generated by an illumination source. For example, light from the patterned illumination source first reaches and interacts with the sample, e.g., light can be absorbed or scattered from the sample. The sample can be held by a mechanical stage, which can mechanically move sample with at least 1 degree of freedom (along x), but preferably 2 degrees of freedom (along x and y) or three degrees of freedom (also along z). The mechanism of mechanical movement can be achieved by one or more computer-controlled motors or actuators that drive a moving mechanism, such as a micrometer, to position the mechanical stage. After the light interacts with the sample, it then exits the sample and carries information to the micro-camera array. The micro-camera array can contain more than one micro-camera. For operation in transmission mode, the micro-cameras may be mounted in a periodic rectangular array.

After each micro-camera captures a digital image, the image data can then be passed to a set of electronic micro-camera (MC) control units, which may provide logic and local memory for each micro-camera. The processor of each control unit may be embedded on the same chip as a digital detector, or may be included as a separate chip or circuit. Each MC unit can then pass the image data to a computer processor, which can contain a display, a processor unit, and a computer readable medium. The computer processor may also control the patterned illumination source, and a scanning control system, which is used to digitally control the position of the scanning stage that holds the sample, or the electronic elements used to control the focus position of each micro-camera, or both the position of the scanning stage that holds the sample and the electronic elements used to control the focus position of each micro-camera. The imaging system can capture one or more images over time. Between each captured image, the computer processor can change the illumination pattern created by the patterned illumination source, and/or the position of the sample via the mechanical stage, and/or the electronic elements used to control the focus position of each micro-camera.

In some embodiments, the micro-camera array system captures a first set of images from each micro-camera in the array, uses either the MC control units or the computer processor to compute an aggregated focus metric across all micro-camera images, determines a position to move the mechanical stage, moves the mechanical stage accordingly, and captures one or more additional images from each micro-camera within the array, potentially changing the patterned illumination source between each additional image captured. After acquiring one or more images per micro-camera, the computer processor can then perform a second image post-processing step that computes the desired statistical description of the specimen of interest, which may be shown on a separate display.

In FIG. 4B, an imaging system can be configured for refocusing the camera array of the imaging system on the sample with a maximization of features of interest that are in focus. The refocusing process can also include provisions for a minimization of image data to be captured, transferred, and analyzed, such as parameters for minimizing un-analyzable image data including image areas having no features, image data having out-of-focus features after the refocusing process, and optionally image data from cameras having a significantly less features as compared to other cameras.

For example, if image data from each camera in a first group of cameras shows only no features, the cameras in the first group can be turned off or ignored.

If image data from each camera in a second group of cameras shows out-of-focus features, the cameras in this group can be turned off or ignored. The classification of out-of-focus images can be highly unreliable, and thus, the analysis can be more accurate with unreliable data removed.

If image data from each camera in a third group of cameras shows only one or two features, while other cameras show multiple detected features, such as more than 20 or more than 30, the cameras in this group can be turned off or ignored. A significant speed saving can be achieved, with only a reduction of a few percents in number of detected features.

After a refocus operation, the imaging system can be configured for recapturing newly refocused images and then analyzing re-detected features in the recaptured images. The recapture process can be configured with the data minimization characteristics obtained previously from the refocus operation to reduce the image capturing process, such as ignoring the cameras having no features, having out-of-focus features, or having too few features. The feature re-detection process can be configured with initial feature locations from the refocus operation for a faster feature detection.

The feature analysis on the recaptured images that are in focus can first include a feature classification process, which can classify the biology features into categories such as diseased or healthy. The feature analysis can further include a statistical assessment on the classification of the features, to generate a final characterization of the sample with high probability.

The operation of the imaging system can start with preparing a sample for analysis, such as a biology sample of a blood smear on a glass slide. The sample can be positioned in a sample holder of the imaging system, for a statistical analysis of the sample, such as to generate a diagnostic characterization of the sample with high probability through the observation of a large number of blood cells in the blood smear sample.

Operation 400 includes inputting features to be searched and analyzed. For example, in a blood smear sample, the features of interest can be white blood cells, and the input feature can be a white blood cell, such as an image of the white blood cell and with optionally characteristics of the while blood cell to allow the imaging system, such as a machine learning algorithm running on a data processing processor of the imaging system, to detect the presence of the white blood cells in the smear blood sample.

In some embodiments, the input can be multiple features at different focus level, such as a first image of the feature which is in focus, one or more images of the feature which are out of focus in different separation distances from the plane of focus away from the cameras, and one or more images of the feature which are out of focus in different separation distances from the plane of focus toward the cameras. The multiple focus levels can allow the imaging system, e.g., the machine learning algorithm, to determine a focus level, or focus measure, for the detected features.

In some embodiments, the features can be manually inputted, e.g., an input file containing the feature information can be supplied to the imaging system by an operator. Alternatively, for common features, the feature information can be stored in the imaging system, and the operator can simply select the desired features, among a list of features presented by the imaging system.

The imaging system can use the input features to focus the cameras of the imaging system on the features. It is an innovative feature of the present imaging system to perform image focusing on the selected features of the sample, e.g., on features of interest specified by the operator, instead of aiming to focus the cameras on the whole sample. Specifically, the focus process is configured to maximize the number of focused features, e.g., there can be features that are still out of focus after the focus process.

To start the focus process, operation 401 includes receiving captured images from the cameras. The images are configured to be non overlapping, for example, to prevent double counting of features on the sample. In some embodiments, an optional digital cropping process can be performed to crop the images to be non overlapping, for example, for an imaging system having overlapped camera setting. The optional digital cropping process can also be performed to crop the images to be non overlapping with desired gaps between the images, such as small enough gaps so that sample scanning is not required, or optimal gaps suitable for sample scanning.

Operation 402 includes detecting the features in the captured images that are non overlapped. The feature detection process can be a machine learning algorithm that is trained to detect the features. For example, the feature detection process can be a convolutional neural network that can split an image into segments, and then looking for pixel coordinates surrounding the features in the segments.

After detecting the features, operation 403 includes cropping the images around the features to form sub-images with each sub-image containing a feature.

Operation 404 includes calculating focus measures for the sub-images, for example, by applying a focus operator on the captured images. The focus operator can be based on a high pass filter image contrast, such as a Laplacian focus operator. In some embodiments, a digital focusing process can be used, in which multiple images are captured under different illumination patterns, and image depth can be calculated from the multiple images. The plane of focus can be determined as the plane having a maximum contrast. Further, in some embodiments, the pattern illumination can be used to obtain images with enhanced contrast for ease of feature detection and analysis.

Focus measures can be calculated for the detected features, and can be correlated with the feature input, for example, to determine directional focus measures, e.g., out of focus toward the cameras or away from the cameras from the focus plane.

Operation 405 includes aggregating the focus measures to obtain optimal moving distances for actuators to perform the focusing process. The actuators can be coupled to the camera array or to the sample holder to move the camera array or the sample holder in a way for perform the focus operation, e.g., to obtain a maximum number of features to be in focus.

The aggregation process is configured to maximize the number of in-focus feature sub-images, e.g., to move the actuators in appropriate or optimal distances so that a maximum number of features are to be in focus. The optimization correlates the focus measures from all sub-images to provide a collective focusing decision.

In some embodiments, the aggregation process can also include a minimization of the image data that must be imaged and processed that are not in focus, for example, to speed up the image acquisition and analysis. For example, images can be removed from cameras showing no detected features, from cameras showing out-focus features after the focus process, or from cameras showing significantly less features.

After determining the optimal moving distances for the actuators, operation 406 includes moving actuators according to moving distance to refocus. The actuators can be coupled to separate areas (such as corners) of the sample holder or the camera array to lift up, lower down, tip, tilt, curve, translate the sample or the camera array, respectively, or up/down focus of individual cameras.

After the focusing process, operation 407 includes re-capturing images, e.g., capturing new images, from the cameras. The newly captured images are already configured for maximizing the number of focused features, as determined by the focus operation.

In some embodiments, the newly captured images can be from a subset of the camera array, e.g., some cameras of the camera array can be turned off, for example, from the determination of the focus process, for cameras showing no detected features, for cameras showing out-focus features after the focus process, or for cameras showing significantly less features.

In some embodiments, the newly captured images can include multiple images per camera, such as k images per camera for k illumination patterns. For example, after the focus operation, there can be multiple new images captured per camera, e.g., a new image is captured by a camera under a particular illumination pattern, for a total of k new images captured by a camera under k different illumination patterns.

After capturing images from the refocused camera array, the image data can be analyzed to obtain a statistical measure of one or more features of interest within the sample, for example, the number of white blood cells that show an indication of a particular disease. In some embodiments, the image data to be analyzed can be more than new images captured by the cameras after the focus operation, for example, the images captured earlier in the determination of the focus operation can be added to the analysis.

The analysis can start with operation 408 for re-detecting the features in the newly captured images, and operation 409 for re-cropping to form sub-images with each sub-image containing a feature, followed by operation 410 for analyzing the sub-images.

In some embodiments, the analysis can include a classification of the features, for example, into categories of diseased or healthy, followed by a statistical combination of the feature categories to obtain a summarized diagnostic characteristic of the sample.

Operation 410A includes classifying the features into categories, such as diseased or healthy, using a machine learning algorithm trained to recognize the detected features, for example, by comparing with past learned data. In some embodiments, the classification can include more than one stage classification, for example, a first stage to put the features into different groups, and a second stage to classify the features in each group separately. The multiple stage classification can improve the accuracy of the classification, for example, by using different algorithms in the second stage for different groups separated by the first stage.

Operation 410B includes statistically assessing the classified categories, such as calculating a mean, a median, or a mode of the feature categories, or to use a machine learning approach for a statistical solution.

In some embodiments, the image analysis, including the classification of features and the statistical summary of the classified categories, can be improved by a phase gradient imaging or an enhanced contrast approach by using optimized pattern illumination.

Figure 5A:
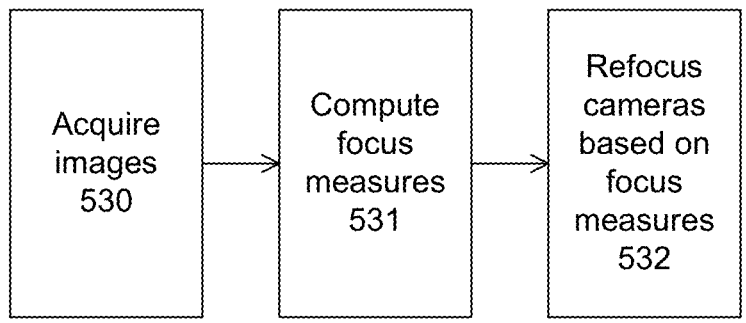
FIGS. 5A-5C illustrate general process operations of an imaging system according to some embodiments.
Figure 5B:
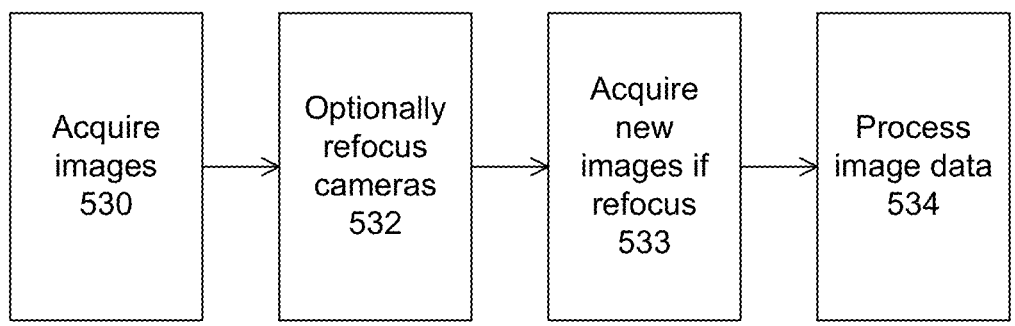
Figure 5C:
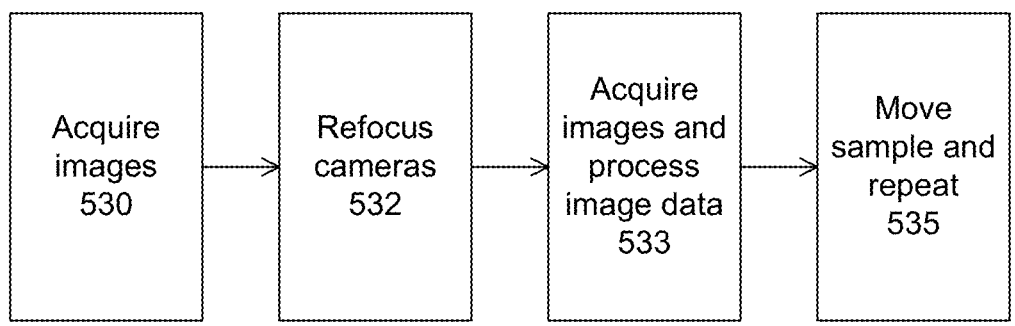

FIGS. 5A-5C illustrate general process operations of an imaging system according to some embodiments. The image system is operated to maximize the areas containing features of interest. For example, a feature of interest can be inputted to the imaging system, such as specifying that the feature of interest is a type of white blood cell for a blood smear sample placed on the sample holder of the imaging system.

In FIG. 5A, operation 530 acquires images captured by the cameras in a camera array of an imaging system. The images can be processed to detect features of interest, based on an input identifying the features of interest. Sub-images can be cropped from the images so that each sub-image contains a feature of interest.

Operation 531 computes focus measures for the sub-images. An optimization process can be performed based on the focus measures to obtain focus distances of actuators of a moving mechanism configured to move the sample, the camera array, or the optical elements of individual cameras to account for sample position, tip/tilt, or curve. The optimization can be configured to maximize a number of in focus features of interest, e.g., to obtain a largest number of focused sub-images after moving the actuators according to the focus distances.

In some embodiments, the optimization can be performed to for obtaining focus for a largest number of features areas, e.g., for putting the most number of feature areas within a range of focus. The optimization does not concern with other sample areas, e.g., sample areas having no features of interest. Further, the optimization can leave a small number of feature areas out of focus, in order to generate a largest number of in-focus feature areas. The no-feature areas and the out-of-focus feature areas, after the optimization, can be marked so that image data for these areas can be ignored or removed from being transferred to and from being analyzed by a post-processing unit.

For example, if a large number of features are clustered in a vicinity of an area of the sample, with a few features scattered around the sample edge, the optimization can provide a curving of the sample with the concave or convex center being the center of where the features are clustered. The surrounding areas of the sample can be out of focus, including the few edge features. The surrounding image areas can be ignored in the data analysis, to provide a rapid processing of the sample.

Operation 532 refocuses the cameras based on the focus measures, e.g., moving the actuators according to the focus distances resulted from the optimization of focused features.

In FIG. 5B, operation 530 acquires images captured by the cameras in a camera array of an imaging system. The images can be processed to detect features of interest, based on an input identifying the features of interest. Sub-images can be cropped from the images so that each sub-image contains a feature of interest. The sub-images can optionally be used to compute focus measures. An optimization process can be performed to maximize a number of in focus features of interest. The cameras can be refocused based on the optimization of movements of actuators according to optimized focus distances.

Operation 533 acquires new images, e.g., the images that have the features in focus due to the optimized movements of the cameras, the camera array, or the sample holder. New sub-images can be cropped from the new images, with each new sub-image containing a feature of interest. The newly feature-focused sub-images can be sent to a post-processing unit for analysis. Image areas having no feature of interest can be ignored, e.g., not being sent. In addition, sub-images having the features not in focus after the optimization can also be ignored.

Operation 534 processes the newly feature-focused sub-images, for example, to classify the feature in each sub-image such as healthy, diseased, borderline, or unknown. The classification from the features in the sub-images can be statistically analyzed to provide a final decision of the status of the sample with a high probability.

In FIG. 5C, operation 530 acquires images captured by the cameras in a camera array of an imaging system. Operation 532 refocuses the cameras based on focus measures calculated from feature areas detected from the captured images.

Operation 533 acquires new images, e.g., the images that have the features in focus due to the optimized movements of the cameras, the camera array, or the sample holder. The new images can be processed, e.g., to classify the feature in each sub-image for a statistical analysis of the status of the sample.

Operation 535 optionally performs a scan of the sample to repeat the statistical analysis at different image areas of the sample. For example, the sample can be moved a discrete step, and the process of image capture, focus measure calculation, image refocus, and image data classification and analysis is performed at the new sample position.

Non Overlapping Imaging

In some embodiments, aggregate statistics sampled from different regions of a specimen can be used to characterize the status of the specimen, such as a specimen diseased classification can be determined by a large number of diseased blood cells in the specimen. The aggregate statistics can be analyzed from specimen regions that do not necessarily connect spatially to each other, e.g., it can be not necessary to image the whole sample area to perform the aggregate statistics.

In some embodiments, the imaging system can be configured to generate non-overlapping images of different regions of a sample, for example, for counting blood cells, for identifying diseased or healthy cells, and for detecting infection from the examination of the blood cells. The gap between images captured by adjacent cameras can be small, such as smaller than the field of view of the cameras, and can be configured not to miss too many features of interest. For example, the gaps can be smaller than a dimension of the features of interest, so that no features of interest can be missed in the image capture process, since at least a portion of the feature at the gap can be captured by a neighbor camera.

In some embodiments, a sample scanning process can be used to completely characterize the sample, such as to completely counting the features of interest in the sample. For example, the gap between two adjacent cameras can have a similar dimension as the field of view of the cameras. After capturing and analyzing a first set of images captured by the cameras, the sample stage can advance, for example, sequentially in x and y directions, a scanning step for the cameras to capture images at the gap areas. The captured images are then analyzed.

Figure 6A:
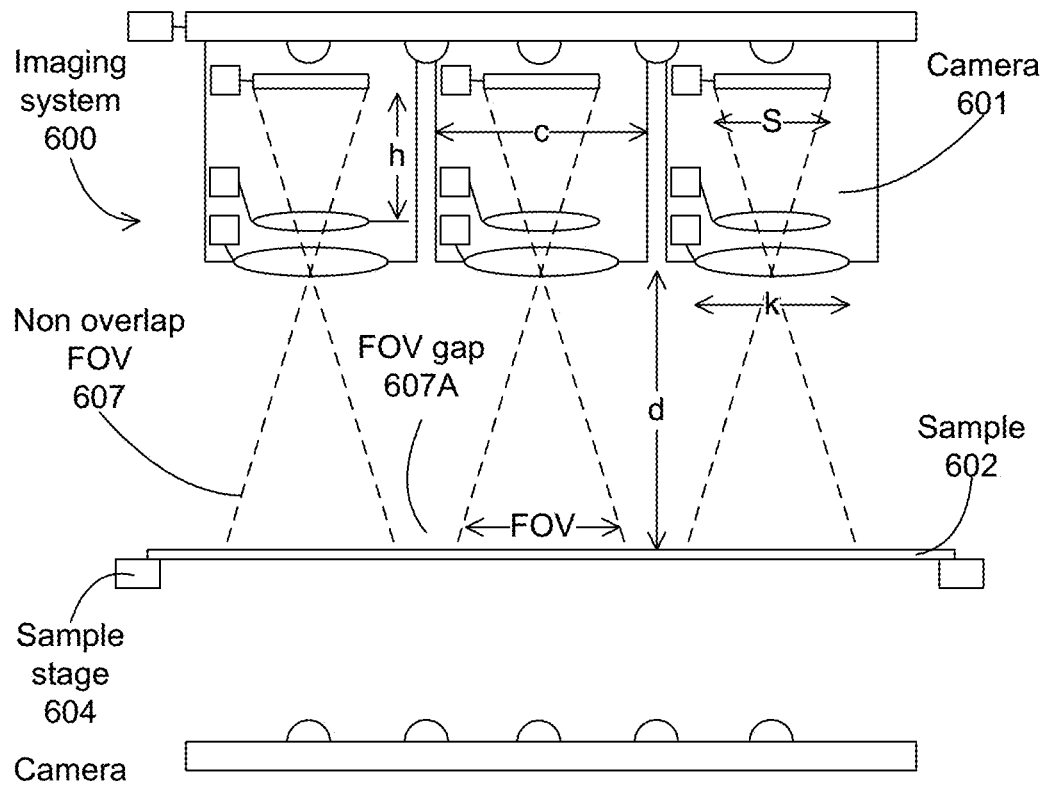
FIGS. 6A-6B illustrate imaging systems with non overlapping images according to some embodiments.
Figure 6B:
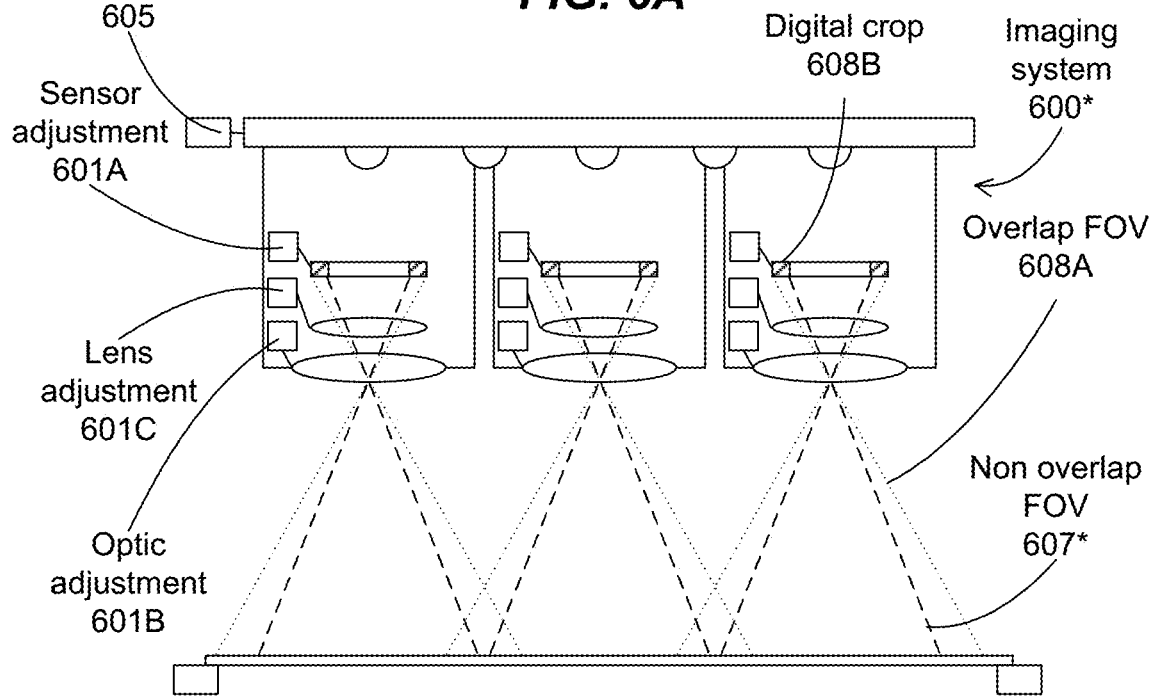

FIGS. 6A-6B illustrate imaging systems with non overlapping images according to some embodiments. In some embodiments, the imaging system can be configured to image non-overlapping fields-of-view of the sample, e.g., the cameras of the imaging system can be configured to capture non overlapping images of the sample, to collect a set of non overlapped images captured by the cameras.

FIG. 6A shows an imaging system 600 with the cameras 601 having non overlapping field of view 607 on the sample 602. There is a gap 607A between the fields of views 607. Each camera can include an image sensor, an optical assembly and a lens. The cameras can have a dimension c, and can be separated from each other by a small gap, or can be contacting each other. The image sensor can have a dimension S, and can be separated by the lens at a distance h. The optical assembly can include a focus lens having a dimension k. The cameras can be spaced a distance d from the sample.

The camera array can be coupled to a camera stage 605, which can have a moving mechanism for moving the camera array. The sample can be disposed on a sample holder 604, which can have another moving mechanism for moving the sample. The individual cameras can each have a sensor adjustment 601A for moving the image sensor, an optical adjustment 601B for moving the optical assembly, and a lens adjustment 601C for moving the lens. The elements of the individual cameras can be adjusted, such as moving the image sensor back, e.g., increasing the dimension h, until the captured images are non overlapped images.

In some embodiments, the imaging system can be configured to generate non-overlapping images by imaging overlapping fields-of-view of the sample, together with a cropping process of the captured image. Thus, the non overlapping images can be generated by a data processing step on overlapping or non overlapping images captured by the cameras.

FIG. 6B shows an imaging system 600* with the cameras 601 having overlapping field of view 608A, for example, by the image sensor closer to the optical assembly. The cameras can have a digital crop module 608B or algorithm, to reduce the dimension of the captured images until they are non overlapping 607*. The digital crop module can incorporated in the camera controller, which can remove edge portions of the captured images.

Figure 7A:
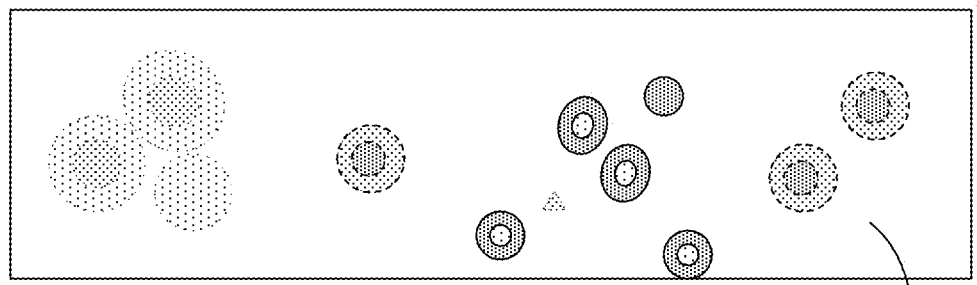
FIGS. 7A-7C illustrate an imaging system with non overlapping field of views according to some embodiments.
Figure 7B:
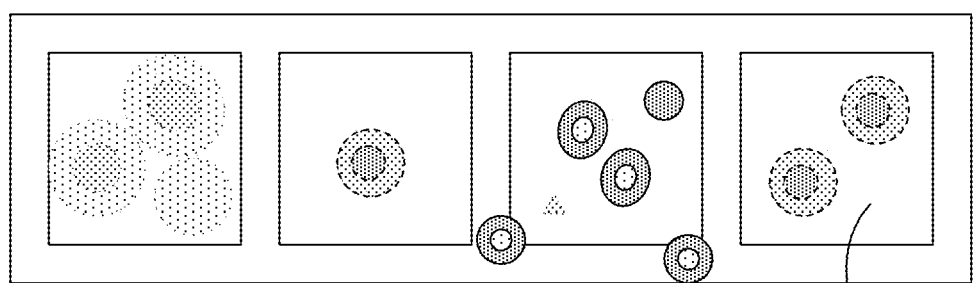
Figure 7C:
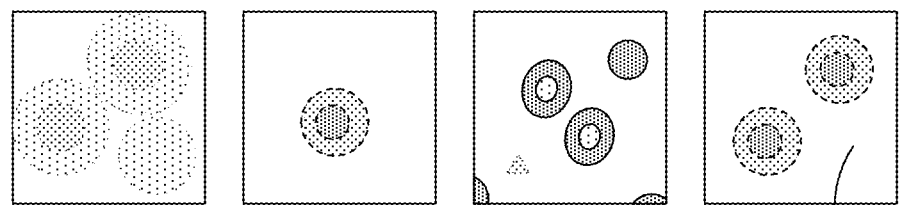

FIGS. 7A-7C illustrate an imaging system with non overlapping field of views according to some embodiments. FIG. 7A shows a sample 702. FIG. 7B shows multiple fields of views 715 from the cameras, with the field of views not overlapped with each other. FIG. 7C shows the non overlapped image 716 of the sample 702.

FIGS. 8A-8D illustrate an imaging system with non overlapping images reduced from overlapping field of views according to some embodiments. FIG. 8A shows a sample 802. FIG. 8B shows multiple fields of views 815* from the cameras, with the field of views overlapped with each other. FIG. 8C shows the non overlapped images 816, which are processed from the overlapped fields of view images 815*, for example, by removing the edge pixels. FIG. 8D shows the non overlapped image 816 of the sample 802, with the non overlapping images digitally cropped from the overlapped captured images 815*.

Feature Detection

Figure 9:
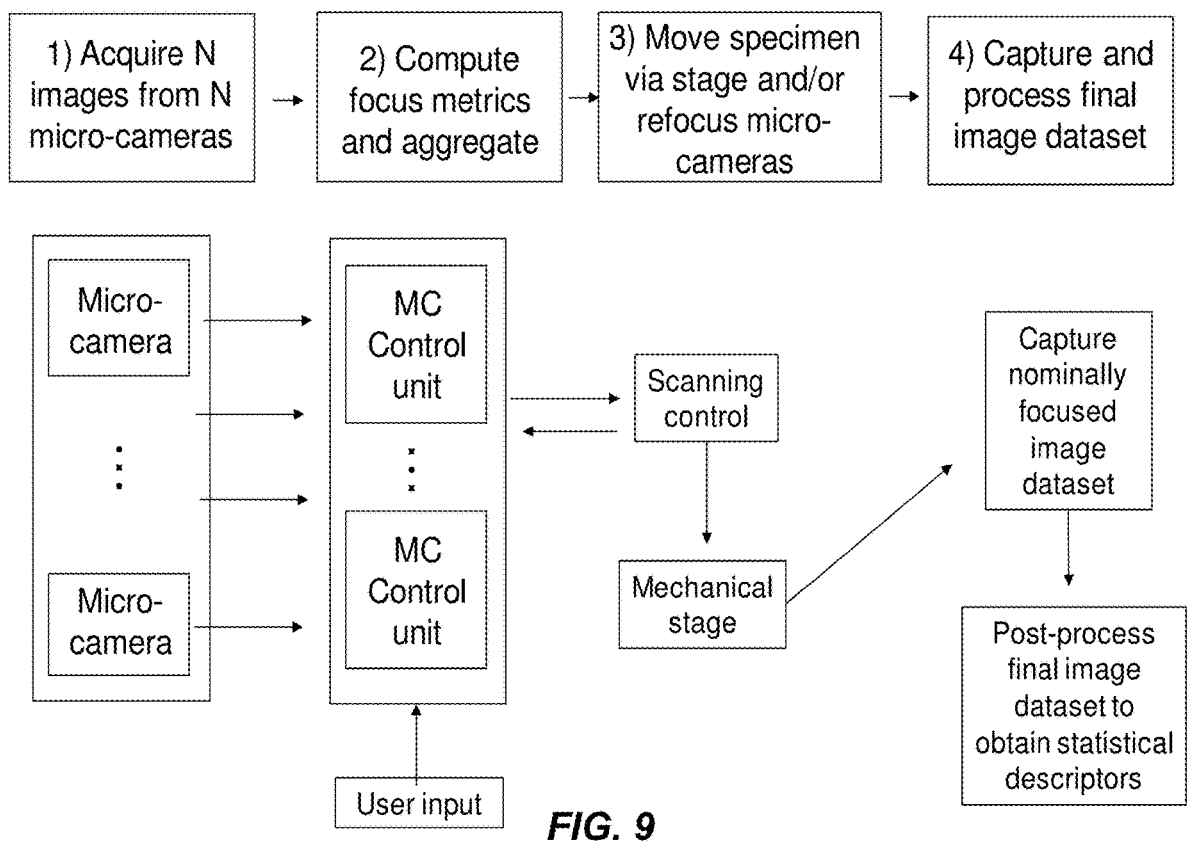
FIG. 9 illustrates a general workflow of the focus aggregation strategy according to some embodiments.

FIG. 9 illustrates a general workflow of the focus aggregation strategy according to some embodiments. The image system is operated to identify areas containing features of interest. For example, a feature of interest can be inputted to the imaging system, and the captured images are processed to detect the features to form sub-images containing the features.

In some embodiments, the imaging system will position a sample beneath the micro-camera array and a set of N images will be acquired and digitally saved—one from each micro-camera. These image snapshots are then passed to the MC Control unit for computational processing to determine an aggregate focus metric for a specific feature of interest.

In some embodiments, this feature of interest is given via user input through the computational interface. For example, the user input could be that the feature of interest is white blood cells, in which case the aggregate focus metric is determined for only white blood cells across the imaging FOV. Given an input feature of interest such as above, the aggregate focus measure can then be determined as followed.

In a first step, a feature detection step is applied to each of the N micro-camera images, in which the computational processing unit searches across each image for the user input feature of interest. This process can be implemented with one of multiple strategies, such as a scale-invariant feature detection approach, or a convolutional neural network for object detection. The output of the feature detection step is a set of Z locations and bounding box lengths (e.g., 4 numbers, including the coordinates of the bounding box center and the two bounding box side lengths), such that each bounding box surrounds each feature of interest, for all of the micro-camera images.

For example, the images captured by the cameras can be split into multiple smaller segments. Each segment can then pass through a feature or object detection process or algorithm, such as a supervised machine learning algorithm, such as a deep neural network that has been trained with prior acquired data for the object detection task. The supervised machine learning algorithm for object detection can be pre-trained for the task of finding the pixel coordinates surrounding the features of interest in the sample, such as finding pixel coordinates surrounding white blood cells and other non-red blood cell material within thin blood smears. The object detection can generate a set of pixel coordinates and box sizes.

In some embodiments, the object detection process can include rejecting detected objects that are not brought into sharp focus. In addition, image data captured through multiple illumination patterns or through optimized illumination patterns, as disclosed above, can be used to improve the contrast or to obtain detail surface topology of the detected features. Image data under pattern illuminations can be used in the supervised machine learning network to increase the accuracy of object detection for features of interest.

In a second step, each feature of interest from all of the micro-cameras is then cropped out of the images, to create Z different sub-images of the feature of interest. For example, each image area that has been identified as containing a feature of interest is cropped into one or more cropped segments, with each cropped segment corresponding to a feature of interest. These cropped segments from across the entire nominally focused image dataset then can be placed in a 3D data matrix, whose dimensions are (x,y,z), where (x,y) are the 2D spatial image coordinates and the data matrix contains each cropped example along the third dimension, for z=1 to z=Z total cropped examples, if the utilized cropping coordinates are the same across all cropped examples. Alternatively, they may be stored in a 3D struct or other type of unsorted list.

In a third step, a focus measure can be performed for each feature of interest, e.g., for each cropped image containing a feature of interest. The focus measure can be related to the contrast of the image, since an image with high contrast can be considered as in focus. A focus operator, which can determine a contrast of the image, can be applied to the image to obtain the focus measure.

In some embodiments, the focus operator can be a Laplacian operator, which can be applied to each of the Z cropped micro-camera sub-images. The magnitude of the Laplacian is computed for each sub-image and then is divided by the mean Laplacian magnitude computed across all Z sub-images to obtain an approximate measure of image focus per sub-image.

In a fourth step, an average focus setting is then computed per micro-camera, by averaging the image focus measures of the sub-images for the micro-camera.

In a fifth step, an aggregate focus metric is then determined by maximizing the number of in-focus sub-images from the images captured by the micro-cameras in the camera array. The maximization of sub-images can generate a largest number of features that are in focus during the image capture process. The aggregate focus metric can be determined by minimizing the amount of required image data that must be imaged and processed that is not in-focus. The minimization of out of focus image data can limit the amount of resource needed by the data processing unit in processing irrelevant image data, e.g., image data that does not contain a feature of interest or contain out of focus features of interest.

This maximization/minimization problem can be solved, for example, by establishing a positive reward term that is proportional to the product of the number of sub-images and their image focus measure per micro-camera, and a negative penalty term that is proportional to the number on non-sub-image pixels whose focus measure falls within some threshold focus within each micro-camera. The goal in this step is to determine a sub-set of micro-cameras from which it is most beneficial to obtain additional image data from, to then refocus the sample and/or micro-camera array and/or its optical elements to maximize the focus metric across this sub-set of micro-cameras.

In a sixth step, if one or more micro-cameras within the array exhibit significantly fewer features of interest than other micro-cameras of interest, such as 2×, 5×, or 10× less, then these micro-cameras can be ignored (i.e., turned off) when additional captures are acquired to form the new focused image dataset.

In a seventh step, the aggregate focus metric is used to determine the mechanical movement of one or more actuators that control the location and tip/tilt and curvature of the specimen along the optical axis. For example, with 4 actuators to control the sample's position along the 4 corners of a specimen slide, the aggregate focus metric in can be used to determine 4 mechanical translation distances for each of the actuators to bring the specimen into focus. Alternatively, the actuators can be coupled to the camera array to move the micro-camera array at multiple areas.

In an eighth step, after the mechanical movements via the actuators have been applied, a second image acquisition is acquired with the features of interest now in sharp focus. These features of interest are cropped once again and then sent to a computational post-processing unit for statistical analysis.

Figure 10A:
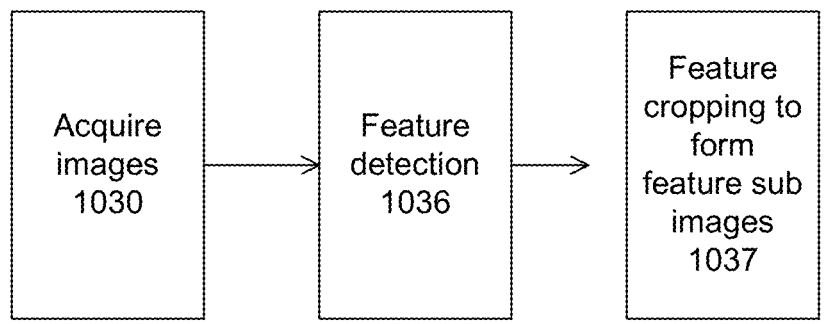
FIGS. 10A-10C illustrate operations for detecting features in an imaging system according to some embodiments.
Figure 10B:
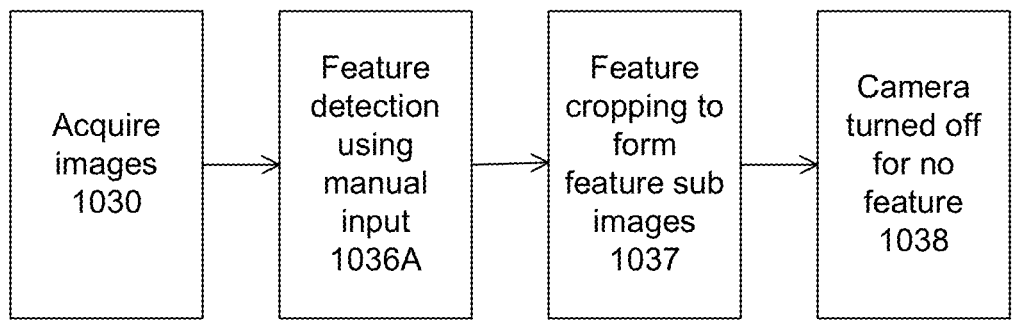
Figure 10C:
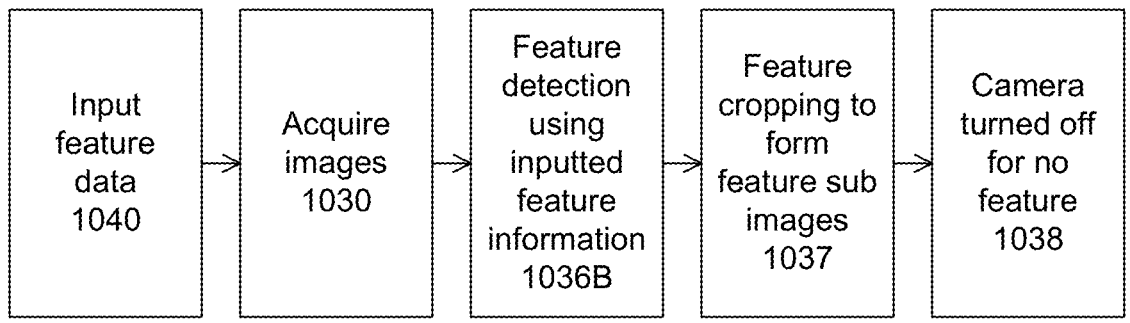

FIGS. 10A-10C illustrate operations for detecting features in an imaging system according to some embodiments. In FIG. 10A, operation 1030 acquires images captured by the cameras in a camera array of an imaging system. Operation 1036 detects features of interest on the captured images. Operation 1037 crops the captured images to form sub-images, with each sub-image containing a feature of interest.

In FIG. 10B, operation 1030 acquires images captured by the cameras in a camera array of an imaging system. Operation 1036A detects features of interest on the captured images, based on an input identifying the features of interest that is manually entered by an operator. Operation 1037 crops the captured images to form sub-images, with each sub-image containing a feature of interest. Operation 1038 turns off images for cameras observing no features of interest.

In FIG. 10C, operation 1040 inputs feature data to be detected to an imaging system. Operation 1030 acquires images captured by the cameras in a camera array of the imaging system. Operation 1036B detects features of interest on the captured images, based on feature data input. Operation 1037 crops the captured images to form sub-images, with each sub-image containing a feature of interest. Operation 1038 turns off images for cameras observing no features of interest.

FIGS. 11A-11C illustrate a schematic process for detecting features according to some embodiments. In the feature detection process 1141, an image 1115 can be processed to detect feature areas 1141A, 1141B, and 1141C. The feature areas 1141A, 1141B, and 1141C are locations in the image 1115 that can allow identification even when the image is shifted, rotated, or enlarged, e.g., the feature areas are the locations on the image that are at least invariant to location, orientation, and scale.

A feature element can include multiple pixels or points on the image. For example, area 1141A can be processed 1136 to generate feature element 1141A*, which include multiple points. Thus, the feature detection process can produce locations of points of the features. After the detection of feature elements, e.g., finding locations of points on the image that are invariant to location, orientation, and scale, the feature elements are further processed to generate features, which can be a combination of the feature elements, A feature is generally invariant to scale and orientation. For example, a feature can include orientation to allow matching with an input feature in another image through a rotation process.

A general and basic approach to finding features is to first find unique feature elements, such as finding the pixel coordinates surrounding the feature in the image. The feature then can be identified as a set of pixel coordinates and box sizes surrounding the feature. For example, the feature detection can look for areas of an image that contain high amounts of information that are likely to contain the features of interest.

In some embodiments, the feature description includes at least a controlled variation in sample illumination, for example, using multiple illumination patterns with each pattern resulting in an image of the sample. With multiple illumination patterns, standard bright field images can be converted into phase-contrast type images or dark field images by having illumination patterns with different incident illumination angles, which can reverse the intensity relationship between the specimen and the background.

FIGS. 12A-12E illustrate an example of a feature detection process according to some embodiments. The focusing process relies on obtaining focus measures of feature areas, and then correlating the focus measures between the cameras in the camera array. For example, the image data from different micro-cameras, with each micro-camera observing a unique and non-overlapping area of the sample, is combined and correlated in such a way that the relative focus of each micro-camera can be compared to the focus of one or more of the other micro-cameras within the array.

Figure 12A:
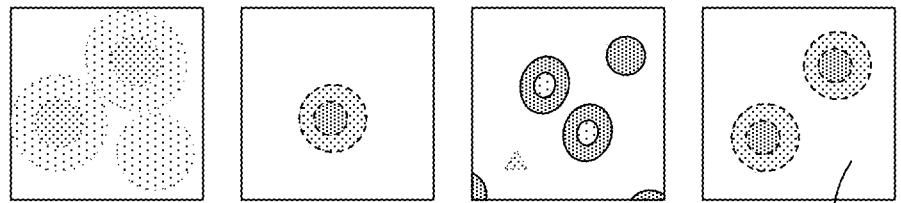
FIGS. 12A-12E illustrate an example of a feature detection process according to some embodiments.
Figure 12B:
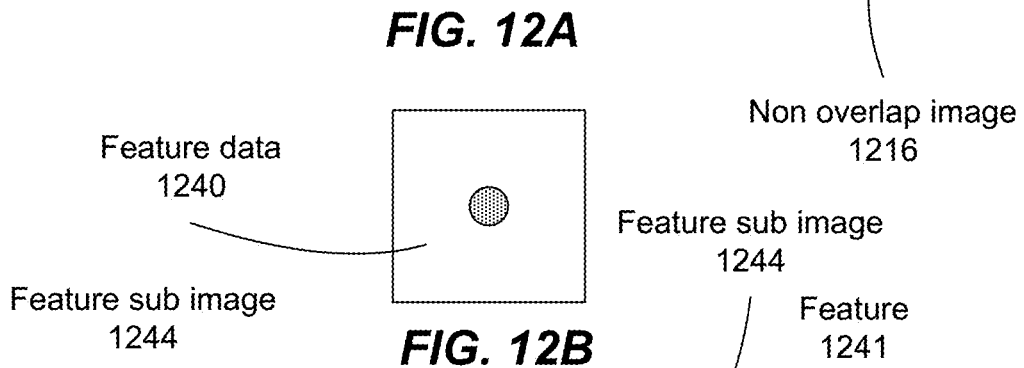

FIG. 12A shows an array of 4 micro-cameras, although in practice more micro-cameras can be used within a 2D array. A first snapshot by each micro-camera yields different non overlapping images 1216, which can be in focus or out-of-focus. For example, images of a blood smear sample can be captured, in which the larger features are blood cells and the small features are platelets. The user input in this scenario is a feature 1240 that is indicative of platelets (FIG. 12B). The input feature 1240 can include feature information that can enable the imaging processing unit to detect the feature in the images captured by the cameras. In some embodiments, the input feature can include feature information that is both in-focus and out-of-focus, to enable the system to find both in-focus and out-of-focus feature information from the captured images.

Figure 12C:
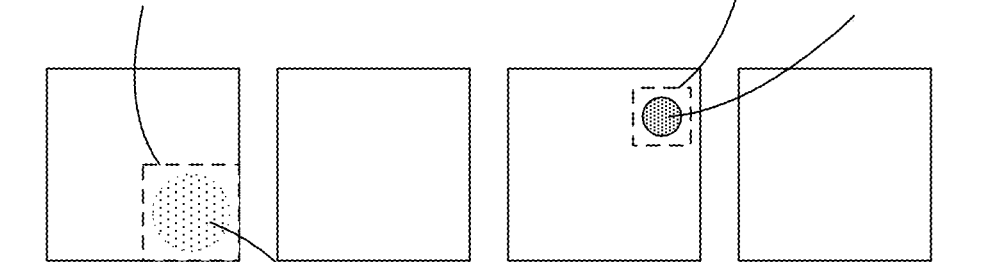

Using the input feature 1240, a feature detection process is applied to the captured images 1216 to detect features. For example, a feature is found in the first and third images, and not in the second and fourth image (FIG. 12C).

Figure 12D:
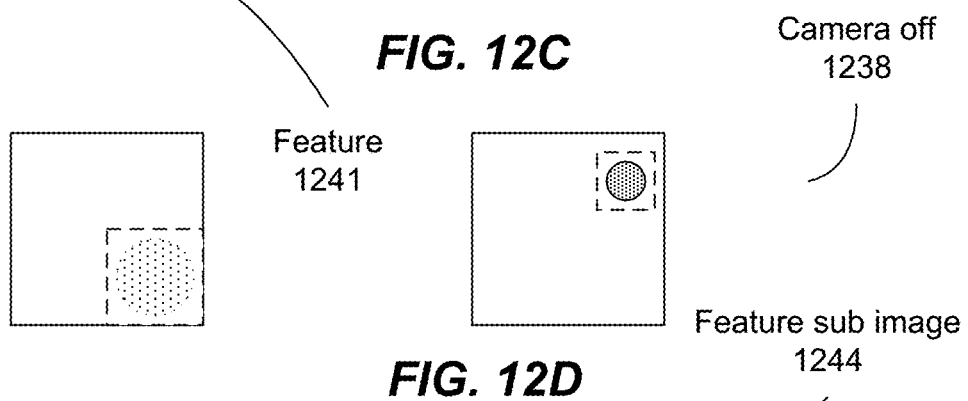

In addition, since the images from the second and fourth images do not contain any features of interest, the image data can be "turned off" or de-selected and not used for the remainder of the data capture process. This can save data capture and processing time, among other advantages such as power and memory savings, which can be significant when there are multiple micro-cameras within a typical large micro-camera array (FIG. 12D).

In some embodiments, feature detection information is shared across micro-camera processors to perform this de-selection process. For example, third image data can be used to turn image capture and data off from the fourth camera, since the image data from the third camera can be used to conjecture that additional feature information is absent from the specimen region that lies between the third and fourth cameras.

Figure 12E:
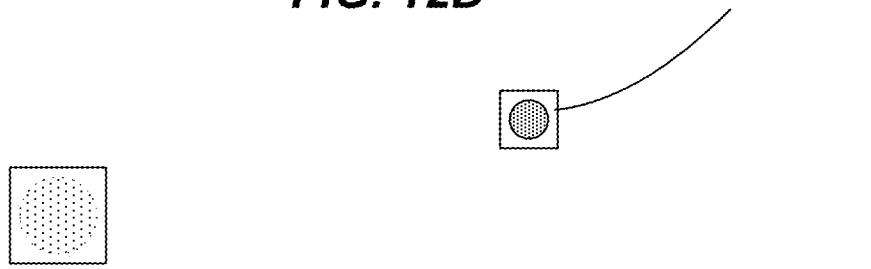

The detected features can be cropped from the captured images to form a set of feature sub-images 1244, with each feature sub-image containing a feature of interest, which in this case being a platelet as inputted (FIG. 12E).

Figure 13A:
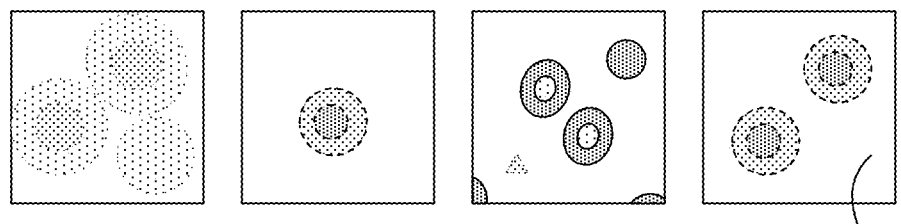
FIGS. 13A-13D illustrate another example of a feature detection process according to some embodiments.
Figure 13B:
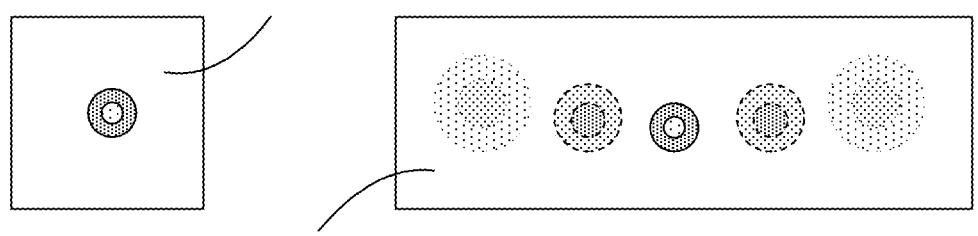

FIGS. 13A-13D illustrate another example of a feature detection process according to some embodiments. FIG. 13A shows an array of 4 micro-cameras, with a first snapshot by each micro-camera yields different non overlapping images 1316. The user input in this scenario is a feature 1340 that is indicative of red blood cell. The input feature 1340 can include feature information that can enable the imaging processing unit to detect the feature in the images captured by the cameras (FIG. 13B(a)). In some embodiments, the input feature can include feature information 1340\* that is both in-focus and out-of-focus, to enable the system to find both in-focus and out-of-focus feature information from the captured images (FIG. 13B(b)).

Figure 13C:
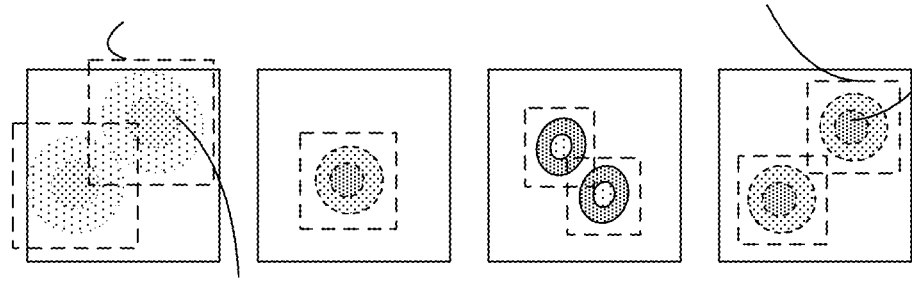

Using the input feature 1340, a feature detection process is applied to the captured images 1316 to detect features 1341. For example, two features are found in the first image, one feature in the second image, two features in the third image, and two features in the fourth image (FIG. 13C).

Figure 13D:
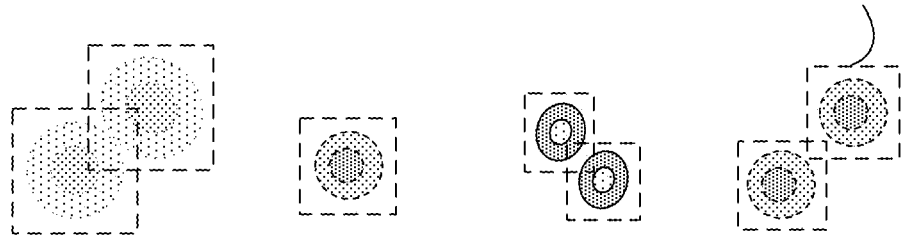

The detected features can be cropped from the captured images to form a set of feature sub-images 1344, with each feature sub-image containing a feature of interest, which in this case being a red blood cell as inputted (FIG. 13D).

Focus Measures

In some embodiments, the imaging system is configured to automatically refocus on detected features. Thus, feature sub-images are formed by detecting features from the images captured by the cameras in the imaging system, and then cropped so that each feature sub-image containing a feature. The refocus process can rely on focus measures of the sub-images, e.g., the focus measures of the sub-images are calculated and then correlated to focus distances to bring the sub-images into sharp focus.

A sharp focused image is expected to have sharp edges, so image gradients in the sub-images can be used to provide a reliable focus measure. For example, the focus measure can pool image gradient data at each point to a unique value. Further, second derivatives can be used for passing the high spatial frequencies, which are associated with sharp edges. Thus, a second derivative focus operator can be a Laplacian operator. Other focus operators can be used.

In some embodiments, a Laplacian operator can be applied to each of the cropped sub-images. The magnitude of the Laplacian is computed for each and then is divided by the mean Laplacian magnitude computed across all sub-images to obtain an approximate measure of image focus per sub-image. The higher the value of the Laplacian, the sharper focus is the sub-image. An average focus setting can be computed for each micro-camera by averaging the focus measures of the sub-images from the micro-camera.

In some embodiments, the average focus setting for each camera can be used to perform focus on the individual camera, for example, by adjusting the image sensor or the optical assembly of the individual camera.

In some embodiments, an aggregate focus metric can be calculated from the average focus settings of all cameras. The calculation can be optimization process, configured to maximize the feature sub-images that are in focus, and to minimize the non feature image areas and the feature sub-images that are not in focus. This optimization, e.g., maximization and minimization, problem can be solved, for example, by establishing a positive reward term that is proportional to the product of the number of sub-images and their image focus measure per micro-camera, and a negative penalty term that is proportional to the number on non-sub-image pixels whose focus measure falls within some threshold focus within each micro-camera. The goal in this step is to determine a sub-set of micro-cameras that can be most beneficial in the characterization of the sample, for example, in the diagnostic analysis. The sub-set of micro-cameras can be refocused, for example, by moving the sample holder or the camera array or the elements of the individual cameras.

After the optimization, the sub-set of cameras can be in sharp focus, while other cameras can be out of focus. The out-of-focus cameras can be ignored (e.g., turned off) when additional captures are acquired to form the focused image dataset. In addition, if one or more in focus micro-cameras exhibit significantly fewer features of interest, then these micro-cameras can also be ignored.

Figure 14A:
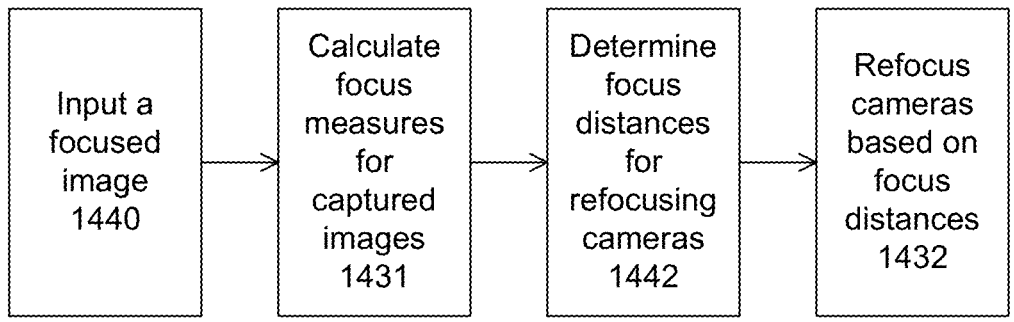
FIGS. 14A-14C illustrate operations for calculating focus measures of a sample in an imaging system according to some embodiments.
Figure 14B:
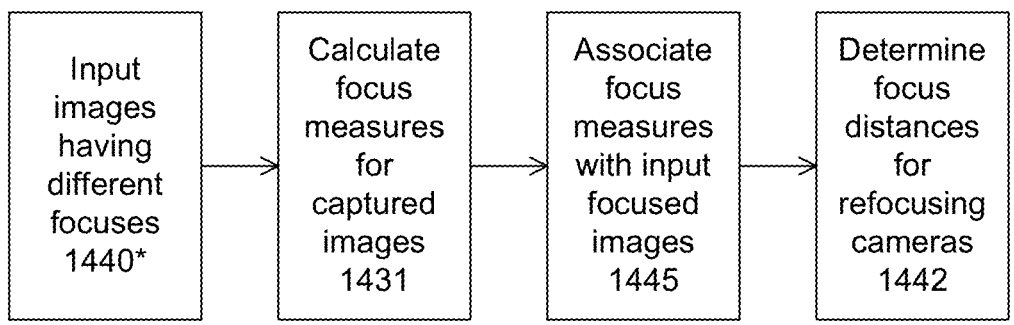
Figure 14C:
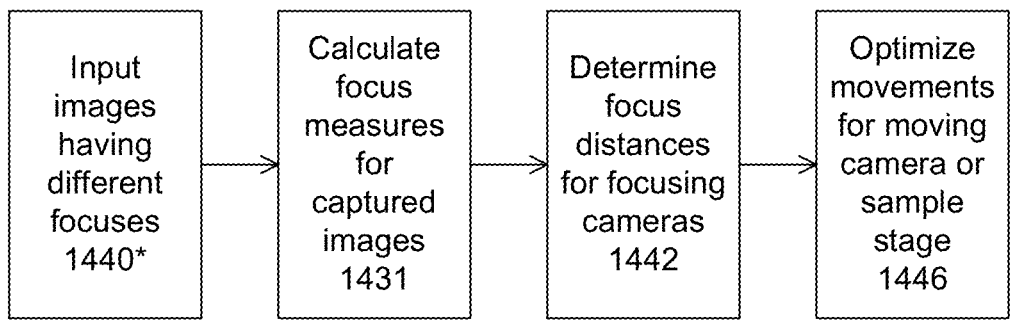

FIGS. 14A-14C illustrate operations for calculating focus measures of a sample in an imaging system according to some embodiments. In FIG. 14A, operation 1440 inputs feature data to be detected to an imaging system. The cameras of the imaging system can capture images, and process the images to form feature sub-images with each sub-image containing a feature of interest. Operation 1431 calculates focus measures for the feature sub-images. Operation 1442 determines focus distances for the camera array or for the sample, based on the focus measures, using an optimization process to maximize the focused feature sub-images and to minimize non focused feature sub-images and non feature areas. Operation 1432 refocuses the individual cameras, the camera array, or the sample based on the focus distances.

In FIG. 14B, operation 1440* inputs feature data with different focuses to an imaging system. Operation 1431 calculates focus measures for the feature sub-images. Operation 1445 associates the focus measures with the input feature data having different focuses. Operation 1445 determines focus distances for refocus.

In FIG. 14B, operation 1440* inputs feature data with different focuses to an imaging system. Operation 1431 calculates focus measures for the feature sub-images. Operation 1442 determines focus distances for the camera array or for the sample, based on the focus measures. Operation 1446 optimizes movements for moving the cameras, the camera array, or the sample stage.

FIGS. 15A-15C illustrate focus measures resulting from a focus operator operating on multiple focus levels in an input according to some embodiments. FIG. 15A shows an feature input with different focused images, including an in focus feature input 1540, a positive out of focus feature input 1540+, a positive more out of focus feature input 1540++, a negative out of focus feature input 1540-, a negative more out of focus feature input 1540--. The input information can also be represented by the focus measures, such as an in focus measure 1553, a positive out-of-focus focus measure 1553+, a positive more out-of-focus focus measure 1540++, a negative out-of-focus focus measure 1553-, a negative out-of-focus focus measure 1553--. In some embodiments, the input focus measures 1553 can be determined from the feature input 1540, for example, by applying a focus operator on the feature input.

FIG. 15B shows a Laplacian focus operator, e.g., a 3×3 matrix mask for determining a focus measure of an image, for example, by a convolutional process. Other focus operator can be used, such as a negative Laplacian operator, or a 5×5 Laplacian operator.

FIG. 15C shows focus measures 1553, 1553+, 1553++, 1553-, 1553-- with directions, e.g., out of focus away from the in focus plane or out of focus toward the image sensor from the in focus plane. The focus measures 1552, 1552-, 1552-- from the out of focus images can be non directional, e.g., the images can be blurred by being away from the focus plane either toward to or away from the image sensor. By correlating with the known directional out of focus input feature, the focus measure can be directional, e.g., a direction focus 1545 can be convert the out of focus in the correct directions.

FIGS. 16A-16C illustrate focus measures resulting from a focus operator operating on multiple feature areas in a sample according to some embodiments. FIG. 16A shows a set of feature sub-images 1644, detected from images captured by the cameras of an imaging system. FIG. 16B shows a Laplacian focus operator, e.g., a 3×3 matrix mask for determining a focus measure of an image. FIG. 16C shows focus measures 1652, 1652- obtained from the focus operator applied on the feature sub-images. The focus measures from the out of focus images can be non directional.

FIGS. 17A-17D illustrate focus measures of features areas in a sample correlated to input focus levels according to some embodiments. FIG. 17A shows an feature input with different focused images, including an in focus feature input 1740, a positive out of focus feature input 1740+, a positive more out of focus feature input 1740++, a negative out of focus feature input 1740-, a negative more out of focus feature input 1740--.

FIG. 17B shows a set of feature sub-images 1744, detected from images captured by the cameras of an imaging system. FIG. 17C shows a Laplacian focus operator, e.g., a 3×3 matrix mask for determining a focus measure of an image.

FIG. 17D shows focus measures 1753, 1753+, 1753++, 1753-, 1753-- with directions, e.g., out of focus away from the in focus plane or out of focus toward the image sensor from the in focus plane. The focus measures 1752, 1752-, 1752-- from the out of focus images can be non directional, e.g., the images can be blurred by being away from the focus plane either toward to or away from the image sensor. By correlating with the known directional out of focus input feature, the focus measure can be directional, e.g., a direction focus 1745 can be convert the out of focus in the correct directions.

Refocus Process for Individual Cameras

After calculating the focus distances for the refocus process, the imaging system can be automatically refocused, for example, by adjusting elements of the individual cameras, such as adjusting the image sensor, the optical assembly, or the lens of the cameras requiring to be refocused.

Figure 18:
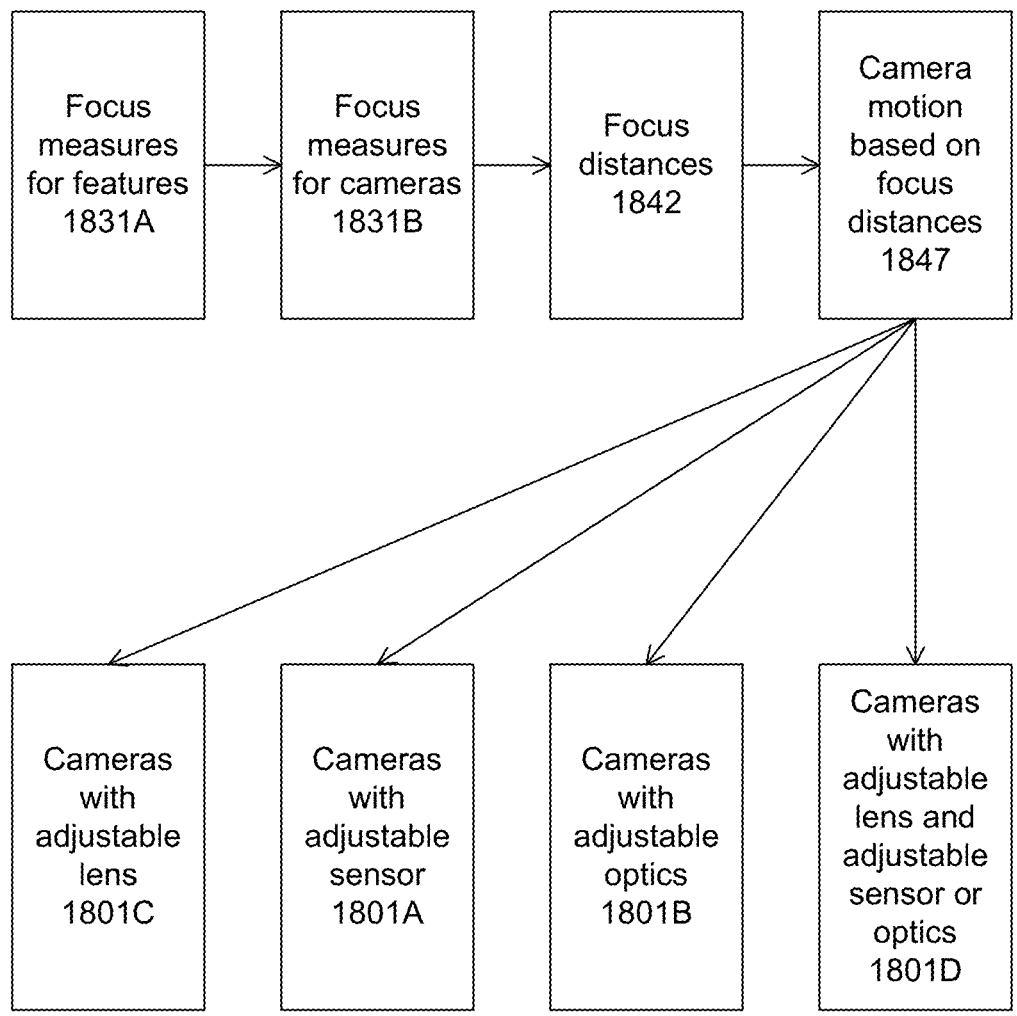
FIG. 18 illustrates operations for refocusing on a sample in an imaging system by individual cameras according to some embodiments.

FIG. 18 illustrates operations for refocusing on a sample in an imaging system by individual cameras according to some embodiments. Operation 1831A calculates focus measures for the feature sub-images. Operation 1831B calculates focus measures for the individual cameras, based on the focus measures of the sub-images of the cameras. Operation 1842 determines focus distances for the individual cameras, based on the focus measures. The focus distance can be used to adjust adjustable lenses for cameras with adjustable lens (901C). The focus distance can be used to adjust image sensors for cameras with adjustable image sensor (901A). The focus distance can be used to adjust optical assemblies for cameras with adjustable optical assembly (901B). The focus distance can be used to adjust adjustable lenses and image sensors or optical assemblies for cameras with adjustable lens and adjustable image sensor or adjustable optical assembly (901D).

FIGS. 19A-19D illustrate actuators for a moving mechanism in a camera according to some embodiments. The individual cameras in a camera array can have one or more focusing elements, such as one or more electronically tunable elements to focus the image. These electronically tunable elements may be included in addition to the mechanical stage that is attached specimen holder that can move the specimen, to help bring the specimen of interest into focus across more than one micro-camera within a given image snapshot. There are several possible electronically tunable elements that can be included within one or more micro-cameras to enable per-micro-camera focusing.

A first electronically tunable element can be an electronically tunable lens. A second optical element 1901C can be a lens whose focusing properties can be tuned via an applied voltage. Focusing properties can be tuned by changing the position of the lens via minute mechanical movement, for example by using a voice coil 1954C to translate an applied voltage into a movement of the optical element. Or, the lens 1901C can be a liquid lens, whose focusing properties are changed by altering either the curvature and/or the index of refraction of the lens itself via an applied voltage. In either case, an electronic signal is used to shift the position of the image formed by the micro-camera imaging optics.

A second electronically tunable element can be an electronically tunable micro-camera positioning element: A mechanical element 1954D can be used to either move the entire micro-camera unit 1901 itself, for example, for moving the entire micro-camera assembly up and down with respect to the sample plane. Alternatively, a mechanical element 1954A or 1954B can be used to move a subset of the micro-camera unit, such as an image sensor 1901A or an image optical assembly 1901B.

Figure 19A:
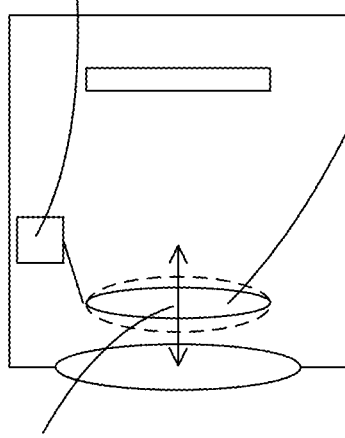
FIGS. 19A-19D illustrate actuators for a moving mechanism in a camera according to some embodiments.
Figure 19B:
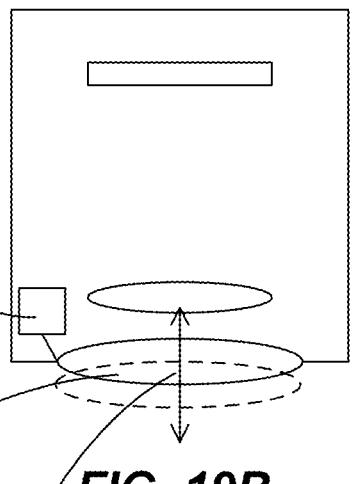
Figure 19C:
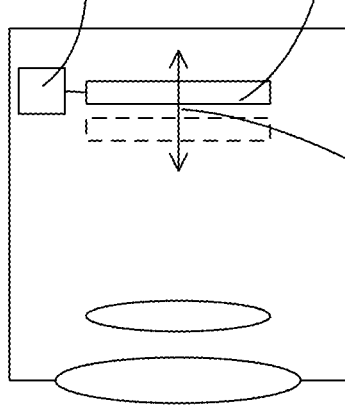
Figure 19D:
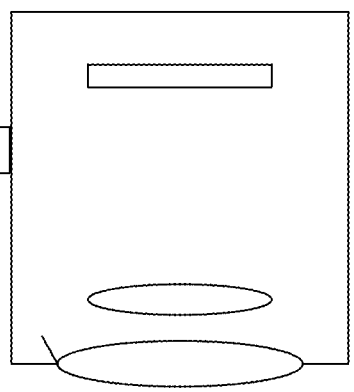

FIG. 19A shows a camera having a tunable lens 1901C together with a lens control 1954C. By controlling the lens control 1954C, the curvature or the index of refraction of the lens 1901C can be adjusted for refocusing the camera. FIG. 19B shows a camera having a tunable optical assembly 1901B together with an optic control 1954B. By controlling the optic control 1954B, the optical assembly 1901B can be adjusted for refocusing the camera. FIG. 19C shows a camera having a tunable image sensor 1901A together with a sensor control 1954A. By controlling the sensor control 1954A, the image sensor 1901A can be adjusted for refocusing the camera. FIG. 19D shows a camera having a mechanical control element 1954D configured to adjust the position of the camera 1901 for refocusing the camera.

Figure 20A:
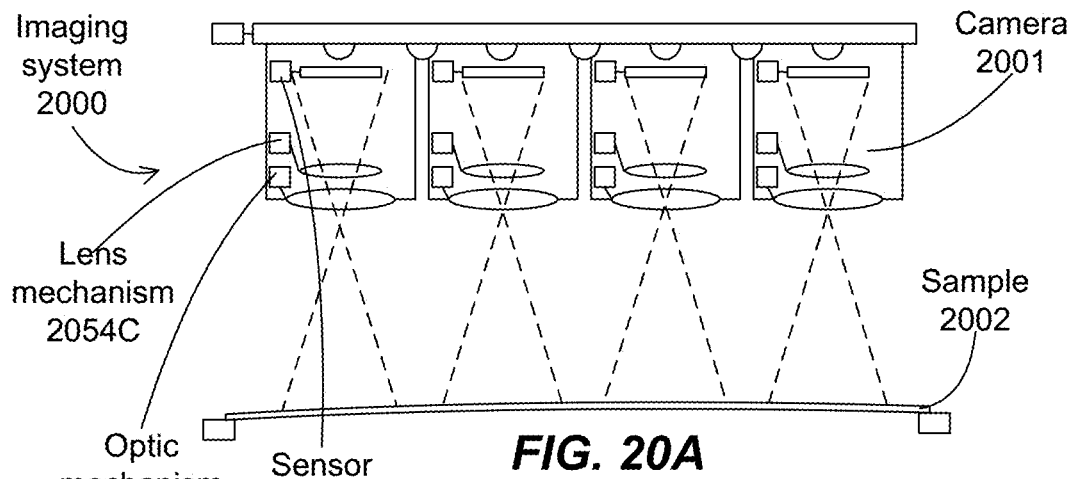
FIGS. 20A-20C illustrate refocusing operations for individual cameras for a curve sample according to some embodiments.
Figure 20B:
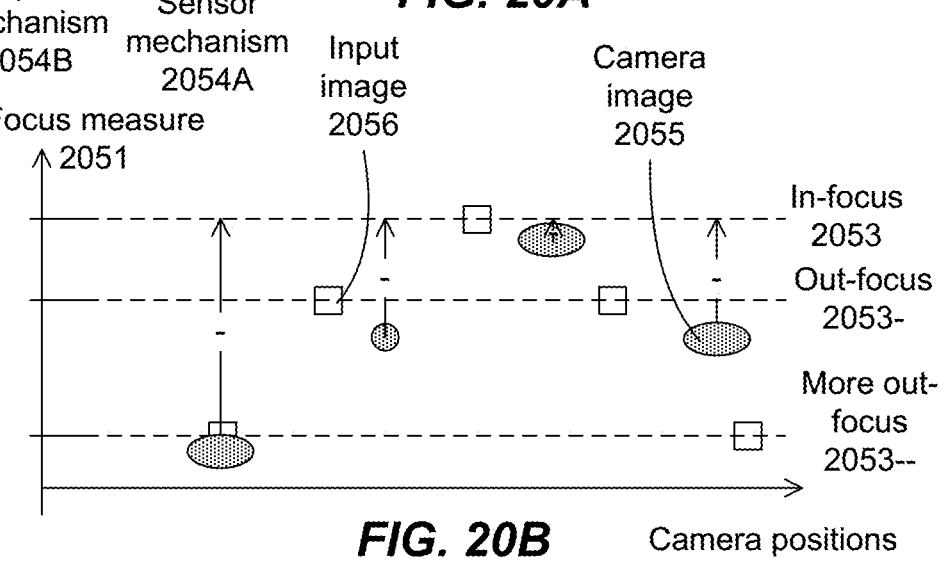
Figure 20C:
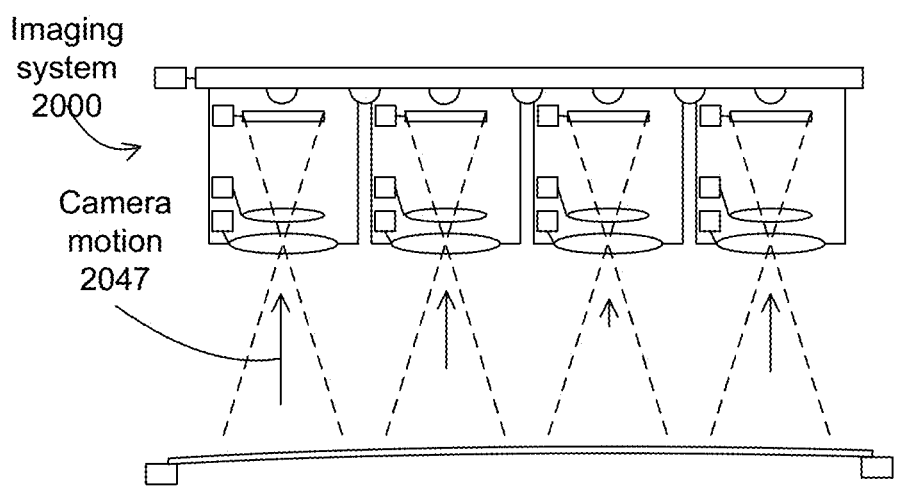

FIGS. 20A-20C illustrate refocusing operations for individual cameras for a curve sample according to some embodiments. FIG. 20A shows an imaging system 2000 having multiple cameras 2001. Each camera 2001 can have at least one of a sensor mechanism 2054A, an optic mechanism 2054B, a lens mechanism 2054C, or a camera mechanism (not shown). The sample 2002 can be a curve sample, resulting in outer cameras not in focus.

FIG. 20B shows focus measures 2051 for the camera images 2055 together with the input image 2056. Some focus measures can be in focus 2053, while some focus measures out of focus 2053- or 2053--. FIG. 20C shows motions 2047 of the individual cameras, based on the focus measures, to bring the cameras back into focus.

Figure 21A:
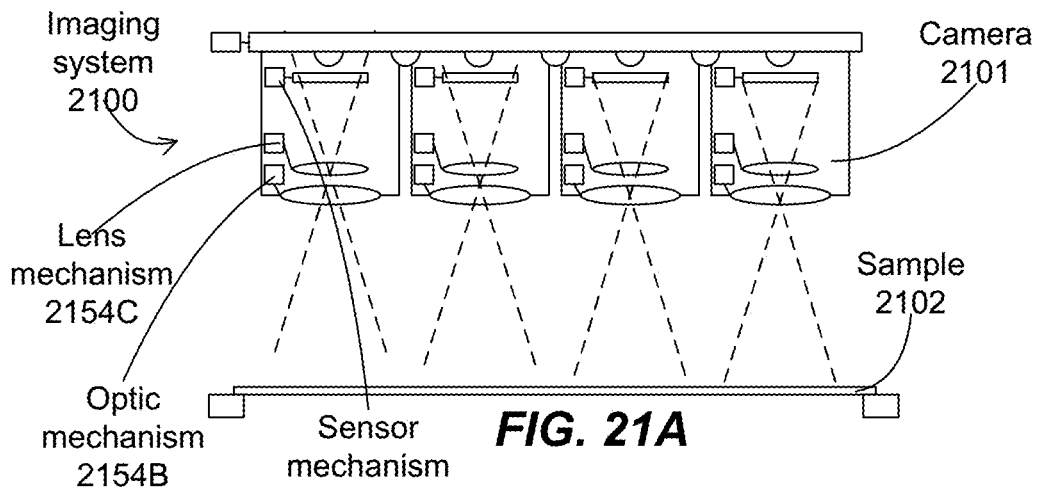
FIGS. 21A-21C illustrate refocusing operations for individual cameras for a tilt sample according to some embodiments.
Figure 21B:
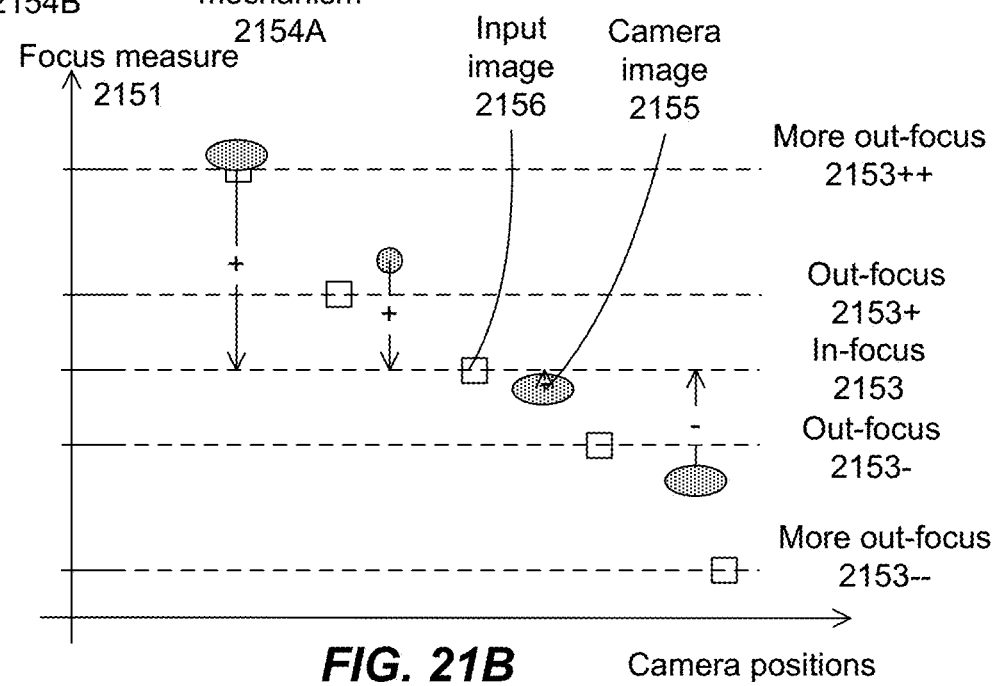
Figure 21C:
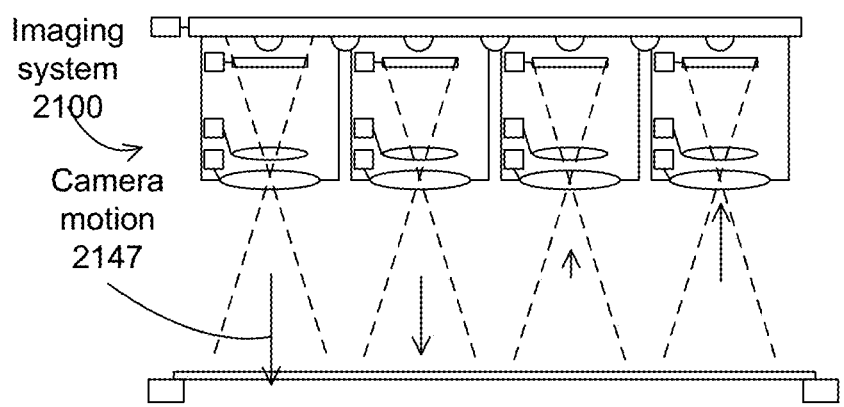

FIGS. 21A-21C illustrate refocusing operations for individual cameras for a tilt sample according to some embodiments. FIG. 21A shows an imaging system 2100 having multiple cameras 2101. Each camera 2101 can have at least one of a sensor mechanism 2154A, an optic mechanism 2154B, a lens mechanism 2154C, or a camera mechanism (not shown). The sample 2102 can be a tilted sample, resulting in middle cameras in focus and outer cameras not in focus.

FIG. 21B shows focus measures 2151 for the camera images 2155 together with the input image 2156. Some focus measures can be in focus 2153, while some focus measures out of focus 2153-, 2153--, 953+, or 2153++. FIG. 21C shows motions 2147 of the individual cameras, based on the focus measures, to bring the cameras back into focus.

Refocus Process for Camera Stage or Sample Stage

In some embodiments, after calculating the focus distances for the refocus process, the imaging system can be automatically refocused, for example, by adjusting the camera stage, the sample stage, or elements of the individual cameras. To adjust the camera stage or the sample stage, an aggregate focus metric is used to determine the mechanical movement of one or more actuators that control the location and tip/tilt and curvature of the camera stage or the sample along the optical axis. For example, with 4 actuators to control the sample's position along the 4 corners of a sample holder, the aggregate focus metric can be used to determine 4 mechanical translation distances for each of the actuators of the sample stage to bring the sample into focus. Alternatively, the aggregate focus metric can be used to determine the mechanical translation distances for each of the actuators of the camera stage to bring the camera array into focus.

Figure 22:
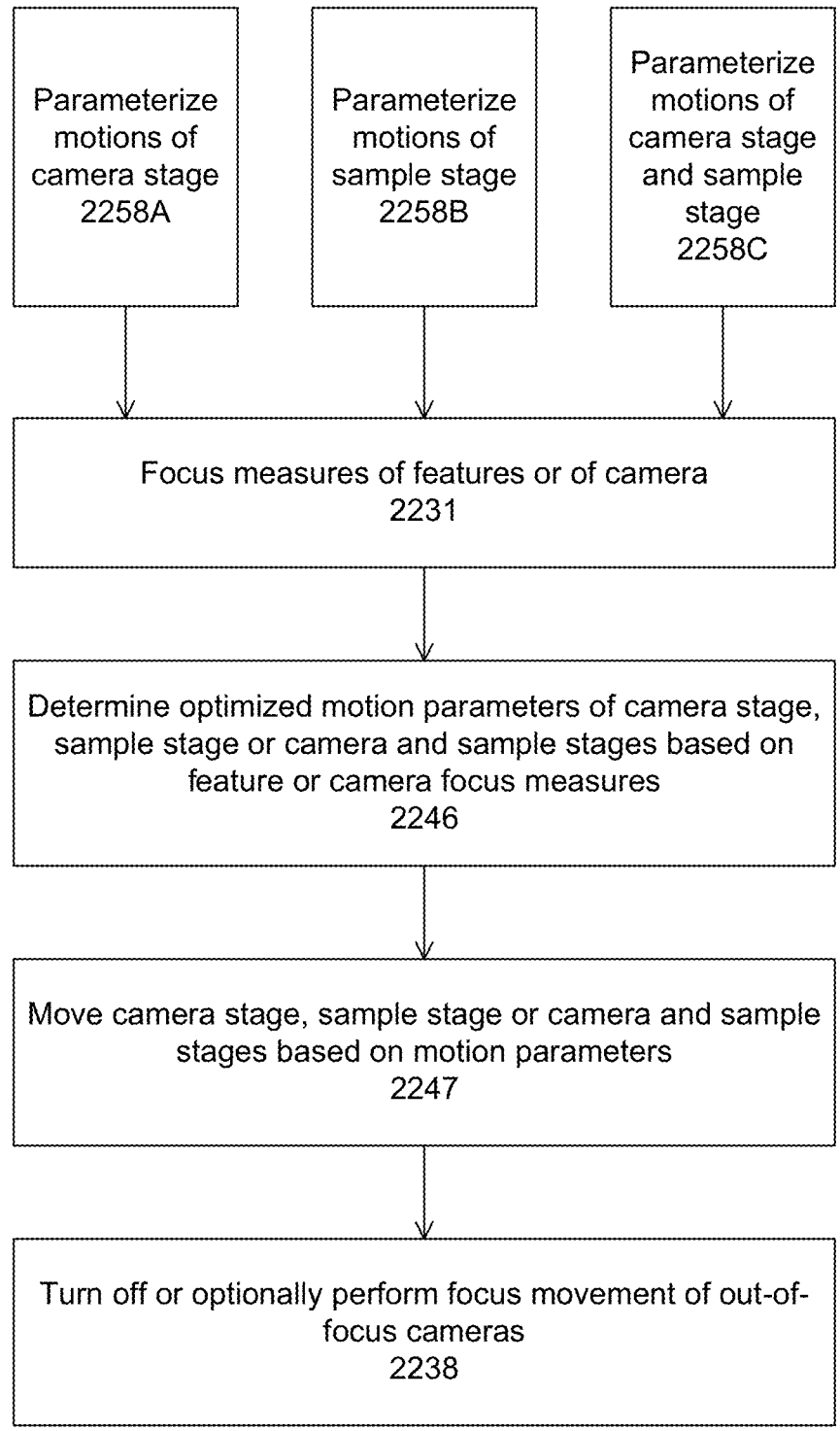
FIG. 22 illustrates operations for refocusing on a sample in an imaging system by a camera array of by a sample stage according to some embodiments.

FIG. 22 illustrates operations for refocusing on a sample in an imaging system by a camera array of by a sample stage according to some embodiments. The motions of the camera stage (958A), of the sample stage (958B), or both camera stage and sample stage (958C) can be determined through one or more parameters characterizing the movements of the actuators supporting the camera stage, the sample stage, or both camera and sample stages. Operation 2231 determines focus measures for feature sub-images in each camera. Operation 2246 determines optimized motion parameters for the camera stage, for the sample stage, or for both the camera and sample stages based on the focus measures of the feature sub-images. Operation 2247 moves the camera state, the sample stage, or both the camera and sample stages based on the motion parameters. Operation 2238 turns off or optionally performs focus movement for out-of-focus cameras.

FIGS. 23A-23C illustrate actuators in a moving mechanism for a sample stage according to some embodiments. The sample stage can include one or more actuators for a relative displacement between sample and micro-camera array. For example, the sample can be supported by a mechanical stage, which can move the sample relative to the micro-camera array.

FIG. 23A shows a sample stage for holding a sample 2302. The sample stage can have multiple, such as 4, vertical supports 2304A, such as linear actuators, which are in contact with the 4 corners of the sample 2302 or a sample holder. Each of these linear actuators can displace the sample axially, to move different specimen regions in and out of focus. The ability to control the tip/tilt of the sample can allow refocusing when performing large FOV imaging with the multiple camera imaging system. In addition, one or more linear (x,y) actuators may be used to control the lateral position of the specimen, such as a scanner 2306.

FIG. 23B shows a sample stage for holding a sample 2302. The sample stage can have multiple, such as 4, vertical supports 2304A, such as linear actuators, which are in contact with the 4 corners of the sample 2302 or a sample holder. Each of these linear actuators can displace the sample axially, to control the tip/tilt of the sample.

In addition, the sample stage can have multiple, such as 4, side supports 2304B, such as linear actuators on either side of the sample, and which can be moved inwards or outwards to curve the sample holder or the sample, for example, when the sample is made out of a flexible material, such as a thin piece of transparent plastic or thin glass. This curvature can bring different areas of the sample into focus or out of focus, by displacing different areas of the sample axially with respect to the micro-camera array microscope. Alternatively, some side supports can be fixed while the opposite side supports can be active, e.g., movable.

Further, one or more linear (x,y) actuators may be used to control the lateral position of the sample, such as a scanner 2306.

FIG. 23C shows a sample stage for holding a sample 2302. The sample stage can have multiple vertical supports 2304A for displacing the sample axially, to control the tip/tilt of the sample. The sample stage can have multiple side supports 2304B for curving the sample inwards or outwards along a lateral direction.

In addition, the sample stage can have multiple, such as 4, side supports 2304C, such as linear actuators on different sides of the sample, and which can be moved inwards or outwards to curve the sample holder or the sample in a different lateral direction, such as a direction perpendicular to the direction of the side supports 2304B. The curvatures provided by the side supports 2304B and 2304C can bring different areas of the sample into focus or out of focus, by curving the sample in different curves. Further, one or more linear (x,y) actuators may be used to control the lateral position of the specimen, such as a scanner 2306.

Figure 24A:
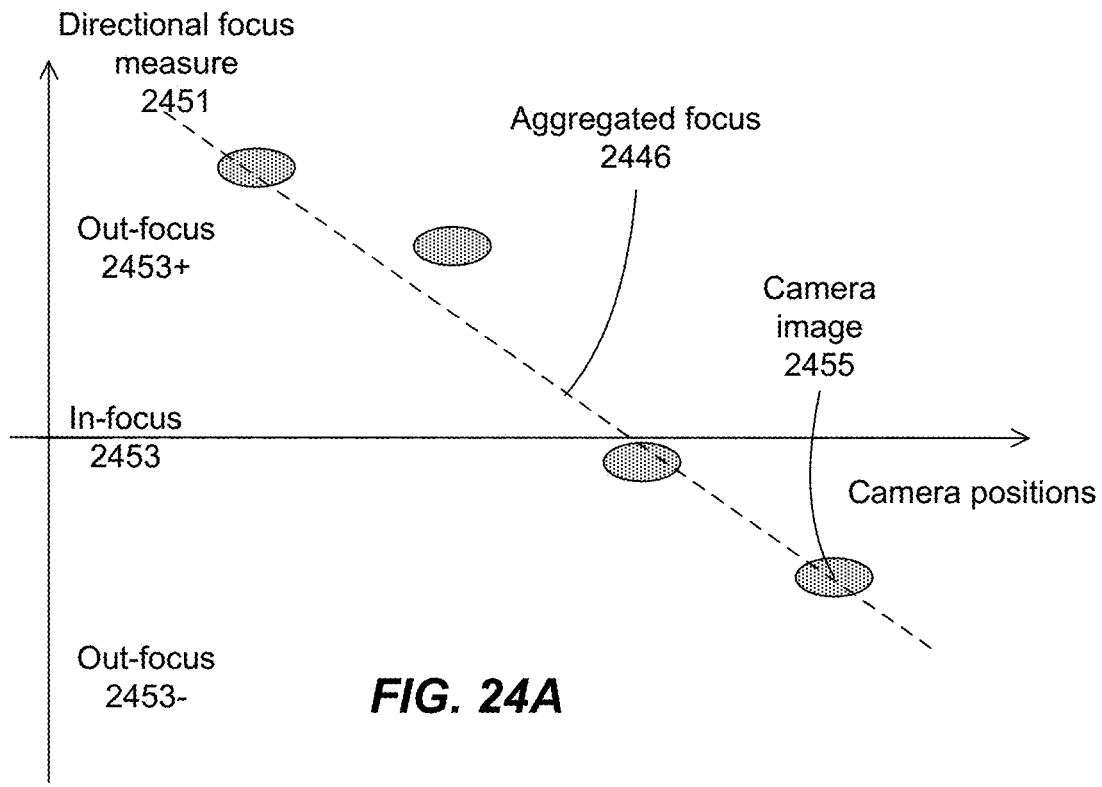
FIGS. 24A-24B illustrate a linear optimization of focus areas in an imaging system according to some embodiments.
Figure 24B:
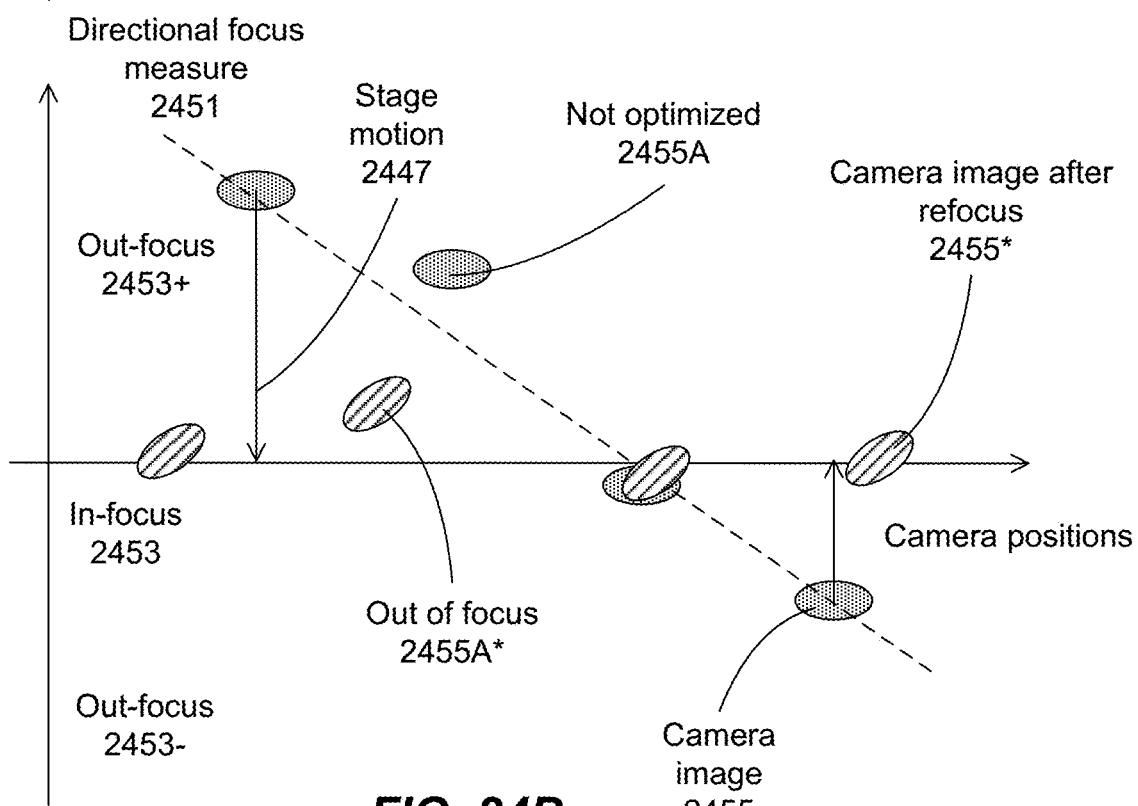

FIGS. 24A-24B illustrate a linear optimization of focus areas in an imaging system according to some embodiments. FIG. 24A shows focus measures 2451 of different camera images 2455, in which some images can be in focus 2453 and some images can be out of focus 2453− or 2453+. An aggregated focus curve 2446 can be calculated to bring a maximum number of camera images into focus. There can be camera images not focusable after the aggregated curve.

FIG. 24B shows motions 2447 of the sample stage according to the aggregated focus curve, such as lowering the left corner and raising the right corner of the sample stage. After the stage motions 2447, many of the cameras are in focus 2455*. Some cameras are not refocusable 2455A under the optimization process, and remain out of focus 2455A*.

Figure 25A:
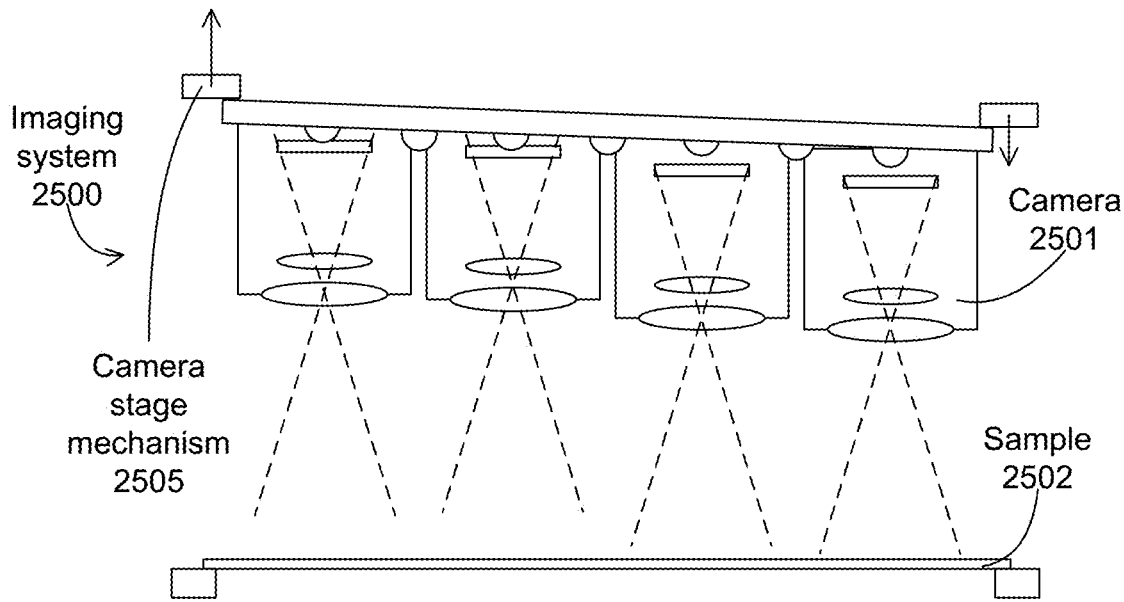
FIGS. 25A-25C illustrate focus operations by tilting a camera array or a sample stage according to some embodiments.
Figure 25B:
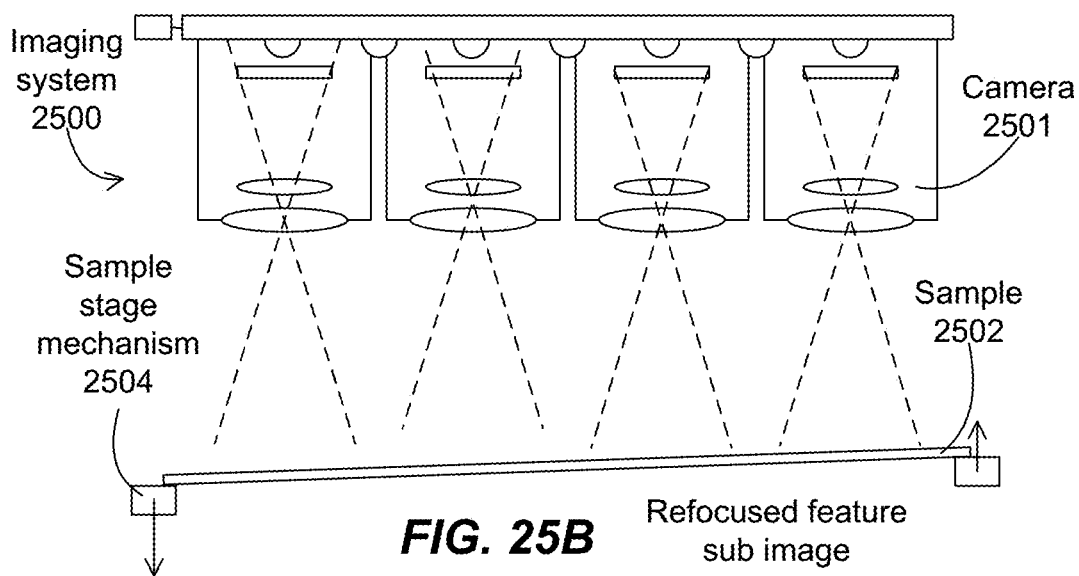
Figure 25C:
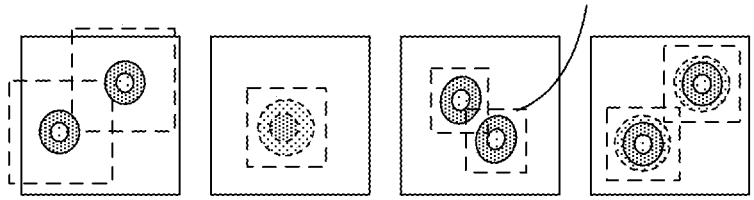

FIGS. 25A-25C illustrate focus operations by tilting a camera array or a sample stage according to some embodiments. FIG. 25A shows an imaging system 2500 having multiple cameras 2501 on a camera stage 2505 for capture images of a sample 2502. There can be some cameras out of focus, as determined by the focus measures of the feature sub-images. An aggregated focus curve can be determined from the focus measures for the camera stage 2505, such as lifting the left side and lowering the right side of the camera stage 2505. A maximum number of feature sub-images can be in focus after the movements of the camera stage based on the aggregated focus curve, as shown in FIG. 25C.

FIG. 25B shows an imaging system 2500 having multiple cameras 2501 for capture images of a sample 2502 disposed on a sample stage 2504. There can be some cameras out of focus, as determined by the focus measures of the feature sub-images. An aggregated focus curve can be determined from the focus measures for the sample stage 2504, such as lowering the left side and lifting the right side of the sample stage 2504. A maximum number of feature sub-images can be in focus after the movements of the sample stage based on the aggregated focus curve, as shown in FIG. 25C.

Figure 26A:
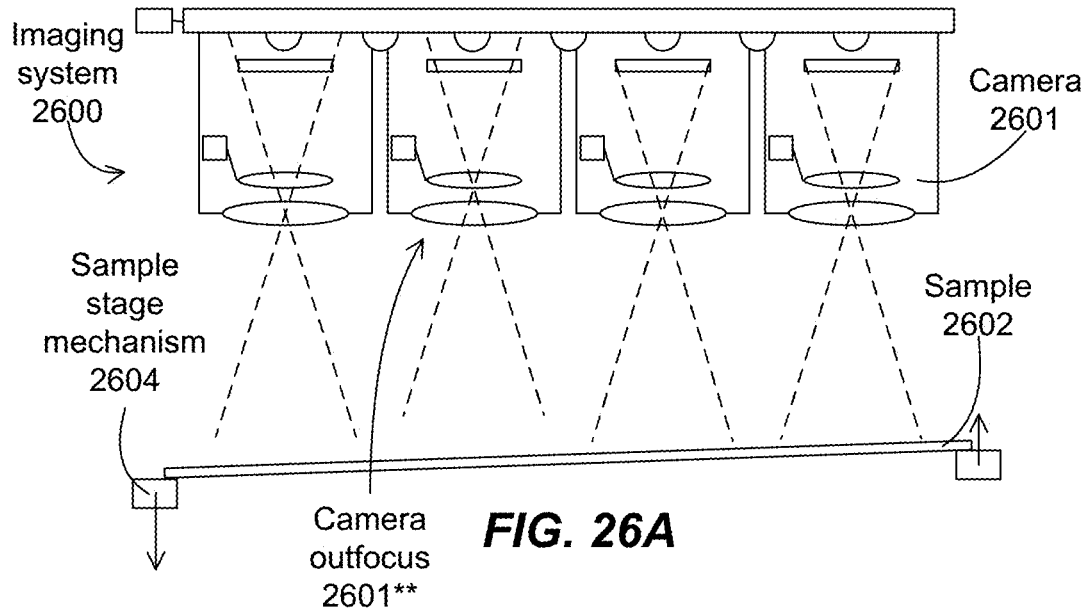
FIGS. 26A-26C illustrate focus operations by a combination of sample stage and individual camera movements according to some embodiments.
Figure 26B:
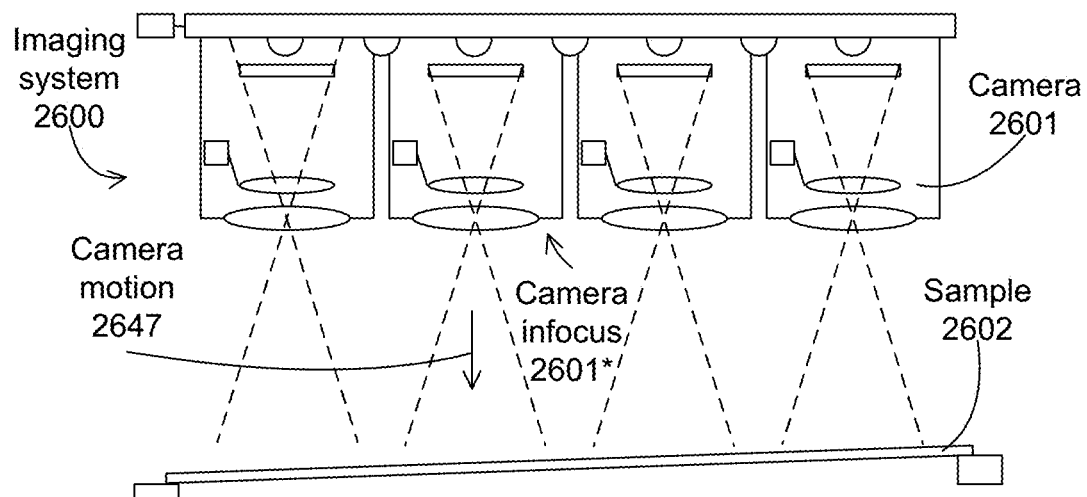
Figure 26C:
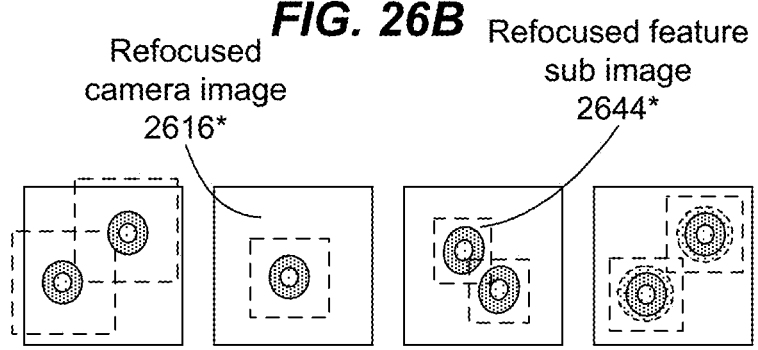

FIGS. 26A-26C illustrate focus operations by a combination of sample stage and individual camera movements according to some embodiments. FIG. 26A shows an imaging system 2600 having multiple cameras 2601 for capture images of a sample 2602 disposed on a sample stage 2604. There can be some cameras out of focus, as determined by the focus measures of the feature sub-images. An aggregated focus curve can be determined from the focus measures for the sample stage 2604, such as lowering the left side and lifting the right side of the sample stage 2604. After the movements of the sample stage based on the aggregated focus curve, some cameras 2601** can be still out of focus.

FIG. 26B shows focusing motions 2647 of individual cameras that are out of focus after the aggregated curve adjustment. The focusing motions 2647 can cause the out of focus camera 2601** to become in focus 2601*.

FIG. 26C shows the in focus camera images, including the refocused feature images 2644* and the refocused camera images 2616*.

Figure 27A:
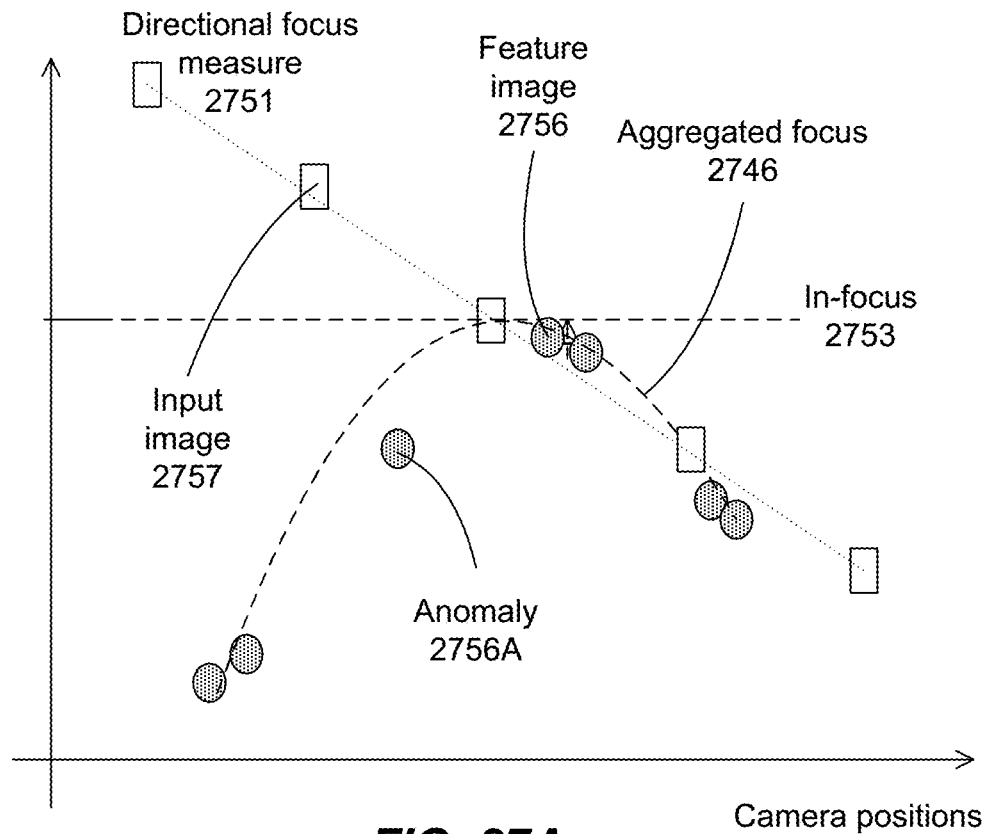
FIGS. 27A-27B illustrate a curve optimization of focus areas in an imaging system according to some embodiments.
Figure 27B:
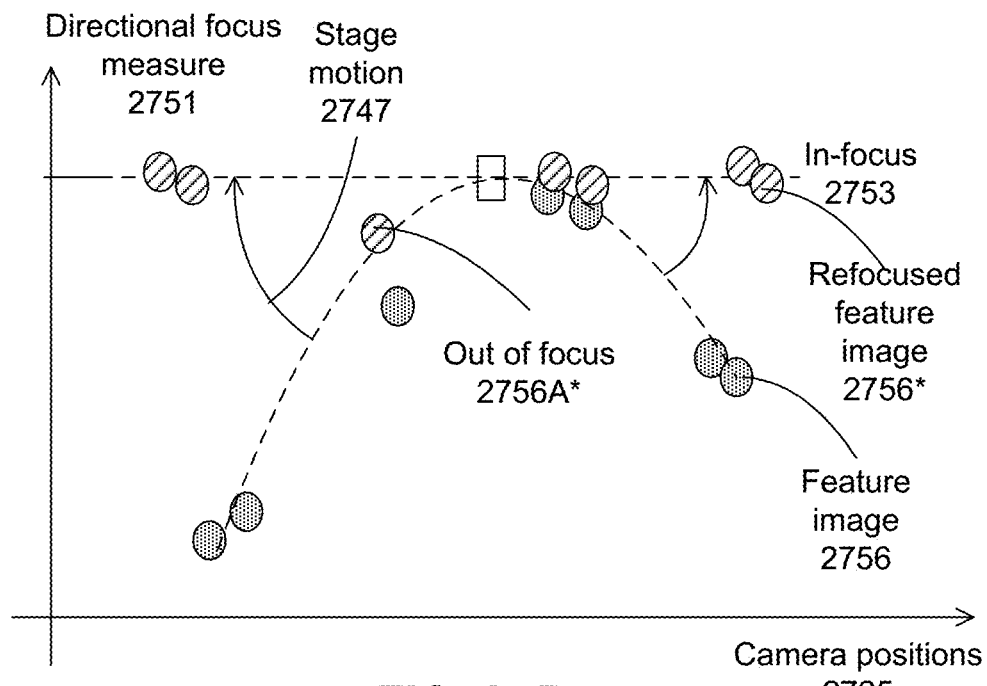

FIGS. 27A-27B illustrate a curve optimization of focus areas in an imaging system according to some embodiments. FIG. 27A shows focus measures 2751 of different feature sub-images 2756, in which some images can be in focus 2753 and some images can be out of focus. Focus measures of images 2757 can also be included. An aggregated focus curve 2746 can be calculated to bring a maximum number of camera images into focus. There can be camera images 2756A not focusable after the aggregated curve.

FIG. 27B shows motions 2747 of the sample stage according to the aggregated focus curve, such as curving up both the left and right corners of the sample stage. After the stage motions 2747, many of the cameras are in focus 2756*. Some cameras are not refocusable 2756A under the optimization process, and remain out of focus 2756A*.

FIGS. 28A-28C illustrate focus operations by a combination of tilting a camera array or a sample stage and a curving the sample stage according to some embodiments. FIG. 28A shows an imaging system 2800 having multiple cameras 2801 for capture images of a sample 2802 disposed on a sample stage 2804. There can be some cameras 2801** out of focus, as determined by the focus measures of the feature sub-images. An aggregated focus curve can be determined from the focus measures for the sample stage 2804, such as curving outward the sample stage 2804.

FIG. 28B shows the cameras 2801* to be in focus after the movements of the sample stage based on the aggregated focus curve. FIG. 28C shows the in focus camera images, including the refocused feature images 2844* and the refocused camera images 2816*.

Recapture Images after a Refocus Process

After sample re-positioning via the mechanical stage and actuators, the micro-camera array can acquire at least one new image snapshot from each micro-camera, to form the nominally focused image dataset for subsequent analysis. In some embodiments, at least a set of N images, where N represents the number of micro-cameras within the array, will be acquired per snapshot (one image per micro-camera). In addition, in some embodiments, this snapshot process may be repeated j times per micro-camera, where between each snapshot the spatial, angular and spectral properties of the sample illumination, generated by the programmable illumination unit, can be varied via a signal sent to the illumination unit. This results in a total of N×j images in total. Finally, in some embodiments, this entire process of multi-snapshot acquisition can be repeated k times, where the sample is laterally re-positioned k times, to provide a new image FOV for each of the micro-cameras within the array. If there are N micro-cameras within the array, then there will be a total of j×k×N separate images acquired by the present imaging system to form the final acquired image dataset, which exhibits maximum focus for a specified feature of interest.

Figure 29A:
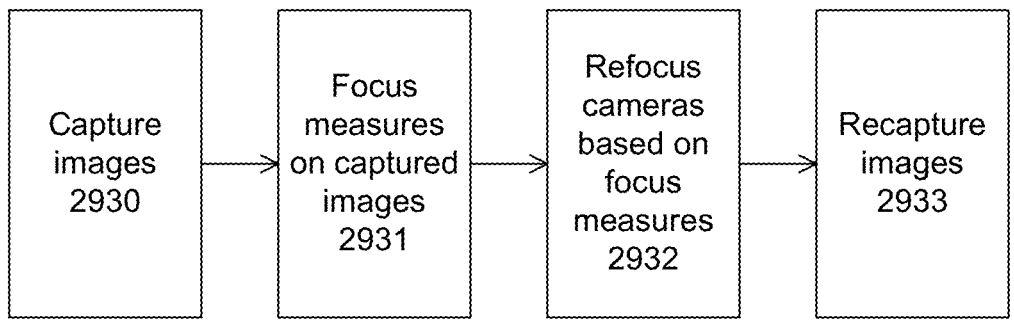
FIGS. 29A-29B illustrate operations for recapturing images after a refocusing operation according to some embodiments.
Figure 29B:
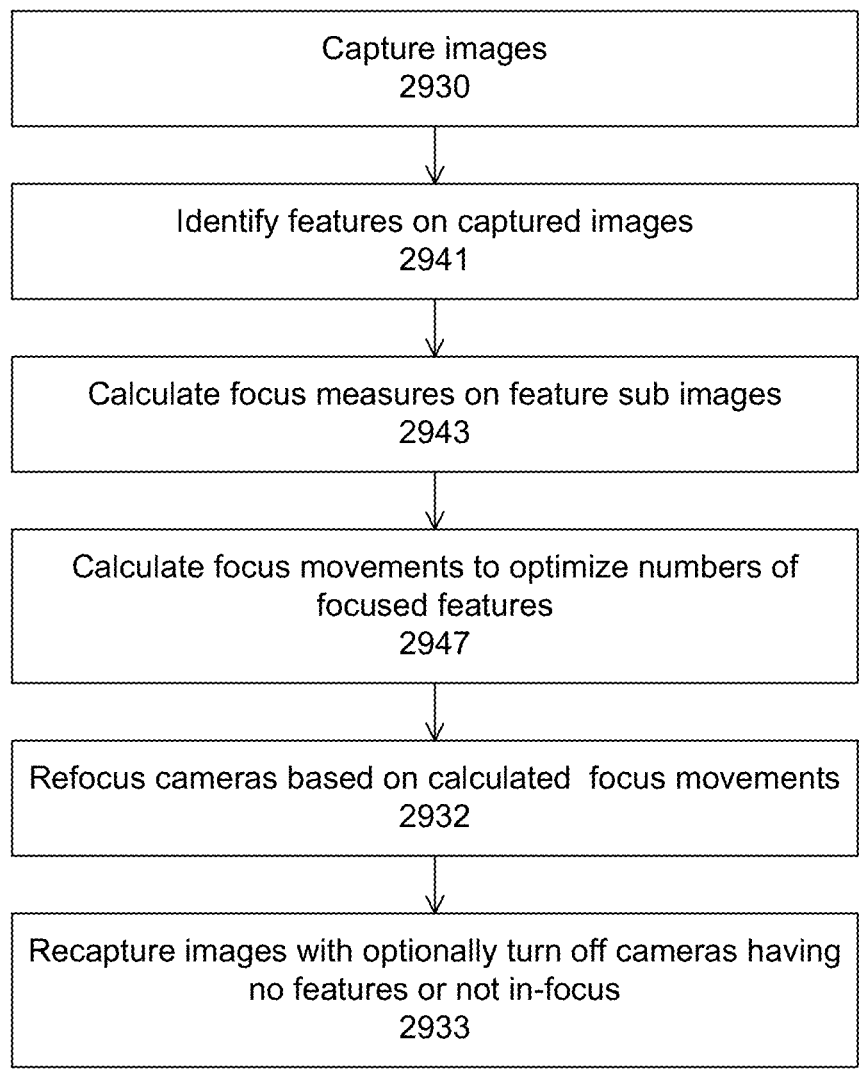

FIGS. 29A-29B illustrate operations for recapturing images after a refocusing operation according to some embodiments. In FIG. 29A, operation 2930 captures images of a sample. Operation 2931 calculates focus measures on the captured images, such as on the feature sub-images detected from the captured images. Operation 2932 performs a refocus process for the imaging system based on the focus measures, which can be configured for maximizing the number of feature sub-images that are in focus. Operation 2933 recaptures images after the refocus process for analysis.

In FIG. 29B, operation 2930 captures images of a sample. Operation 2941 identifies features on the captured images. Operation 2943 calculates focus measures on the feature sub-images detected from the captured images. Operation 2947 calculates focus movements to maximizing the number of feature sub-images that are in focus. Operation 2932 performs a refocus process for the imaging system based on the focus movements. Operation 2933 recaptures images after the refocus process for analysis.

Figures 30A, 30B, 30C:
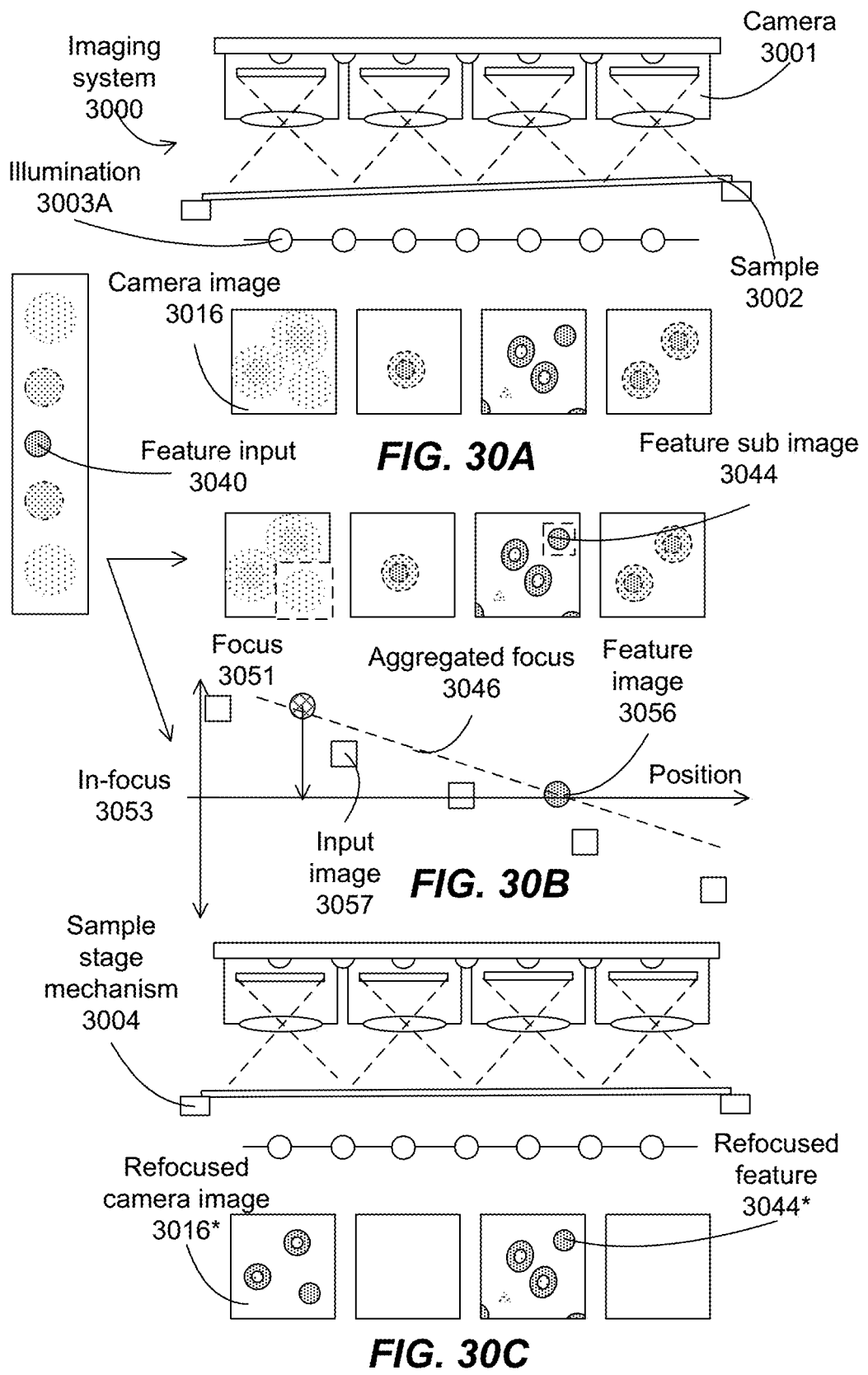
FIGS. 30A-30C illustrate an example of an imaging process with a refocusing operation according to some embodiments.

FIGS. 30A-30C illustrate an example of an imaging process with a refocusing operation according to some embodiments. A focus aggregation strategy can be used for refocusing the cameras in the imaging system, which can correlate the relative focus of each micro-camera within the array. FIG. 30A shows an array of 4 micro-cameras 3001 in a 2D array. A first snapshot 3016 by each micro-camera yields different cellular features both in focus and out-of-focus of a sample 3002 under the illumination 3003A. For example, the sample can be a blood smear with large red blood cells and smaller platelets.

FIG. 30B shows a user input of a set of features 3040 that are indicative of platelets, which can include feature information that is both in-focus and out-of-focus, to enable the system to find both in-focus and out-of-focus feature information. With this input, a feature 3044 is found in some images of the cameras, and not in some other cameras.

Focus measures 3051 can be calculated for the feature sub image 3056 and the input image 3057 to determine the in focus value 3053. An aggregate focus curve 3046 can be optimized from the focus measures. The aggregated focus curve can specify how to move the mechanical actuators that control the axial position and tip/tilt of the sample, such as to compensate for the significantly misfocused in the left cameras, and for the in focus in the right cameras. With these focus measures, the aggregated focus curve can reflect a linear slope that is higher at the position of the left cameras and that is lower at the position at of the right cameras, to indicate a high misfocus at left cameras and nearly in-focus at right cameras. With more than two focus measures, the aggregated focus curve is not a linear line but can be a more complex curve.

If some images do not have features of interest, these cameras can be turned off or de-selected and not used for the remainder of the data capture process.

FIG. 30C shows the imaging system after the motions of the stage holder 3004 according to the aggregated focus curve. For example, the motions of the sample stage can include a negative value to left actuator, which will physically lower the sample area on the left to be in focus. As the features of interest were already in focus within the right camera, no motion is applied to the right actuator. The imaging system can provide the in focus camera images, including the refocused feature images 3044* and the refocused camera images 3016*.

FIGS. 31A-31C illustrate another example of an imaging process with a refocusing operation according to some embodiments. A focus aggregation strategy can be used for refocusing the cameras in the imaging system, which can correlate the relative focus of each micro-camera within the array. FIG. 31A shows an array of 4 micro-cameras 3101 in a 2D array. A first snapshot 3116 by each micro-camera yields different cellular features both in focus and out-of-focus of a sample 3102 under the illumination 3103A. For example, the sample can be a blood smear with large red blood cells and smaller platelets.

FIG. 31B shows a user input of a set of features 3140 that are indicative of red blood cells, which can include feature information that is both in-focus and out-of-focus, to enable the system to find both in-focus and out-of-focus feature information. With this input, a feature 3144 is found in all images of the cameras.

Focus measures 3151 can be calculated for the feature sub image 3156 and the input image 3157 to determine the in focus value 3153. An aggregate focus curve 3146 can be optimized from the focus measures. The aggregated focus curve can specify how to move the mechanical actuators that control the axial position and tip/tilt of the sample, such as to compensate for the positive significantly misfocused in the left cameras, and for the negative misfocused in the right cameras. With these focus measures, the aggregated focus curve can reflect a linear slope that is higher at the position of the left cameras and that is lower at the position at of the right cameras, to indicate a high misfocus at left cameras and lower misfocus at right cameras. With more than two focus measures, the aggregated focus curve is not a linear line but can be a more complex curve.

FIG. 31C shows the imaging system after the motions of the stage holder 3104 according to the aggregated focus curve. For example, the motions of the sample stage can include a negative value to left actuator, which will physically lower the sample area on the left to be in focus. The motions of the sample stage can include a positive value to right actuator, which will physically raise the sample area on the right to be in focus. The imaging system can provide the in focus camera images, including the refocused feature images 3144* and the refocused camera images 3116*.

Diagnostic Analysis

In some embodiments, the present invention discloses system and method for a statistical diagnostic analysis of acquired image data, including an imaging process that is optimized for focusing and for data reduction. Sub-images containing the features of interest are identified with other portions of the image removed from being captured and excluded from being processed by the imaging system, based on a prior optimization of feature detection and sample focusing. The image capturing and image data analyzing of only features of interest can lead to a reduction of image data to be processed. The features of interest can be classified into categories, such as disease or healthy, and a statistical analysis of the features can generate a diagnostic measure of the sample under observation. Additional analysis, including surface topology and improved contrast assessment can be used to improve the classification accuracy of the sample.

In some embodiments, the imaging system can be refocused to provide a maximum number of feature sub-images that are in focus, for example, after mechanical movement via actuators for camera stage, sample stage, or elements of individual cameras. After the refocus, a second snapshot is acquired with a maximum number of the features of interest now in sharp focus. These features of interest are cropped once again and can be post-processed for statistical analysis, such as at a second data processing unit or system.

Figure 32:
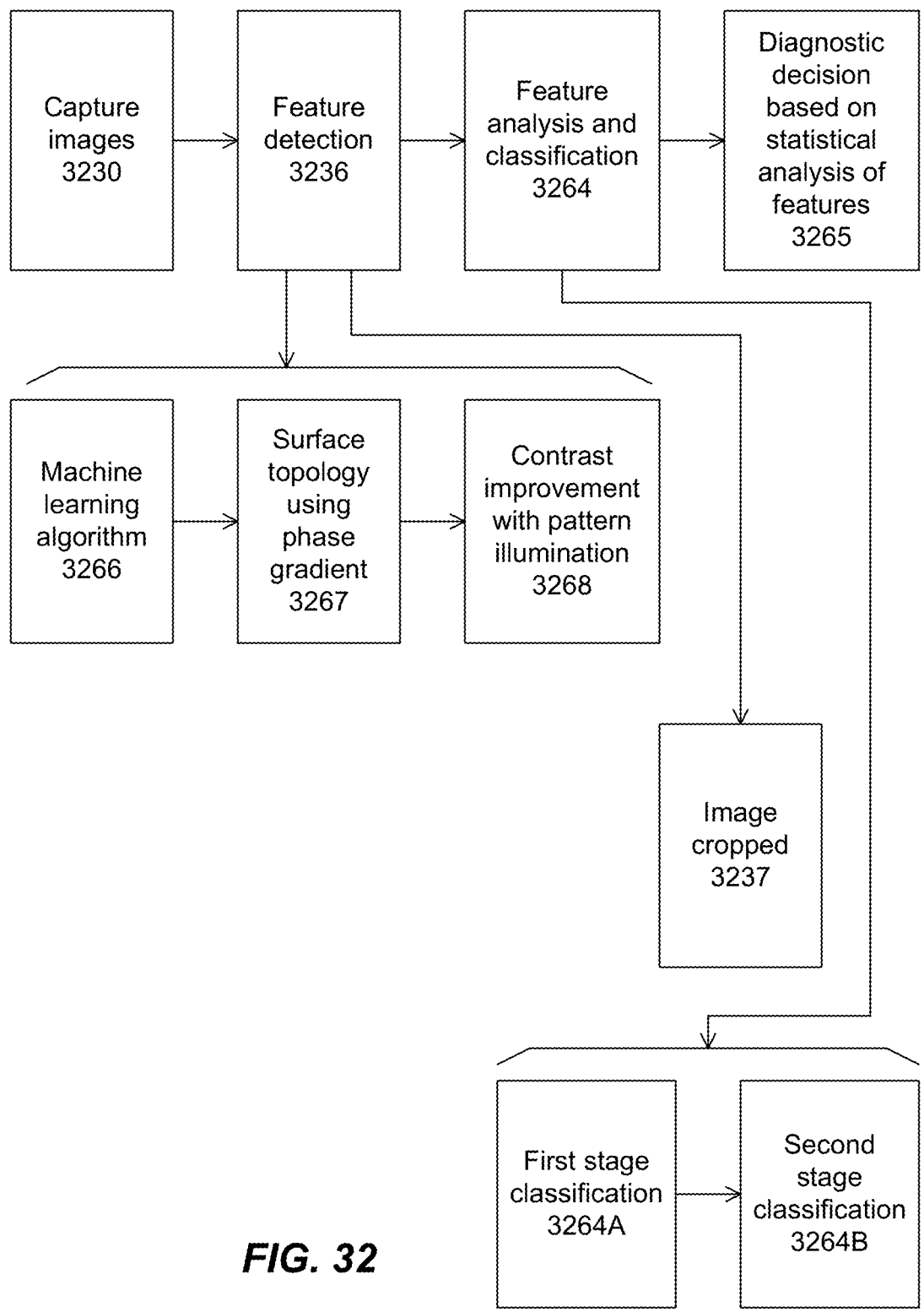
FIG. 32 illustrates operations for a diagnostic analysis using an imaging system according to some embodiments.

FIG. 32 illustrates operations for a diagnostic analysis using an imaging system according to some embodiments. The imaging system can capture focused images of a sample, and can process the image data to obtain a statistical measure of one or more features of interest within the sample, such as the number of white blood cells that show an indication of a particular disease.

Operation 3230 performs an image capture process for the imaging system, after the imaging system is refocused, for example, by adjusting the mechanical actuators to maximize a number of feature sub-images that are to be in focus. The captured images can be a nominally focused image dataset, meaning a collection of images captured by the cameras that are mostly in focus, e.g., having a maximum number of focused features of interest given the conditions of the sample disposed under the camera array of the imaging system. The nominally focused image dataset can contain image data from different, non-overlapping sample areas.

Operation 3236 performs a feature detection process on the nominally focused image dataset, e.g., on the images captured by the cameras after an optimization of actuator adjustments for focusing the imaging system. The image areas containing the detected features can be cropped out from the captured images to form feature sub-images, with each feature sub-image containing a feature.

The captured images can be segmented to form multiple segments for each image. The segments can be passed through a feature or object detection pipeline, with the detection process based on an input feature or object.

In some embodiments, an image captured from each camera can be split into one or more smaller segments, so that the smaller segments can be fed into a supervised machine learning algorithm 3266, such as a deep neural network, that has been trained with prior acquired data for the object detection task. For example, the supervised machine learning algorithm for object detection can be pre-trained for the task of finding the pixel coordinates surrounding feature of interest such as white blood cells and other non-red blood cell material within thin blood smears. The output of the feature detection can be a set of pixel coordinates and box sizes, with each pair of pixel coordinates and two box sizes representing a detected feature.

The feature detection process can include a rejection of detected features that are not in sharp focus. Accordingly, a subset of all sharp focused features of interest can be detected by the supervised machine learning algorithm. In addition, as described above, it is also possible to take advantage of the pattern-illuminated image data that is captured within the nominally focused image dataset along the jth dimension of the j×k×N data matrix, to have surface topology 3267 or enhanced contrast 3268 for improving classification accuracy. For example, more than one uniquely illuminated image from each specimen FOV area can be input into the supervised machine learning network to increase the accuracy of the feature detection.

Each image area that has been identified as containing a feature of interest can be cropped 3237 into one or more cropped segments, e.g., sub-images, with each sub-image corresponding to a feature of interest. The cropped segments or sub-images for the entire nominally focused image dataset can then be placed in a 3D data matrix, whose dimensions are (x,y,z), where (x,y) are the 2D spatial image coordinates and the data matrix contains each cropped example along the third dimension, for z=1 to z=Z total cropped examples, if the utilized cropping coordinates are the same across all cropped examples. Alternatively, they may be stored in a 3D struct or other type of unsorted list.

Operation 3264 performs analysis and classification on the set of feature sub-images or cropped segments of captured images. Each of the sub-image or cropped segments from the 3D data matrix can be passed through a second supervised machine learning algorithm, such as a deep convolutional neural network (CNN), for the task of machine learning-based image analysis. In some embodiments, the deep CNN is trained with prior data for classifying each feature such as a blood cell (e.g., performing image classification on each sub-image) into one of several categories. For example, the classification can place a cell into a diseased category, e.g., characterizing a cell as diseased (e.g., from a patient infected with COVID-19) or into a healthy category, e.g., characterizing a cell as healthy (e.g., from a healthy patient). Alternatively, the classifier can be used to identify if each cell is from a patient who is diseased (e.g., has sepsis), or is from a patient who is healthy (e.g., does not have sepsis). Other examples of machine learning analysis that can be applied to the captured data include feature classification, object detection, object detection and classification, image segmentation, annotated image segmentation, multiple instance learning, and reinforcement learning, to name a few. For some machine learning tasks, it can be beneficial to process each of the sub-images from the 3D data matrix, one at time, with the machine learning algorithm. For other machine learning tasks, it can be beneficial to process more than one of the sub-images from the 3D data matrix at a time with a machine learning algorithm. For yet a third type of machine learning task, it can be beneficial to process each of the sub-images with one machine learning algorithm, and then to use the results of this processing to group the data to then process more than one of the sub-images at a time with a second machine learning algorithm.

In some embodiments, a supervised machine learning classification algorithm can be used to first classify 3264A each of the blood cell sub-images into one of 7 blood cell types: neutrophils, lymphocytes, eosinophils, monocytes, basophils, platelets, or other. Then, each of the cells can be grouped into one of the types, and are processed by a second stage 3264B machine learning algorithm. This second machine learning algorithm has been trained with similar image data captured from a large collection of blood smears collected from patients who have a particular disease or not. Each of the blood cell sub-images from the 3D data matrix collected from each patient's blood smear can be first labeled as "diseased" or "not diseased", and are then used to train a supervised learning algorithm. One supervised machine learning algorithm can be trained for each of the 7 blood cell types. Then, these trained supervised machine learning algorithms can be used as the second machine learning algorithm noted above to categorize images of blood cells from each of the 7 categories as diseased or not diseased, for example.

Operation 3265 generates diagnostic decision based on a statistical analysis of the features. After the image classification task, the composite set of all classification scores may be further combined via a statistical (e.g., by computing their mean, median, mode or some other metric) or machine learning-based approach (such as used in multiple instance learning, which would consist of an additional classification-type step on the compiled set of class scores). The output of this step is a final analysis report, including a diagnostic measure and/or a prognostic measure of disease, which can be included with other clinical data to improve patient outcome.

Figure 33A:
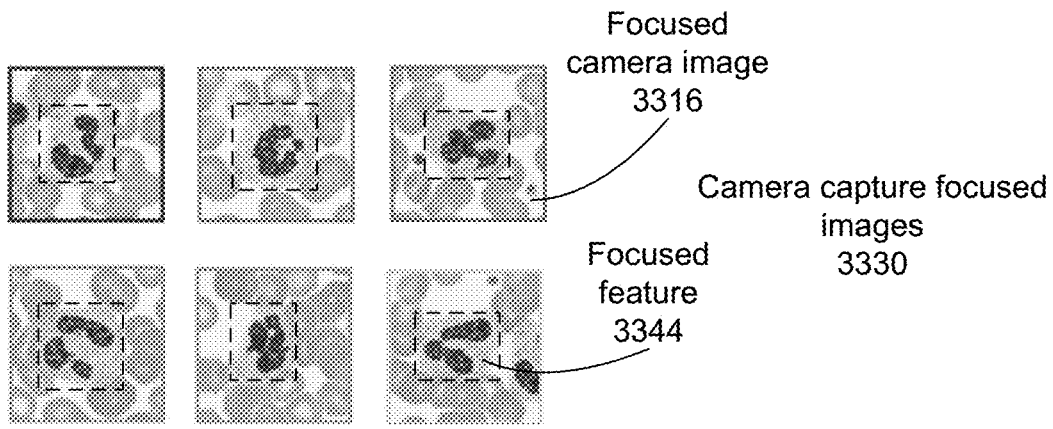
FIGS. 33A-33D illustrate operations for a diagnostic analysis according to some embodiments.
Figure 33B:
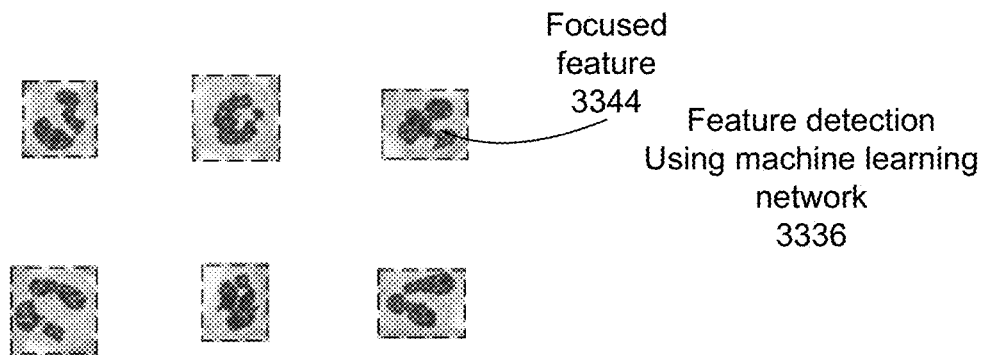
Figure 33C:
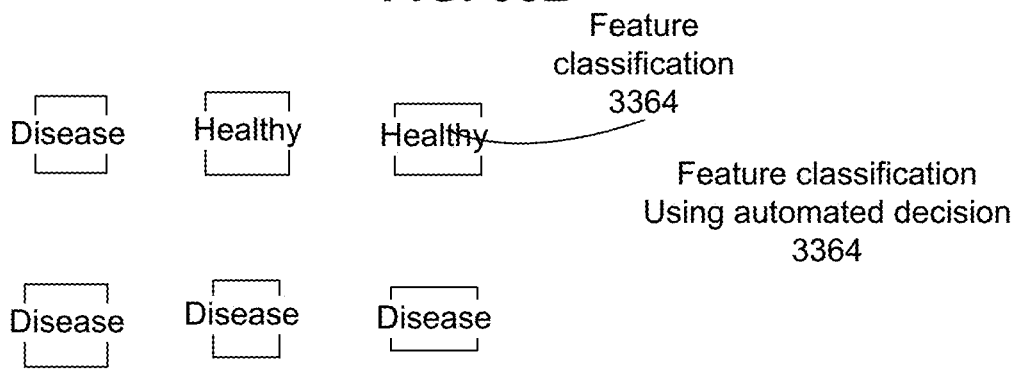
Figure 33D:
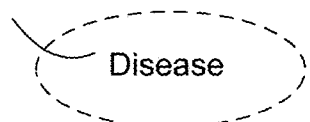

FIGS. 33A-33D illustrate operations for a diagnostic analysis according to some embodiments. FIG. 33A shows the focused images captured by the cameras of an imaging system 3330, including focused feature image 3344 or focused camera image 3316. FIG. 33B shows a set of feature sub-images detected by a machine learning algorithm 3336, including multiple focused feature sub-images. FIG. 33C shows a classification of the feature sub-images using an automated machine learning algorithm 3364, including classifying each feature sub-images as diseased, healthy, borderline, or unknown. FIG. 33D shows an aggregated decision 3365 for the sample based on a statistical analysis of the feature classification.

Figure 34A:
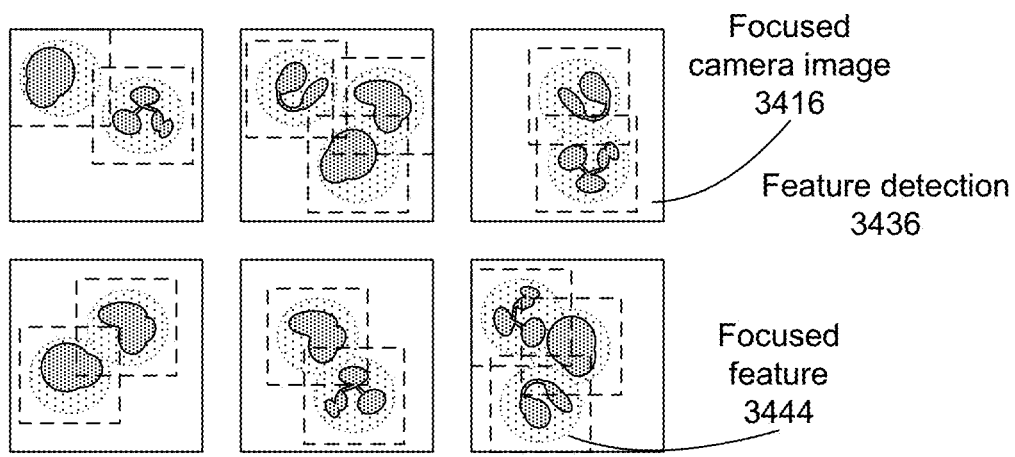
FIGS. 34A-34D illustrate alternative operations for a diagnostic analysis according to some embodiments.
Figure 34B:
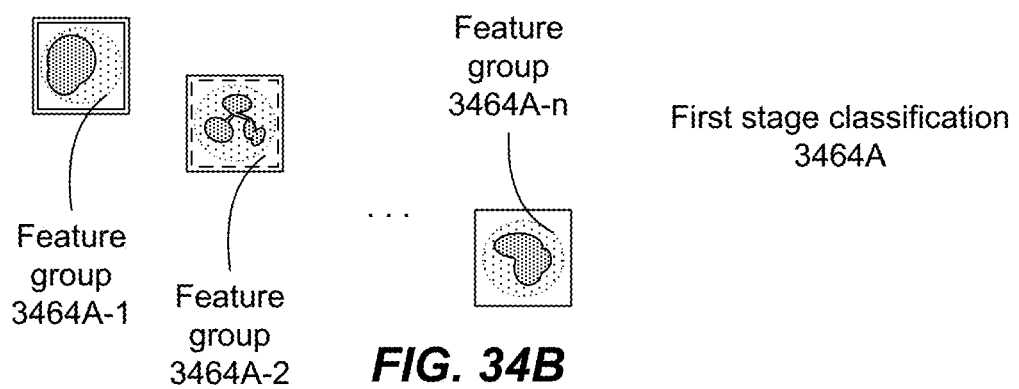
Figure 34C:
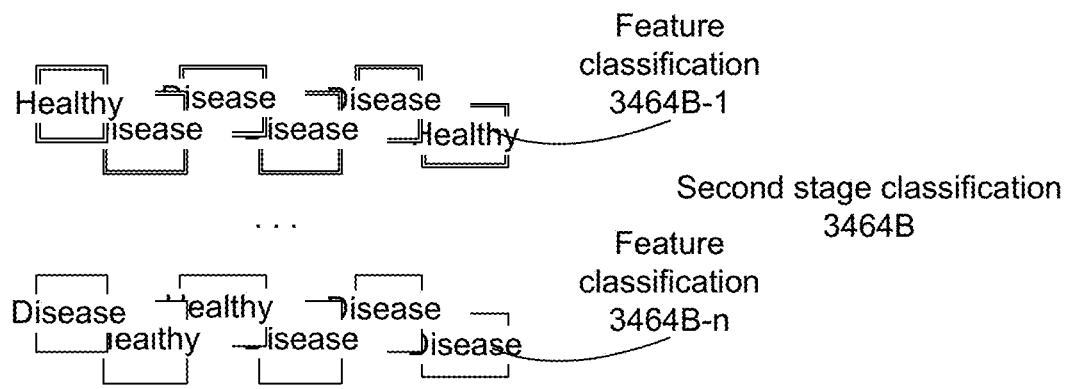
Figure 34D:
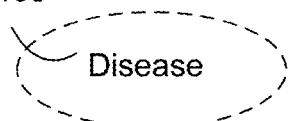

FIGS. 34A-34D illustrate alternative operations for a diagnostic analysis according to some embodiments. FIG. 34A shows the focused images captured by the cameras of an imaging system 3430, including focused feature image 3444 or focused camera image 3416. FIG. 34B shows a first stage classification 3464A, in which the feature sub-images are grouped into multiple feature groups 3464A-1, 3464A-2, etc. FIG. 34C shows a second stage classification 3464B, in which each feature in each group is further classified as diseased, healthy, borderline, or unknown. FIG. 34D shows an aggregated decision 3465 for the sample based on a statistical analysis of the feature classification.

In some embodiments, the operations of the present imaging system for a high speed imaging and analysis of a sample, such as a blood smear can include inserting a blood smear, which is spread onto a large flat surface, into a sample holder of the imaging system. The sample holder can be positioned beneath the micro-camera array of the imaging system at a nominal focus, which can deviate from the known focus. An input can be provided to the imaging system, which can specify to the system which type of features are of interest in ensuring a maximum number of the feature can be in sharp focus after a refocus step. For example, white blood cells (WBCs) can be the inputted feature to be brought into focus in the captured images.

The images are acquired from more than one micro-camera within the micro-camera array, and up to N micro-cameras within the array. The captured images can be passed to a computation unit, termed the MC control unit, which can either be implemented on a field-programmable gate array (FPGA), micro-controller, a full computer, or some other type of computing device capable of rapidly processing image data.

Using the input feature information, the computation unit can rapidly search for this feature across the captured images, and can compute a "measure of focus" for each of the identified areas that include the feature of interest. For example, the computation unit can search for and identify WBCs within the captured image data, and can crop the WBC regions into image segments, and can compute a measure of focus by analyzing the total energy contained within the image gradient of each image segment, which will be converted into a suggested refocus distance for each micro-camera array image.

The computation unit can aggregate all suggested refocus distances from across all micro-camera images to arrive at final refocus distances for actuators configured to refocus the imaging system, such as by moving the camera array, the sample stage, or the elements of individual cameras. The actuators can be actuated to reposition the sample holder with respect to the micro-camera array, through axially, tip/tilt, curved, or also laterally, to refocus the imaging system on the sample according to the aggregate focus distances.

After the refocus process, a second set of images can be captured by the cameras of the imaging system. In some embodiments, the second set of captured images can include N images from N cameras in the camera array, k×N images from N cameras for each of k illumination patterns, j×k×N images from N cameras for each of k illumination patterns for each of j scanning step. Small changes can be applied between the capture of each image from each micro-camera, if more than one image is captured by each micro-camera. For example, the pattern illumination unit's spatio-angular distribution can be varied via its programmable interface. In addition, the illumination wavelength can be varied to capture color image data. Further, the sample can be scanned, e.g., advancing in small discrete step. The second set of images can include a maximum number of focused features of interest, as determined by the optimization of refocus movements of the imaging system.

The second set of images can be passed to a computing device, which can be the same computing device as used in the refocus operation, or can be a different computing device, such as the computer processor, for final processing. In some embodiments, the computing device used in the refocusing operation is an FPGA, and the computing device for final processing is a computer processor that is a part of a desktop computer.

The final processing computing device can performs a series of operations to transform the captured image data into a final analysis report. For example, the final analysis report can include a diagnostic measure, such as probability of infection with the coronavirus (e.g., with COVID-19), or an alternative disease like sepsis.

The captured focused image data can first be passed through a feature detection pipeline. In some embodiments, each image from a camera can be split into one or more smaller segments and fed into a supervised machine learning algorithm, such as a deep neural network that has been trained with prior acquired data for the detection task of finding the pixel coordinates surrounding the features. The feature detection can include a rejection of out-of-focus detected features, since the out-of-focus features can be difficult to be characterized such as diseased or healthy.

Each image area that has been identified as containing a feature of interest can be cropped and optionally placed in a 3D data matrix, whose dimensions are (x,y,z), where (x,y) are the 2D spatial image coordinates and the data matrix contains each cropped example along the third dimension, for z=1 to z=Z total cropped examples.

Each of the Z cropped examples from the 3D data matrix is then passed through a second supervised machine learning algorithm, such as a deep convolutional neural network (CNN), for the task of image classification. In some embodiments, the deep CNN is trained with prior data for classifying each blood cell into one of two categories: diseased (e.g., from a patient infected with COVID-19) or healthy (e.g., from a healthy patient).

After the image classification task, the composite set of all classification scores may be further combined via a statistical (e.g., by computing their mean, median, mode or some other metric) or machine learning-based approach (such as used in multiple instance learning, which would consist of an additional classification-type step on the compiled set of class scores). The output of this step is the final analysis report, including a diagnostic measure.

What is claimed is:

1. A system comprising
a camera array,
   wherein the camera array comprises multiple cameras with each camera configured to capture images of a portion of a sample,
an illumination source,
   wherein the illumination source comprises one or more radiation sources configured to provide one or more illumination patterns to the sample,
a moving mechanism,
   wherein the moving mechanism is configured to move the camera array, the sample, or an element of at least a camera of the multiple cameras,
a processing module comprising a processor,
   wherein the processing module is configured to process the images captured by the multiple cameras,
   wherein processing the captured images comprises detecting features of interest on the captured images based on an input,
   wherein processing the captured images further comprises calculating focus measures for the detected features of interest, with each focus measure calculated based on a degree of image focus of a detected feature of interest,
   wherein processing the captured images further comprises determining individual cameras in the camera array for image capturing after a refocusing process, with the individual cameras determined based on numbers of detected features of interest per camera in the camera array,
   wherein processing the captured images further comprises determining a focus distance for the moving mechanism in the refocusing process, with the focus distance determined based on the focus measures of the detected features of interest,
   wherein the focus distance and the individual cameras are determined by an optimization process configured to maximize a number of the detected features of interest that are in-focused after the refocusing process while minimizing a number of the individual cameras used to generate the in-focused features of interest after the refocusing process,
   wherein the processing module is configured to communicate with the moving mechanism for refocusing at least the minimized number of the individual cameras on the sample to bring into focus the maximized number of the detected features of interest,
   wherein the processing module is configured to analyze new images captured by the at least the minimized number of the individual cameras after refocusing for generating a statistical characterization of the sample based on the analysis of the features.

2. A system as in claim 1,
   wherein the element of the at least a camera comprises one or more electronically tunable elements to focus the image, or
   wherein the element of the at least a camera comprises an electronically tunable lens having a curvature or an index of refraction changed in response to an applied voltage, or
   wherein the element of the at least a camera comprises an electronically tunable camera positioning element configured to move the at least a camera, an imaging optical assembly of the at least a camera, or an imaging sensor of the at least a camera in a direction perpendicular to a plane of the sample.

3. A system as in claim 1,
   wherein the images captured by the multiple cameras are non overlapped images of the sample, or
   wherein the processing module is configured to crop the images captured by the multiple cameras to generate non overlapped images of the sample.

4. A system as in claim 1,
   wherein the processing module is configured to obtain the input, with the input specifying the features of interest to be detected and analyzed on the sample,
   wherein the input comprises the features under different levels of focus.

5. A system as in claim 1,
   wherein detecting the features of interest on the captured images comprises
      searching for the features across the images captured by the multiple cameras to form sub-images with each sub-image cropped to comprise a feature of the features of interest, and
   wherein determining the focus distance for the moving mechanism in the refocusing process comprises
      aggregating focus measures calculated from the sub-images to obtain moving distances for the moving mechanism for refocusing the multiple cameras.

6. A system as in claim 1,
   wherein the optimization process comprises minimizing an analysis of the amount of out-of-focus image data in the new images.

7. A system as in claim 1,
   wherein the optimization process comprises determining cameras in the camera array having the detected features and communicating with the moving mechanism to refocus an optimum number of the cameras.

8. A system as in claim 1,
   wherein the communication with the moving mechanism is configured to reposition a holder supporting the sample or the camera array to refocus the multiple cameras on the sample,
   wherein the reposition comprises lifting or lowering the sample, tipping or tilting the sample, curving the sample, or translating the sample laterally relatively to the camera array.

9. A system as in claim 1,
   wherein minimizing the number of the individual cameras used to generate the in-focused features of interest after the refocusing process comprises turning off cameras showing no features of interest.

10. A system as in claim 1,
    wherein the sample comprises a specimen comprising a biological material,
    wherein the features of interest comprise cells,
    wherein the analysis of the features in the new images comprises a first classification for classifying the cells into multiple types, and a second classification for classifying the cells in each types into categories comprising diseased or healthy.

11. A system as in claim 1, wherein the processing module comprises a machine learning algorithm trained with prior acquired data for analyzing the features in the new images into categories comprising diseased or healthy.

12. A system as in claim 1, wherein the new images captured by the multiple cameras after refocusing comprise images captured under more than one illumination pattern of the one or more illumination patterns.

13. A system as in claim 1, wherein minimizing the number of the individual cameras used to generate the in-focused features of interest after the refocusing process comprises turning off cameras showing out-of-focus features of interest after the refocusing of the multiple cameras.

14. A system as in claim 1, wherein minimizing the number of the individual cameras used to generate the in-focused features of interest after the refocusing process comprises turning off cameras showing a smaller-than-a-threshold number of features of interest.

* * * * *